United States Patent
Gray et al.

(10) Patent No.: US 10,996,728 B2
(45) Date of Patent: May 4, 2021

(54) POWER SUPPLY SIGNAL CONDITIONING SYSTEM BASED ON DRIVE-SENSE CIRCUIT (DSC) PROCESSING

(71) Applicant: SIGMASENSE, LLC., Wilmington, DE (US)

(72) Inventors: Patrick Troy Gray, Cedar Park, TX (US); Gerald Dale Morrison, Redmond, WA (US); Daniel Keith Van Ostrand, Leander, TX (US); Richard Stuart Seger, Jr., Belton, TX (US)

(73) Assignee: SIGMASENSE, LLC., Wilmington, DE (US)

( * ) Notice: Subject to any disclaimer, the term of this patent is extended or adjusted under 35 U.S.C. 154(b) by 90 days.

(21) Appl. No.: 16/239,841

(22) Filed: Jan. 4, 2019

(65) Prior Publication Data

US 2020/0218322 A1    Jul. 9, 2020

(51) Int. Cl.
*G06F 1/26*      (2006.01)
*G06F 3/041*     (2006.01)
*G06F 1/3234*    (2019.01)
*G01R 19/25*     (2006.01)
*G05F 1/10*      (2006.01)

(52) U.S. Cl.
CPC .......... *G06F 1/263* (2013.01); *G01R 19/2513* (2013.01); *G05F 1/10* (2013.01); *G06F 1/3262* (2013.01); *G06F 3/0416* (2013.01)

(58) Field of Classification Search
CPC .......... G05F 1/10; G06F 1/263; G06F 3/0416; G06F 1/3262; G01R 19/2513; G01R 19/26
See application file for complete search history.

(56) References Cited

U.S. PATENT DOCUMENTS

| | | |
|---|---|---|
| 6,218,972 B1 | 4/2001 | Groshong |
| 6,665,013 B1 | 12/2003 | Fossum et al. |
| 7,528,755 B2 | 5/2009 | Hammerschmidt |
| 8,031,094 B2 | 10/2011 | Hotelling |
| 8,089,289 B1 | 1/2012 | Kremin et al. |

(Continued)

OTHER PUBLICATIONS

Baker; How delta-sigma ADCs work, Part 1; Analog Applications Journal; Oct. 1, 2011; 6 pgs.

(Continued)

*Primary Examiner* — Alex Torres-Rivera
*Assistant Examiner* — Trinh Q Dang
(74) *Attorney, Agent, or Firm* — Garlick & Markison; Timothy W. Markison; Shayne X. Short

(57) ABSTRACT

A power supply signal conditioning system includes a power supply, one or more loads, and a drive-sense circuit (DSC). The power supply is operably coupled to one or more loads. When enabled, the power supply configured to output a power supply signal having a DC (direct current) voltage component and a ripple voltage component that is based on conversion of an AC (alternating current) signal in accordance with generating the power supply signal. The DSC is operably coupled to the power supply. When enabled, the DSC is configured simultaneously to sense the power supply signal and, based on sensing of the power supply signal, adaptively to process the power supply signal in accordance with reducing or eliminating the ripple voltage component of the power supply signal to generate a conditioned power supply signal to service the one or more loads.

20 Claims, 49 Drawing Sheets

(56) References Cited

U.S. PATENT DOCUMENTS

| | | |
|---|---|---|
| 8,279,180 B2 | 10/2012 | Hotelling et al. |
| 8,547,114 B2 | 10/2013 | Kremin |
| 8,625,726 B2 | 1/2014 | Kuan |
| 9,201,547 B2 | 12/2015 | Elias |
| 2013/0278447 A1 | 10/2013 | Kremin |
| 2016/0188049 A1 | 6/2016 | Yang et al. |
| 2017/0085180 A1* | 3/2017 | Pulici .................... H02M 1/08 |
| 2017/0244317 A1* | 8/2017 | Kondo ................... H02M 7/12 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

* cited by examiner communication system 10 computing device 12 computing device 14 computing device 18

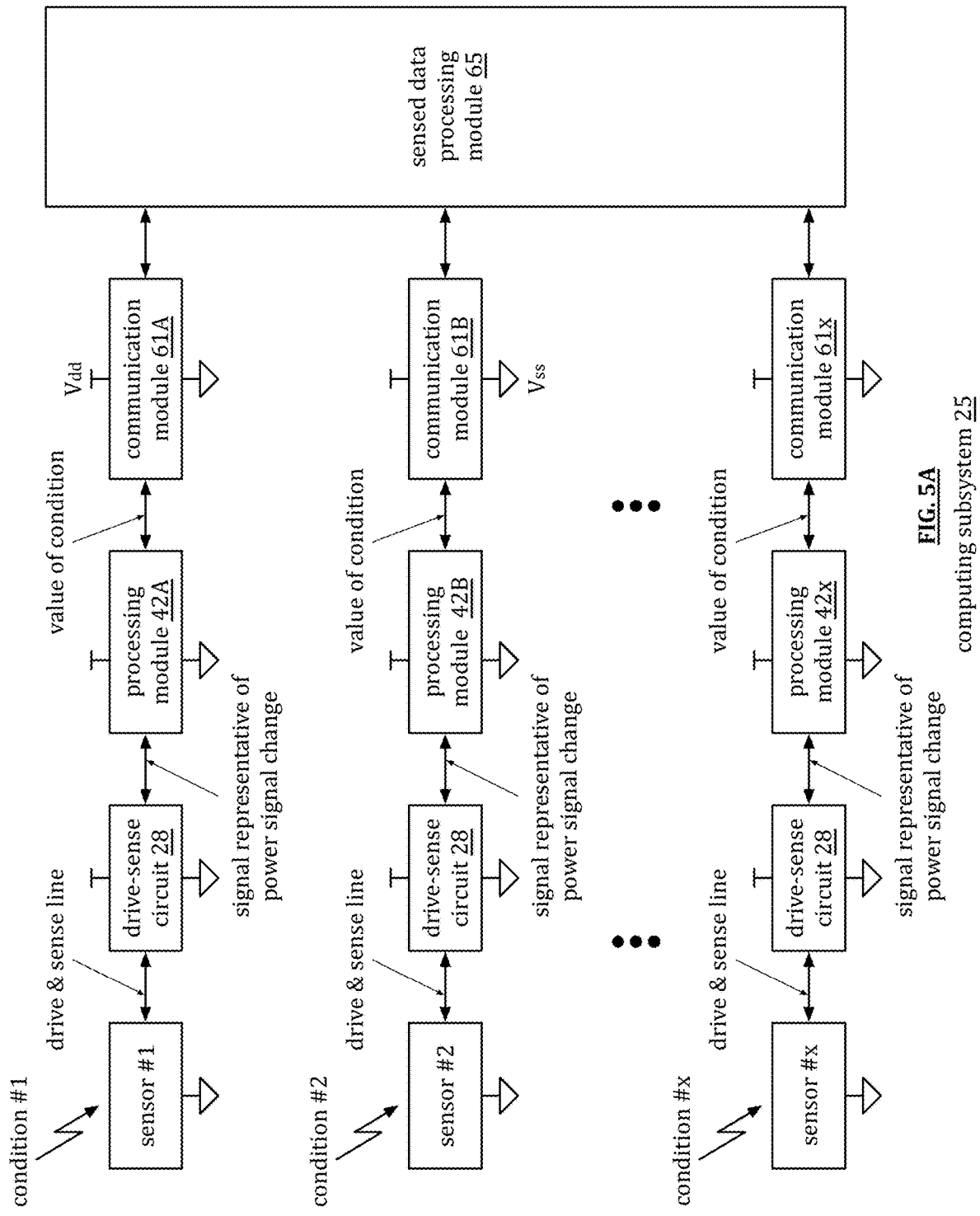
FIG. 5A computing subsystem 25 computing subsystem 25

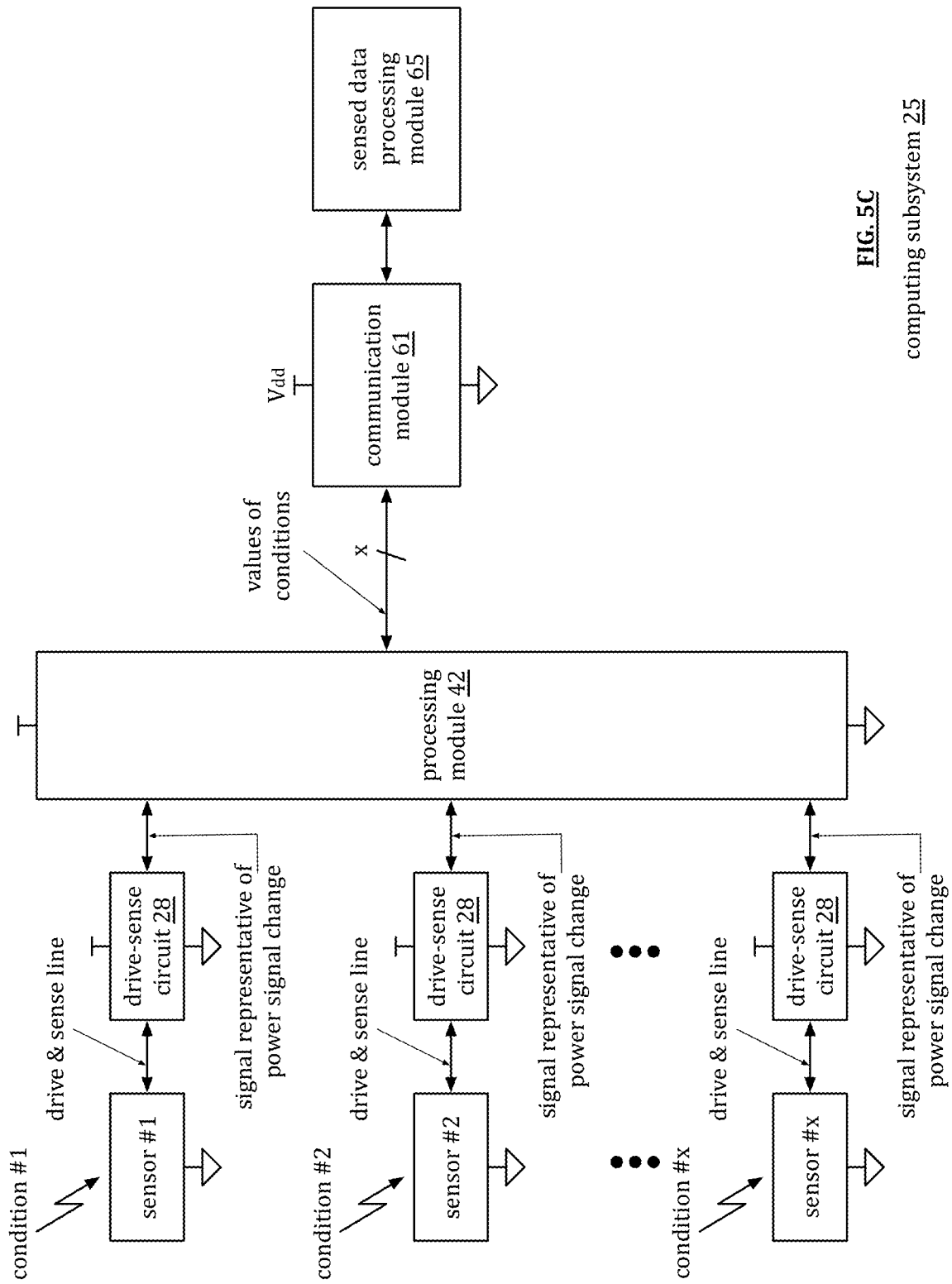
FIG. 5C  computing subsystem 25 sensor graph power signal graph power signal graph power signal graph power signal graph power signal graph

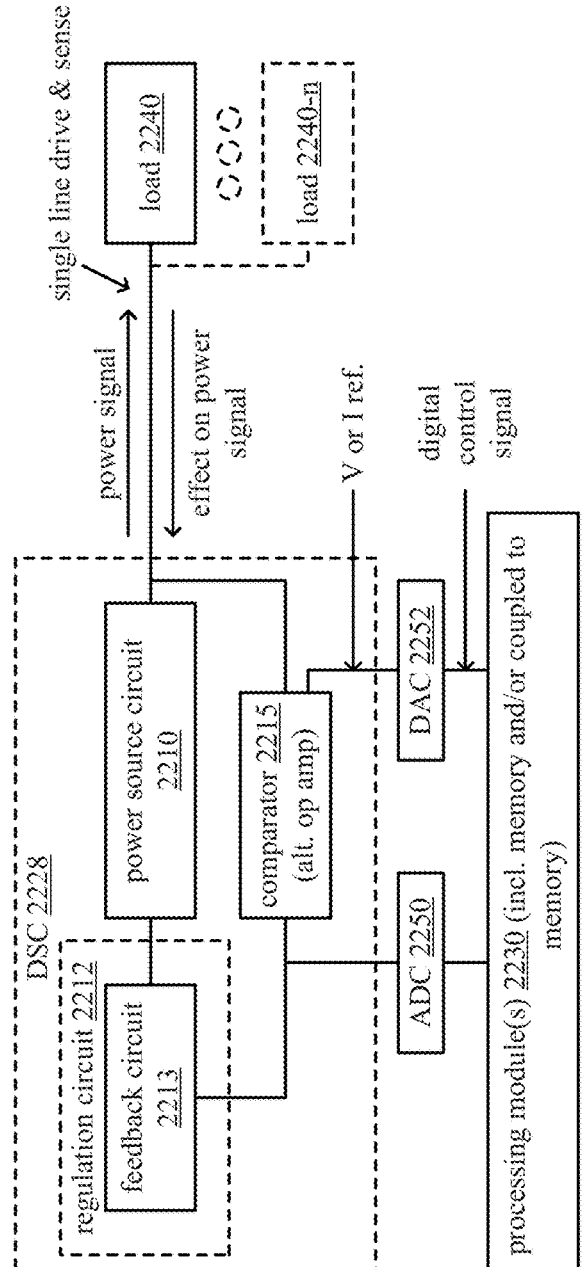
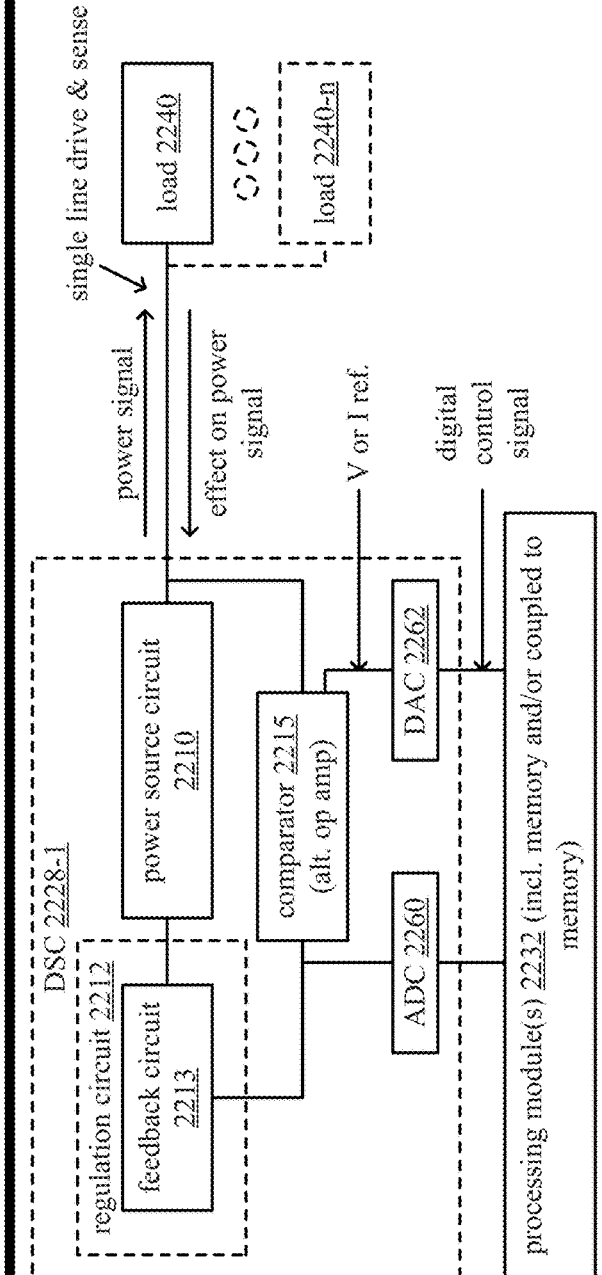
FIG. 22A
FIG. 22B

FIG. 25A 2501 start/continue outputting, from a power supply operably coupled to one or more loads, a power supply signal having a DC voltage component and a ripple voltage component that is based on conversion of an AC signal in accordance with generating the power supply signal 2510 via a DSC operably coupled to the power supply, simultaneously sensing the power supply signal and, based on the sensing of the power supply signal, adaptively processing the power supply signal in accordance with reducing or eliminating the ripple voltage component of the power supply signal to generate a conditioned power supply signal to service the one or more loads 2520 end/continue

FIG. 25B 2502 start/continue outputting, from a power supply operably coupled to one or more loads, a power supply signal having a DC voltage component and a ripple voltage component that is based on conversion of an AC signal in accordance with generating the power supply signal 2511 via a DSC operably coupled to the power supply, simultaneously sensing the power supply signal and adaptively injecting a current signal that is based on the sensing of the power supply signal into the power supply signal in accordance with reducing or eliminating the ripple voltage component of the power supply signal to generate the conditioned power supply signal to service the one or more loads 2521 end/continue

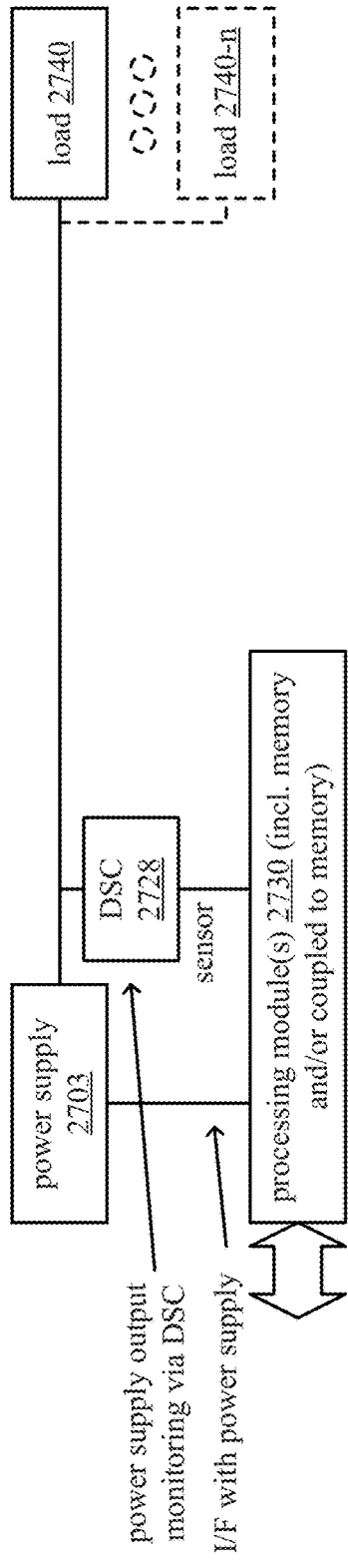
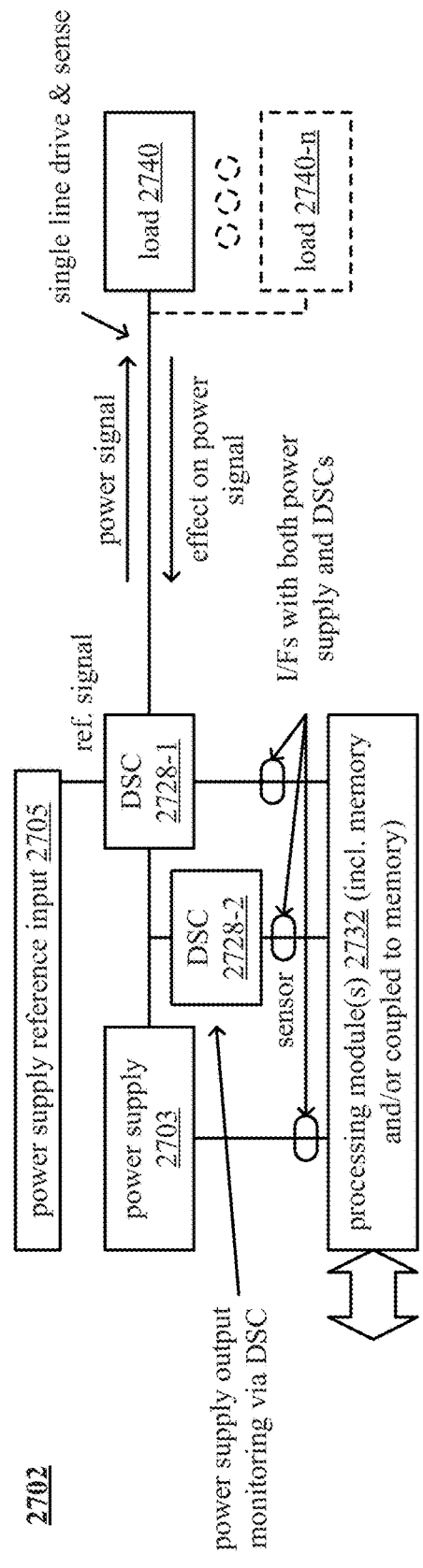
FIG. 27A
FIG. 27B

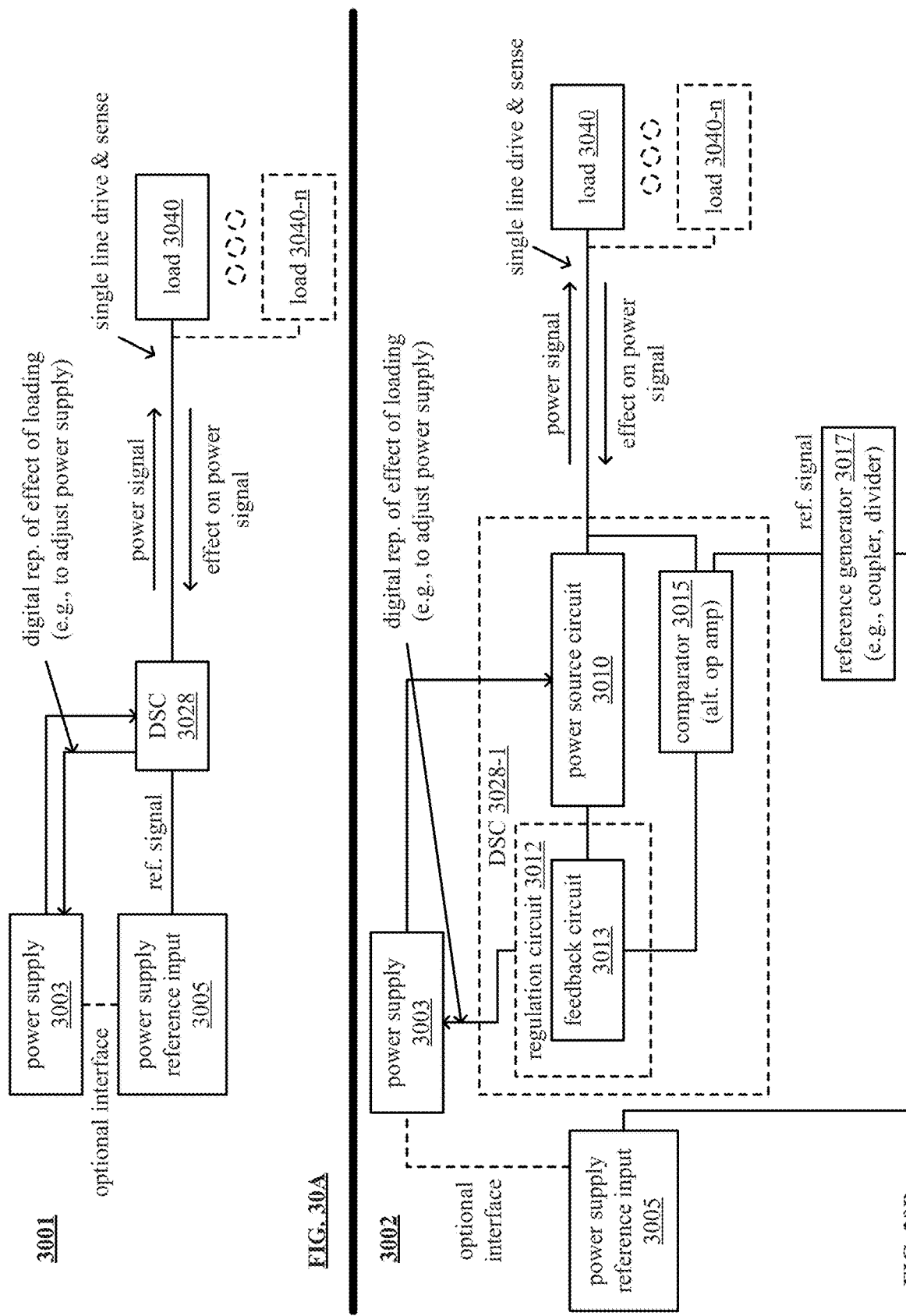

FIG. 33

3300 start/continue
↓
outputting, from a power supply operably coupled to one or more loads, a power supply signal having a DC voltage component and a ripple voltage component that is based on conversion of an AC signal in accordance with generating the power supply signal 3310
↓
via a DSC operably coupled to the power supply, simultaneously sensing the power supply signal and, based on the sensing of the power supply signal, adaptively processing the power supply signal in accordance with reducing or eliminating the ripple voltage component of the power supply signal to generate a conditioned power supply signal to service the one or more loads 3320 via a DSC operably coupled to the power supply, simultaneously sensing the power supply signal and adaptively injecting a current signal that is based on the sensing of the power supply signal into the power supply signal in accordance with reducing or eliminating the ripple voltage component of the power supply signal to generate the conditioned power supply signal to service the one or more loads 3321
↓
via the DSC operably coupled to the power supply, generating a digital signal that is representative of any non-uniformity of the power supply signal (e.g., ripple, harmonic glitches, voltage sag, etc.) 3330
↓
adapting operation of the power supply, based on the digital signal, in accordance with reducing or eliminating the non-uniformity of the power supply signal to generate a conditioned power supply signal to service the one or more loads 3340
↓
end/continue

```
3600
``` start/continue
↓
outputting, from a power supply operably coupled to a first DSC, a power supply signal 3610
↓
operating the first DSC to process the power supply signal to generate a first conditioned power supply signal in accordance with multi-stage power supply signal conditioning 3620
↓
outputting, from the first DSC, the first conditioned power supply signal to a second DSC 3630
↓
operating the second DSC to process the first conditioned power supply signal to generate a second conditioned power supply signal in accordance with multi-stage power supply signal conditioning 3640
↓
[optional] operating one or more additional DSCs to generate a final conditioned power supply signal in accordance with multi-stage power supply signal conditioning 3650
↓
outputting, from a final DSC implemented to perform in accordance with multi-stage power supply signal conditioning, a final conditioned power supply signal (e.g., second conditioned power supply signal when 2 DSCs implemented) to service one or more loads 3660
↓
end/continue

FIG. 36

POWER SUPPLY SIGNAL CONDITIONING SYSTEM BASED ON DRIVE-SENSE CIRCUIT (DSC) PROCESSING

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to systems including one or more power supplies and more particularly to signal conditioning, sensing, monitoring, and management of such systems that include one or more power supplies.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5A is a schematic plot diagram of a computing subsystem in accordance with the present invention;

FIG. 5C is a schematic block diagram of another embodiment of a computing subsystem in accordance with the present invention;

FIG. 22A is a schematic block diagram of another embodiment of a DSC configured simultaneously to drive and sense a power signal in accordance with the present invention;

FIG. 22B is a schematic block diagram of another embodiment of a DSC configured simultaneously to drive and sense a power signal in accordance with the present invention;

FIG. 25A is a schematic block diagram of an embodiment of a method for execution by one or more devices in accordance with the present invention;

FIG. 25B is a schematic block diagram of another embodiment of a method for execution by one or more devices in accordance with the present invention;

FIG. 27A is a schematic block diagram of another embodiment of power supply adaptation using a DSC in accordance with the present invention;

FIG. 27B is a schematic block diagram of another embodiment of power supply adaptation using DSCs in accordance with the present invention;

FIG. 30A is a schematic block diagram of another embodiment of power supply adaptation using a DSC in accordance with the present invention;

FIG. 30B is a schematic block diagram of another embodiment of power supply adaptation using a DSC in accordance with the present invention;

FIG. 33 is a schematic block diagram of another embodiment of a method for execution by one or more devices in accordance with the present invention;

FIG. 36 is a schematic block diagram of another embodiment of a method for execution by one or more devices in accordance with the present invention;

DETAILED DESCRIPTION OF THE INVENTION

Figure 1:
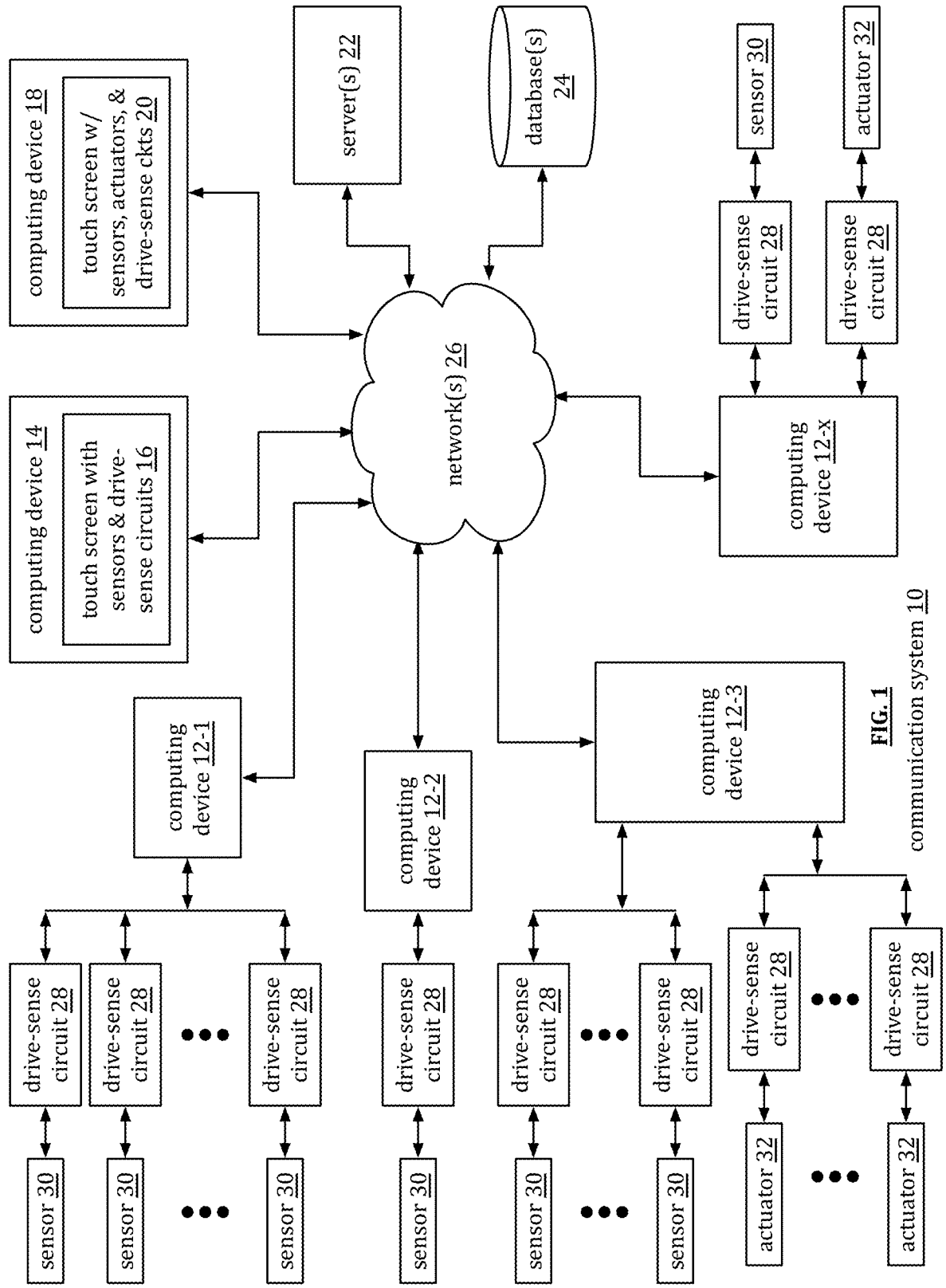
FIG. 1 is a schematic block diagram of an embodiment of a communication system in accordance with the present invention.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a sensor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-$x$ is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-$x$. For example, the sensor 30 may be a piezoelectric microphone and the actuator 32 may be a piezoelectric speaker.

Figure 2:
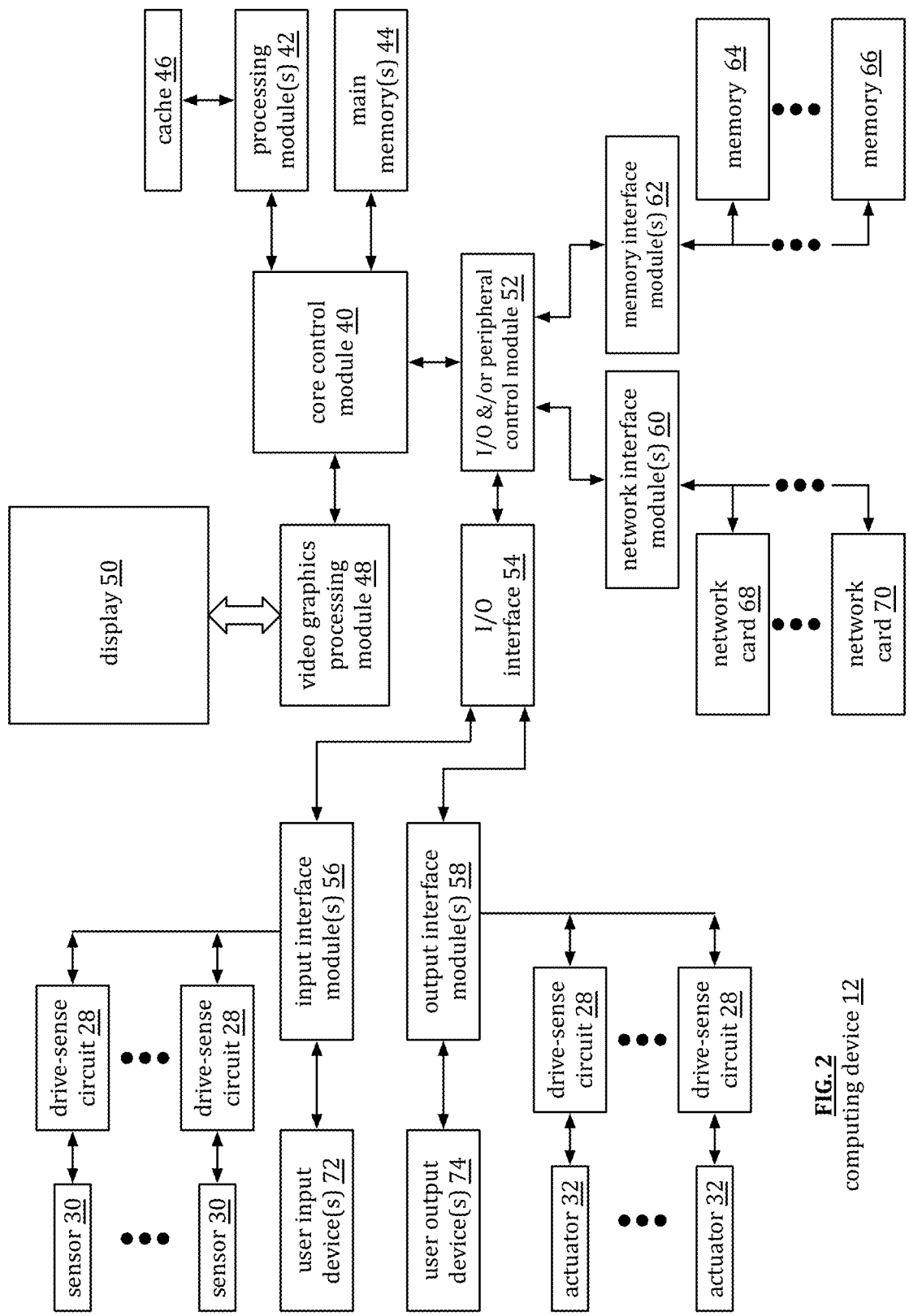
FIG. 2 is a schematic block diagram of an embodiment of a computing device in accordance with the present invention.

FIG. 2 is a schematic block diagram of an embodiment of a computing device 12 (e.g., any one of 12-1 through 12-$x$). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
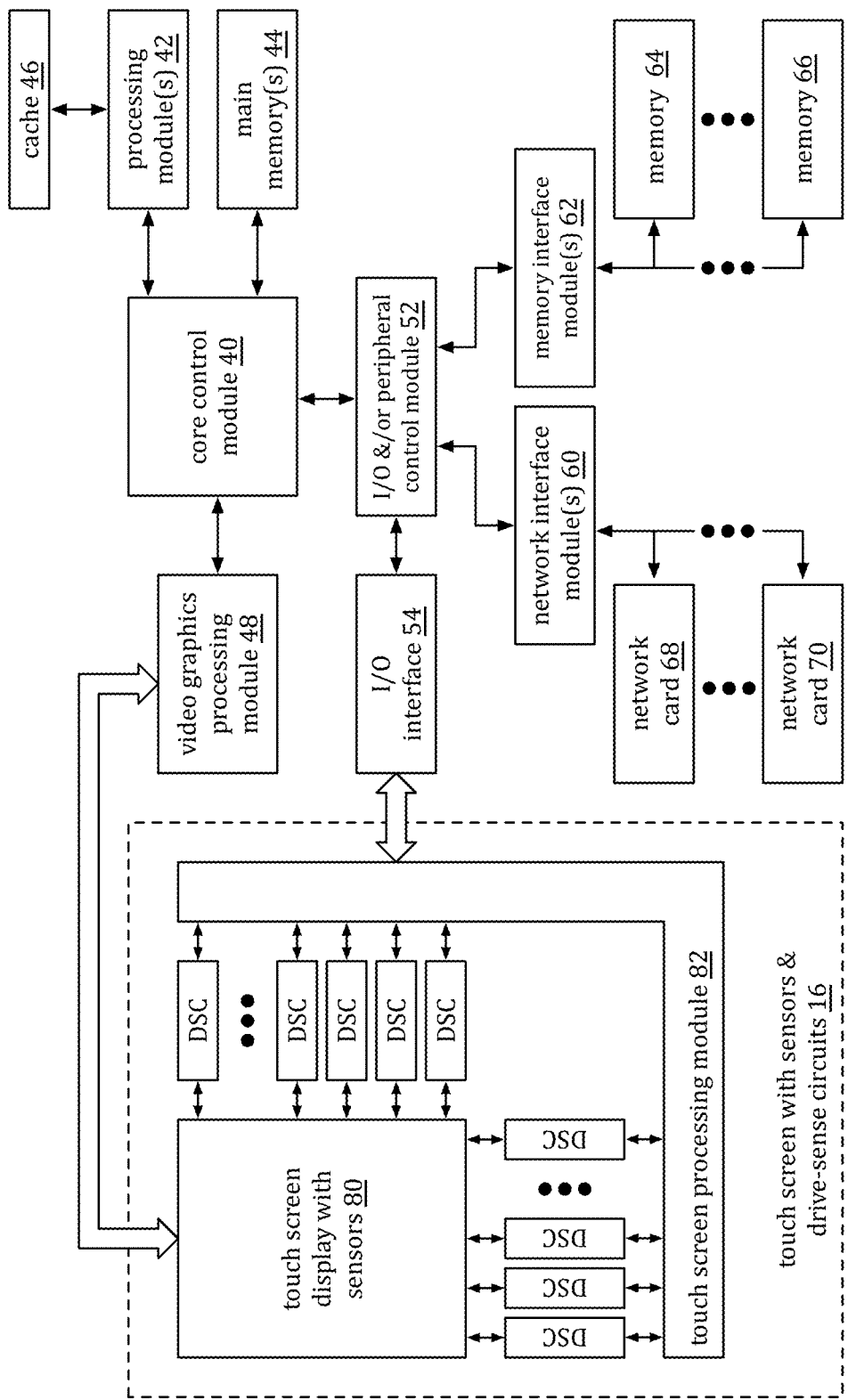
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
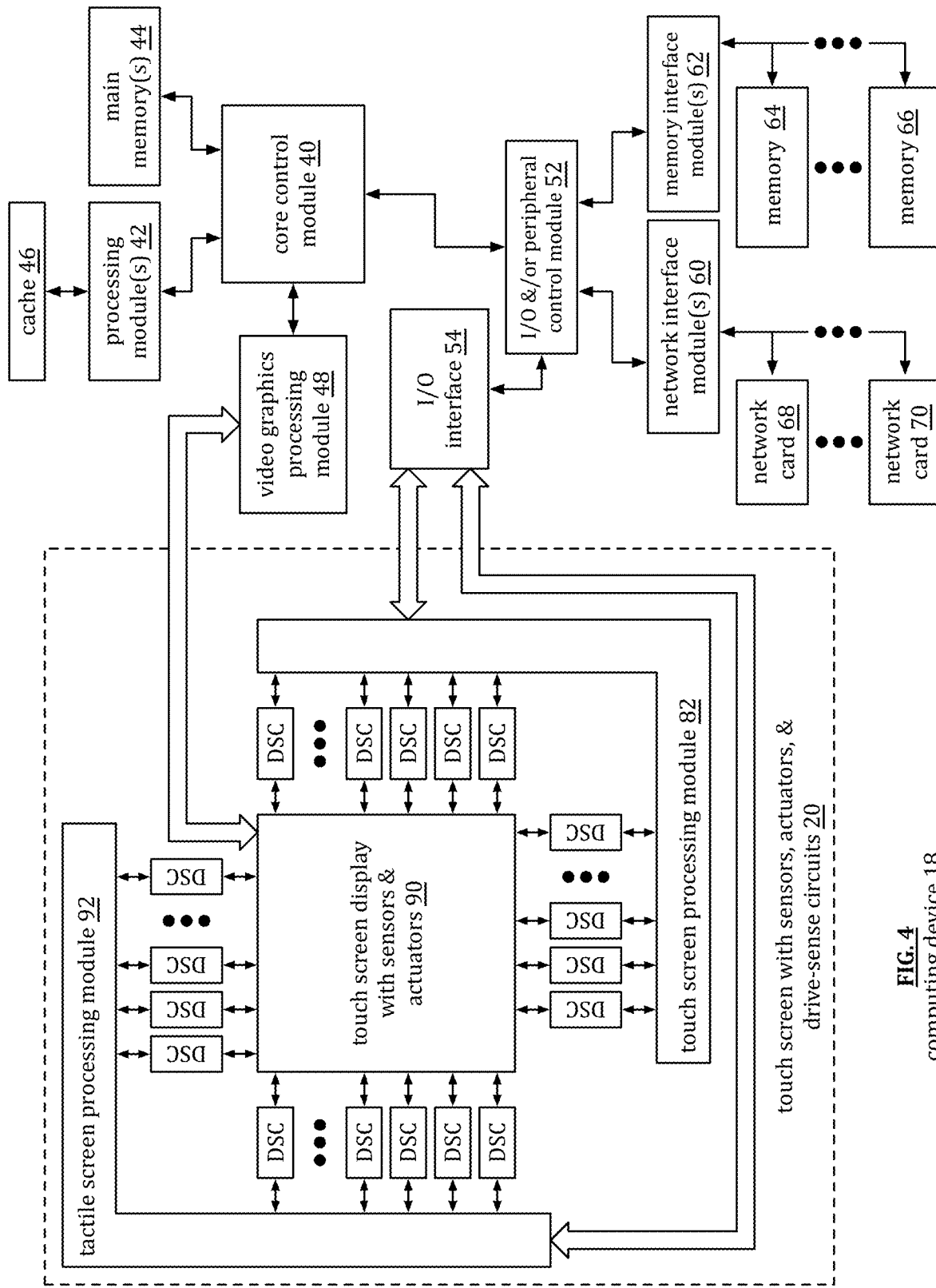
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42 A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a standalone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

Figure 5B:
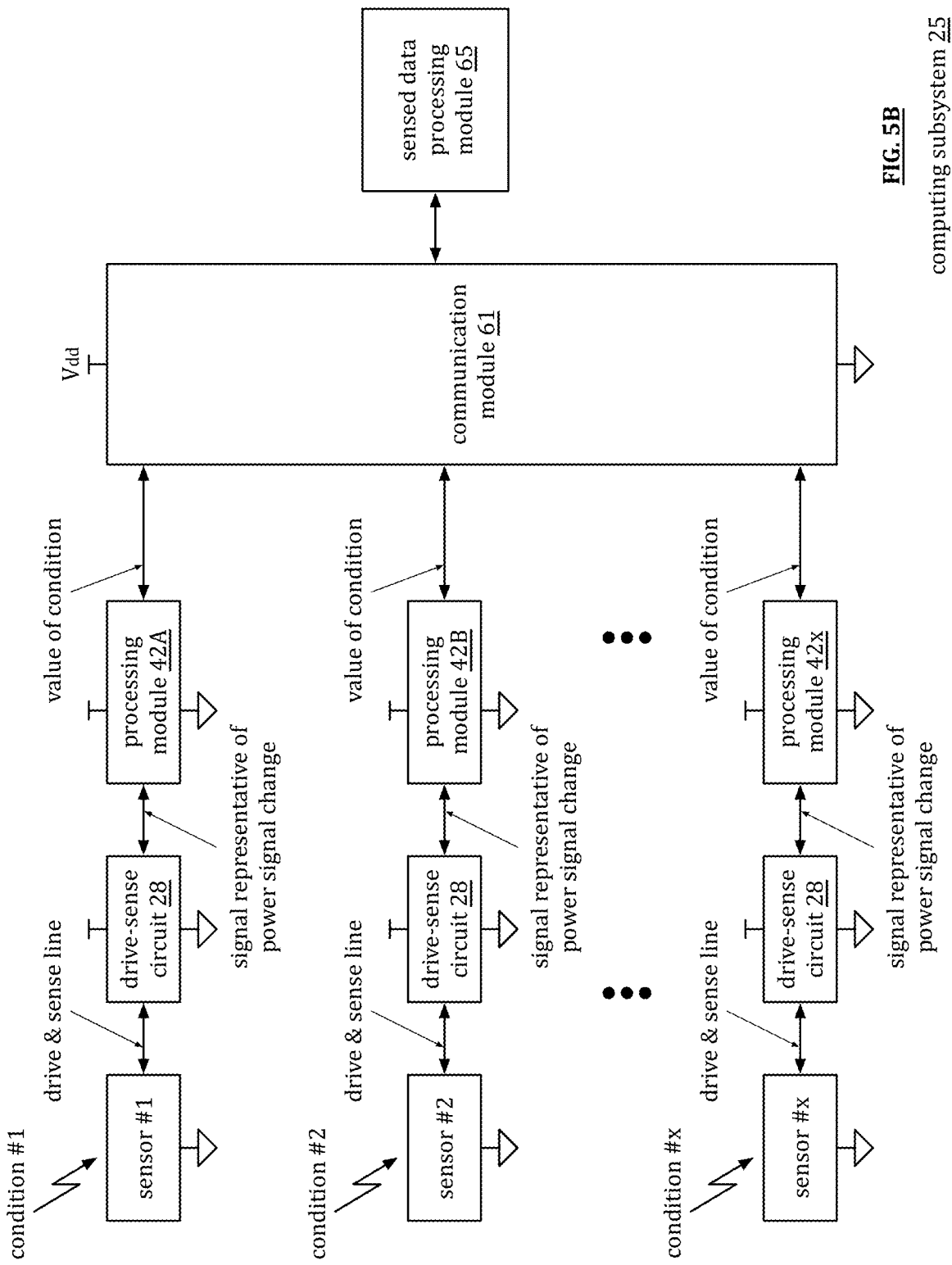
FIG. 5B is a schematic block diagram of another embodiment of a computing subsystem in accordance with the present invention.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-x are as discussed with reference to FIG. 5A.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

Figure 5D:
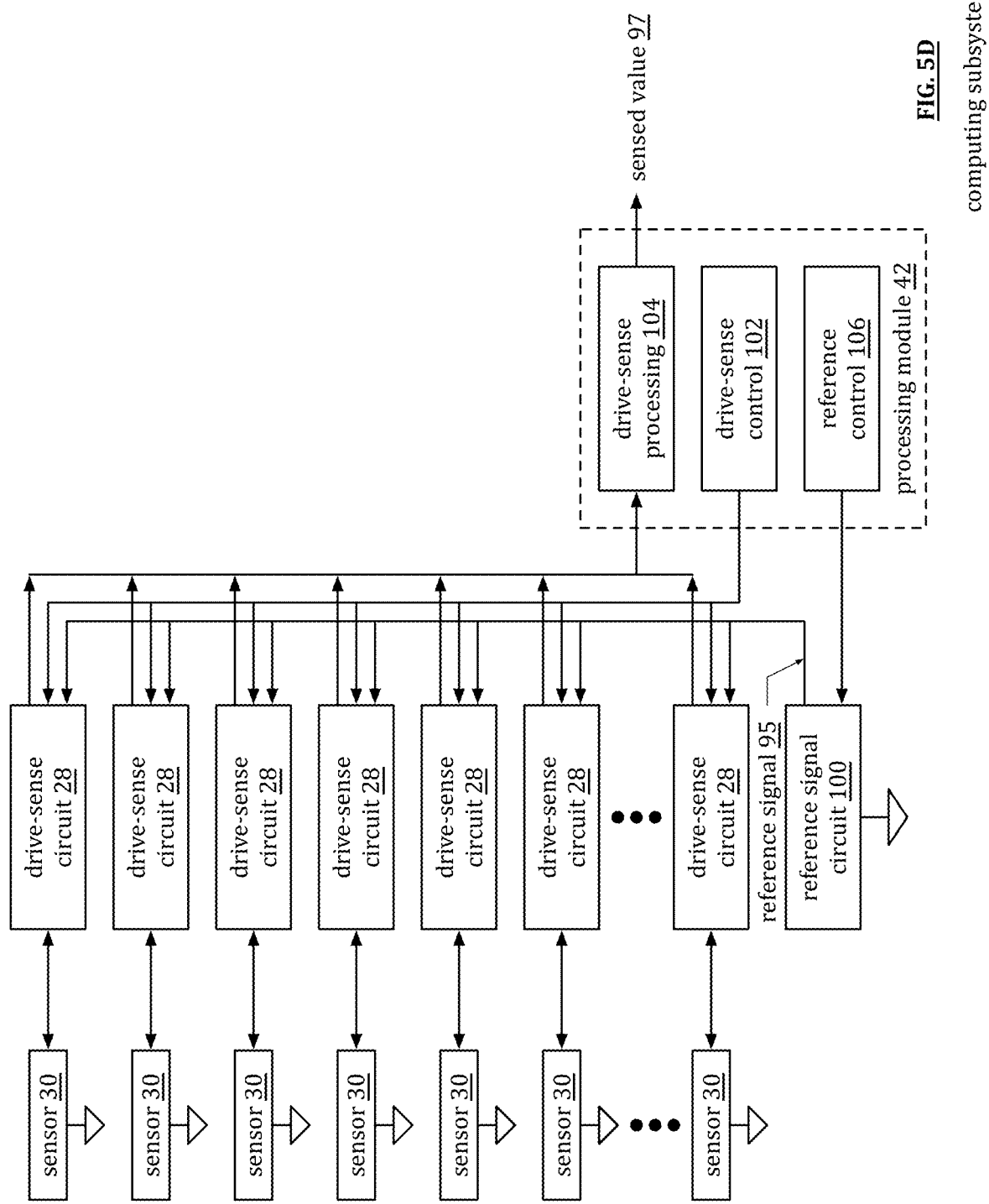
FIG. 5D is a schematic block diagram of another embodiment of a computing subsystem in accordance with the present invention.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
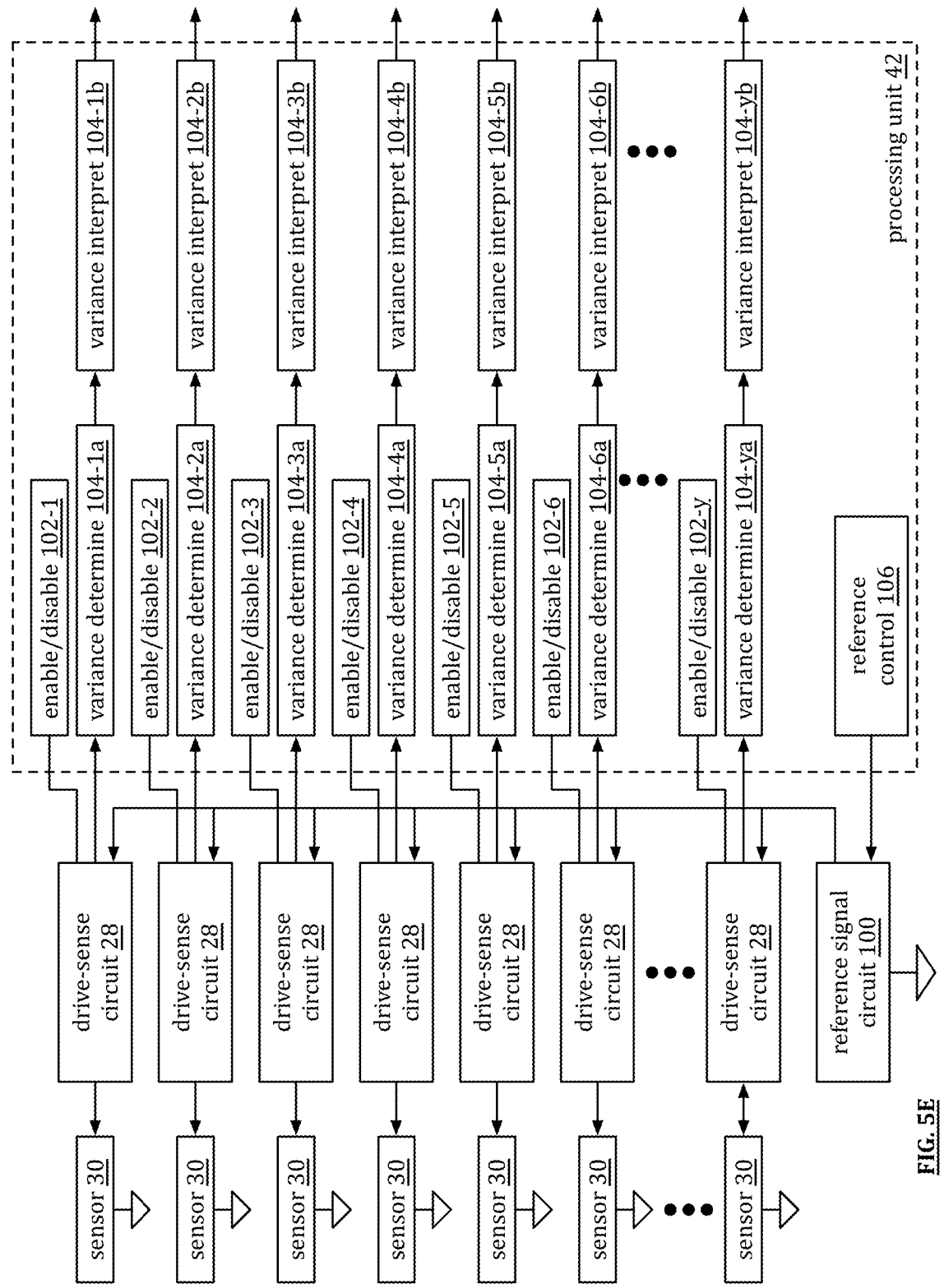
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1b interprets the difference to determine a specific value for the sensed physical condition.

As a specific example, the variance determining module 104-1a receives a digital signal of 1001 0110 (150 in decimal) that is representative of a sensed physical condition (e.g., temperature) sensed by a sensor from the corresponding drive-sense circuit 28. With 8-bits, there are $2^8$ (256) possible signals representing the sensed physical condition. Assume that the units for temperature is Celsius and a digital value of 0100 0000 (64 in decimal) represents the known value for 25 degree Celsius. The variance determining module 104-b1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-b1 then determines the sensed value based on the difference and the known value. In this example, the sensed value equals 25+86*(100/256)= 25+33.6=58.6 degrees Celsius.

Figure 6A:
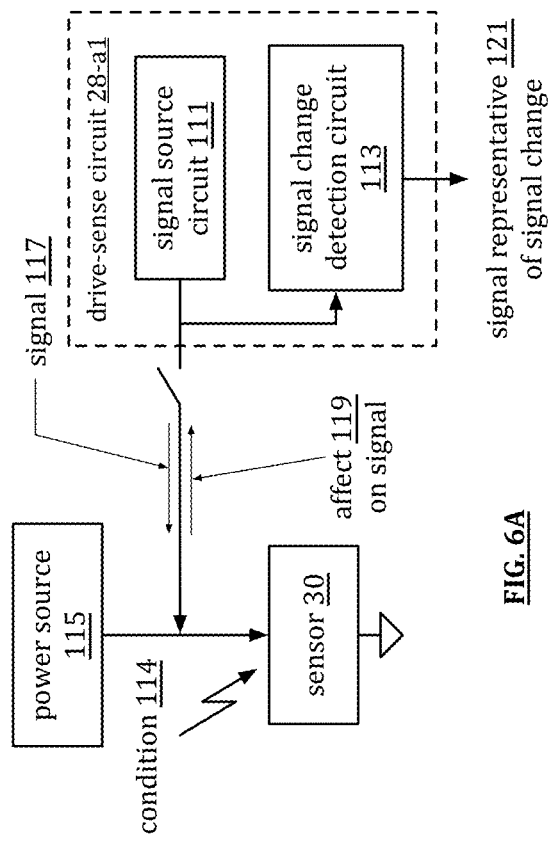
FIG. 6A is a schematic block diagram of another embodiment of a drive sense circuit in accordance with the present invention.
Figure 6:
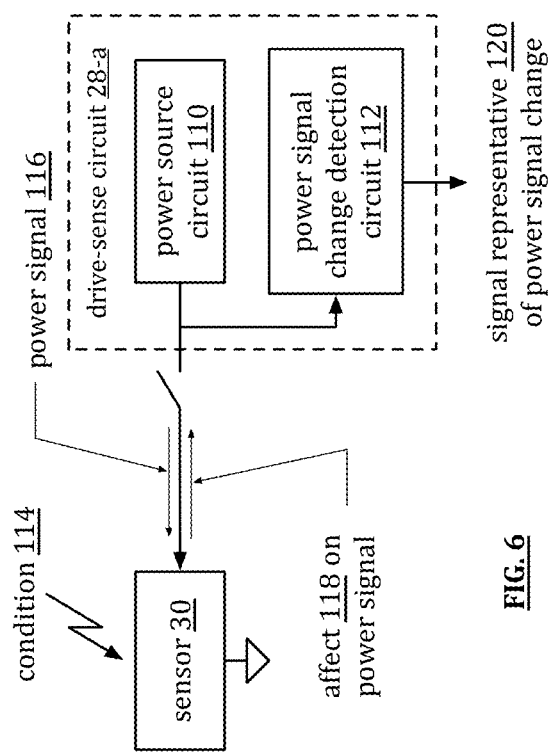
FIG. 6 is a schematic block diagram of a drive center circuit in accordance with the present invention.

FIG. 6 is a schematic block diagram of a drive center circuit 28-a coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

Figure 7:
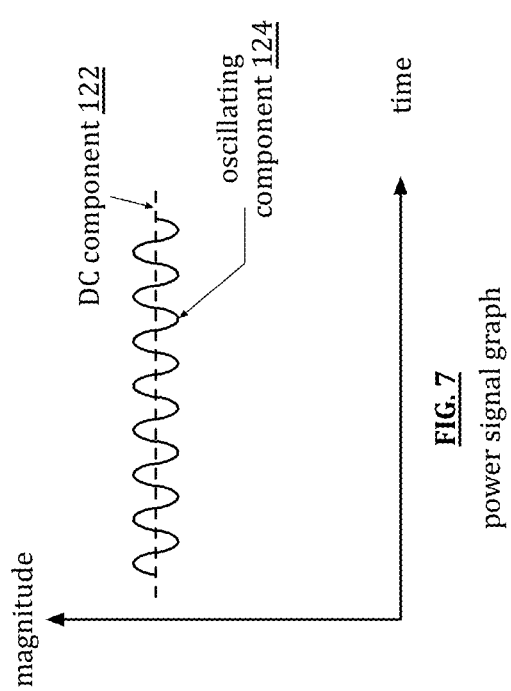
FIG. 7 is an example of a power signal graph in accordance with the present invention.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-a1 coupled to a sensor 30. The drive sense-sense circuit 28-a1 includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

Figure 8:
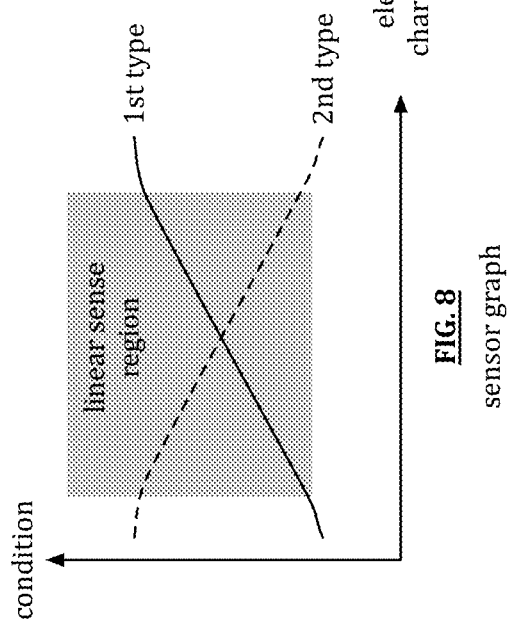
FIG. 8 is an example of a sensor graph in accordance with the present invention.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

Figure 9:
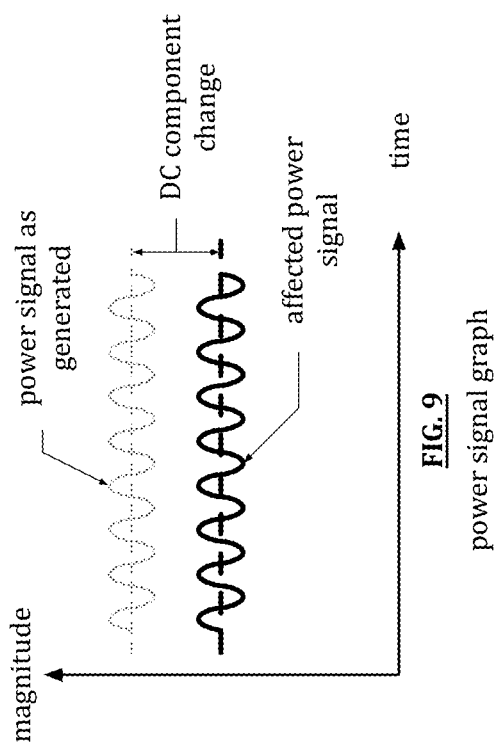
FIG. 9 is a schematic block diagram of another example of a power signal graph in accordance with the present invention.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
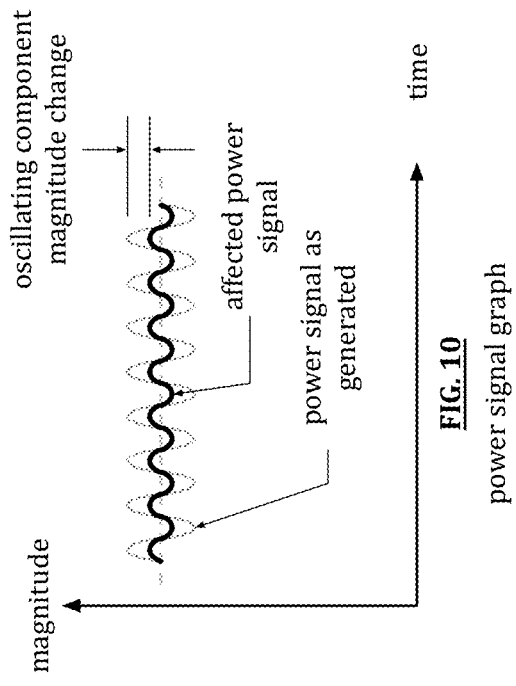
FIG. 10 is a schematic block diagram of another example of a power signal graph in accordance with the present invention.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11A:
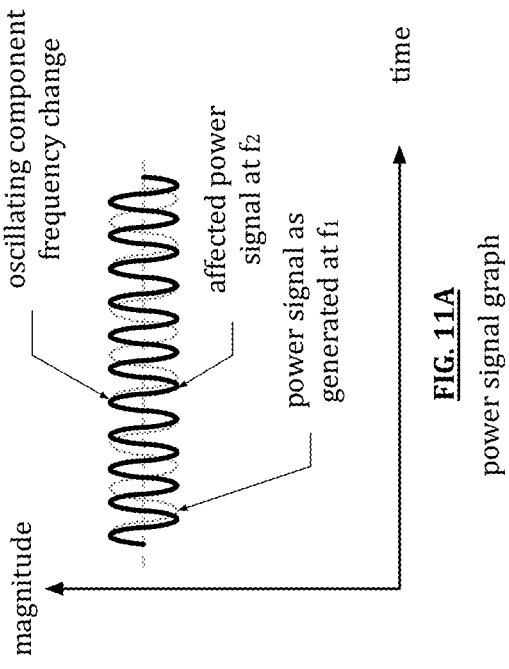
FIG. 11A is a schematic block diagram of another example of a power signal graph in accordance with the present invention.
Figure 11:
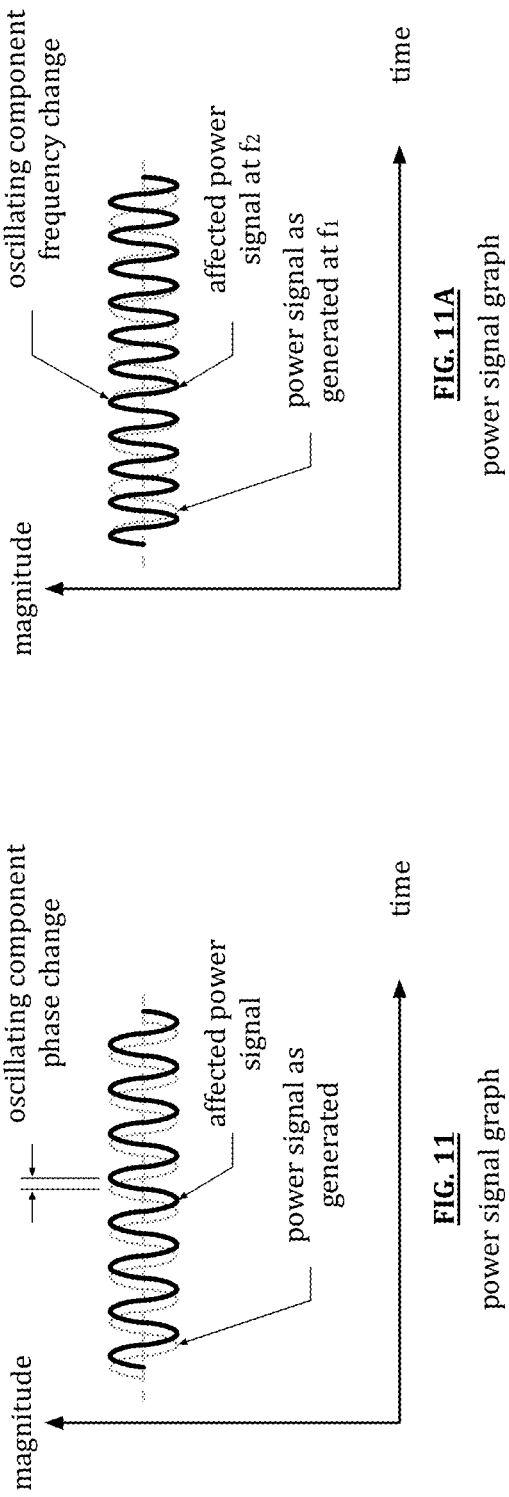
FIG. 11 is a schematic block diagram of another example of a power signal graph in accordance with the present invention.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

Figure 12:
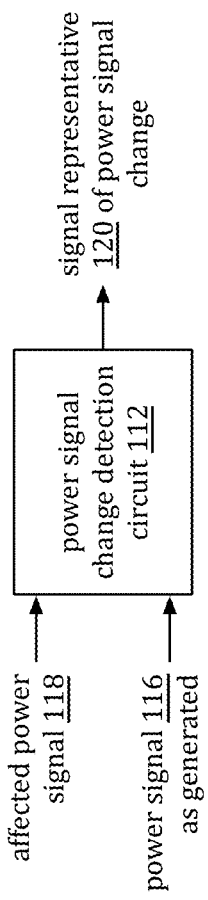
FIG. 12 is a schematic block diagram of an embodiment of a power signal change detection circuit in accordance with the present invention.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

Figure 13:
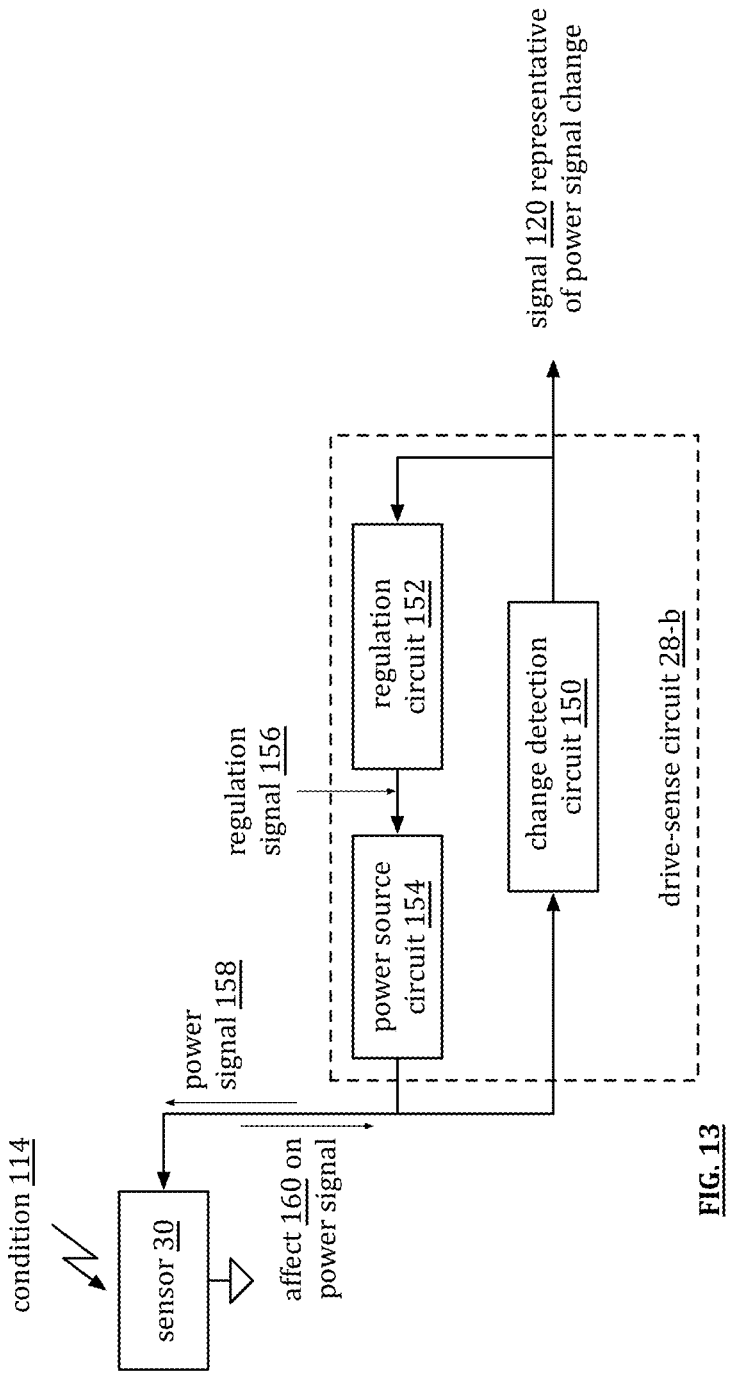
FIG. 13 is a schematic block diagram of another embodiment of a drive-sense circuit in accordance with the present invention.

FIG. 13 is a schematic block diagram of another embodiment of a drive sense circuit 28-*b* includes a change detection circuit 150, a regulation circuit 152, and a power source circuit 154. The drive-sense circuit 28-*b* is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter operable to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

With respect to the operation of various drive-sense circuits as described herein and/or their equivalents, note that the operation of such a drive-sense circuit is operable simultaneously to drive and sense a signal via a single line. In comparison to switched, time-divided, time-multiplexed, etc. operation in which there is switching between driving and sensing (e.g., driving at first time, sensing at second time, etc.) of different respective signals at separate and distinct times, the drive-sense circuit is operable simultaneously to perform both driving and sensing of a signal. In some examples, such simultaneous driving and sensing is performed via a single line using a drive-sense circuit.

In addition, other alternative implementations of various drive-sense circuits are described in U.S. Utility patent application Ser. No. 16/113,379, entitled "DRIVE SENSE CIRCUIT WITH DRIVE-SENSE LINE," filed Aug. 27, 2018, pending. Any instantiation of a drive-sense circuit as described herein may also be implemented using any of the various implementations of various drive-sense circuits described in U.S. Utility patent application Ser. No. 16/113, 379.

In addition, note that the one or more signals provided from a drive-sense circuit (DSC) may be of any of a variety of types. For example, such a signal may be based on encoding of one or more bits to generate one or more coded bits used to generate modulation data (or generally, data). For example, a device is configured to perform forward error correction (FEC) and/or error checking and correction (ECC) code of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof.

Also, the one or more coded bits may then undergo modulation or symbol mapping to generate modulation symbols (e.g., the modulation symbols may include data intended for one or more recipient devices, components, elements, etc.). Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

In addition, note that a signal provided from a DSC may be of a unique frequency that is different from signals provided from other DSCs. Also, a signal provided from a DSC may include multiple frequencies independently or simultaneously. The frequency of the signal can be hopped on a pre-arranged pattern. In some examples, a handshake is established between one or more DSCs and one or more processing module (e.g., one or more controllers) such that the one or more DSC is/are directed by the one or more processing modules regarding which frequency or frequencies and/or which other one or more characteristics of the one or more signals to use at one or more respective times and/or in one or more particular situations.

With respect to any signal that is driven and simultaneously detected by a DSC, note that any additional signal that is coupled into a line, an electrode, a touch sensor, a bus, a communication link, an electrical coupling or connection, etc. associated with that DSC is also detectable. For example, a DSC that is associated with such a line, an electrode, a touch sensor, a bus, a communication link, an electrical coupling or connection, etc. is configured to detect any signal from one or more other lines, electrodes, a touch sensors, a buses, a communication links, electrical couplings or connections, etc. that get coupled into that line, electrode, touch sensor, bus, communication link, electrical coupling or connection, etc.

Note that the different respective signals that are driven and simultaneously sensed by one or more DSCs may be are differentiated from one another. Appropriate filtering and processing can identify the various signals given their differentiation, orthogonality to one another, difference in frequency, etc. Other examples described herein and their equivalents operate using any of a number of different characteristics other than or in addition to frequency.

Figure 14A:
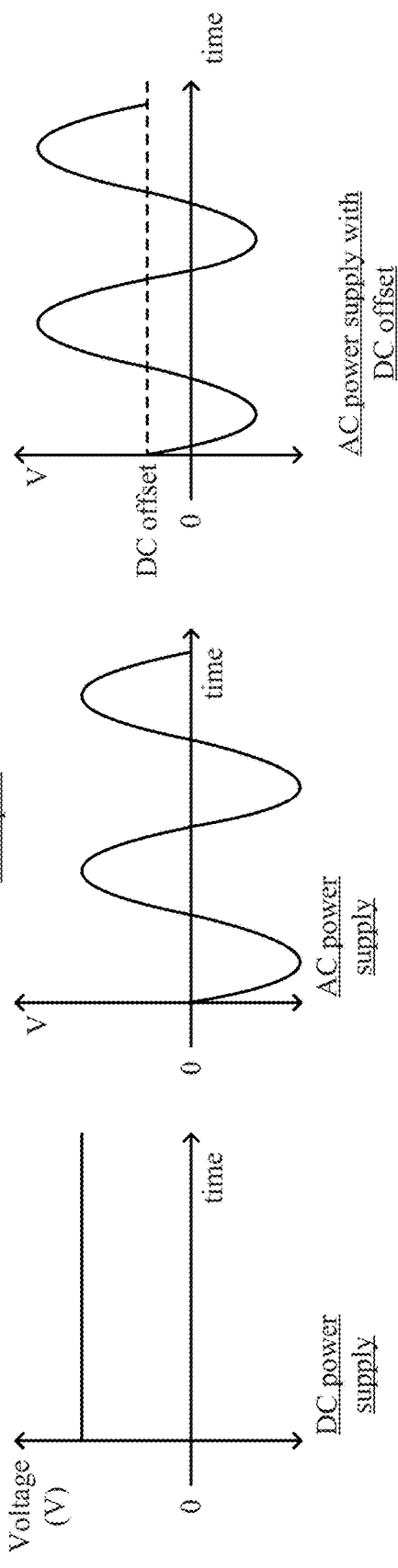
FIG. 14A is a schematic block diagram of examples of power signals in accordance with the present invention.

FIG. 14A is a schematic block diagram of examples 1401 of power signals in accordance with the present invention. From left to right are shown signals associated with a DC (direct current) power supply, an AC (alternating current) power supply, and an AC power supply with a DC offset.

These diagrams show ideal power supply signal examples. An ideal DC power supply maintains a constant voltage at all times. An ideal DC power supply maintains an ideal sinusoidal signal at all times. An ideal AC power supply with a DC offset maintains an ideal sinusoidal signal having a DC offset at all times. Note that these examples are illustrative of certain types of signals that are output from power supplies and not exhaustive of all possible types of signals that are output from power supplies. In general, power supplies can be implemented to operate in any of a variety of different types of applications. For example, relatively lower voltage power supplies may be implemented to provide DC power to computer components, such as desktop appears, laptops, charging devices that they operate to charge consumer electronics such as cell phones, smart phones, tablets, portable music devices, etc. other higher voltage power supplies may operate to provide DC power to components requiring high voltages such as DC motors, machinery, etc. such as may be amended in an industrial application. In general, a power supply is implemented to provide power to one or more loads (e.g., and a load may be viewed as any one or more of a device, integrated circuit, circuitry, computer, tablet, smart phone, appliance, motor, etc.) for consumption by the load.

However, in actual implementations of devices, the signals output from respective types of power supplies may not be ideal. For example, with respect to and AC-DC conversion operation, there can be an oscillating component, or a ripple, associated with the DC signal that is output from the power supply. In addition, other effects such as interference, noise, etc. may adversely affect the quality of the signal is output from the power supply.

Figure 14B:
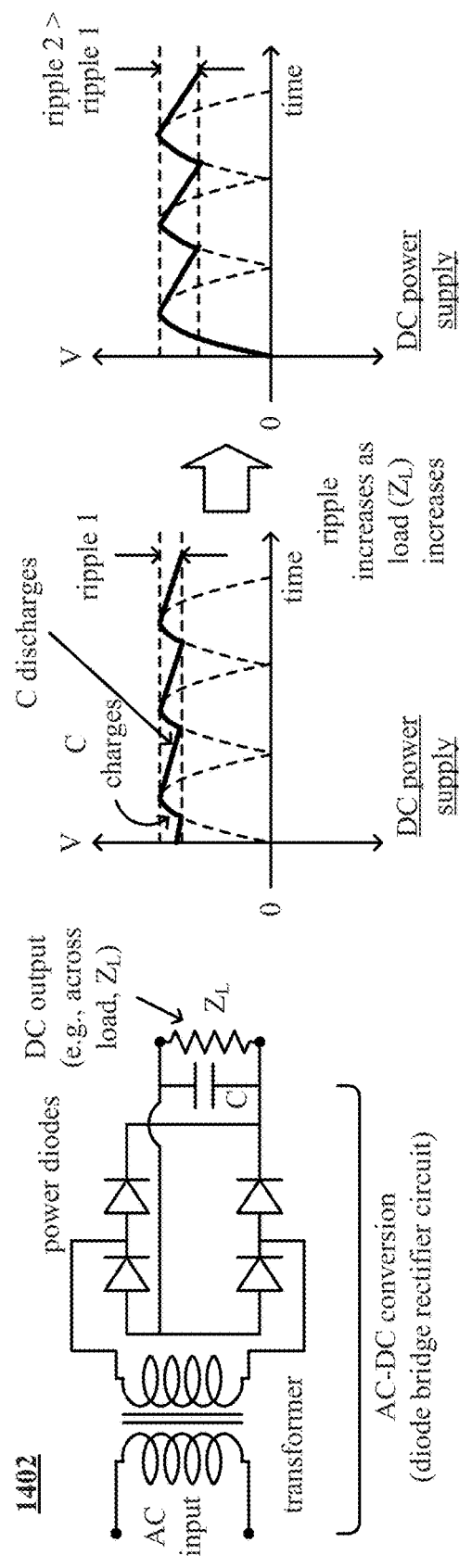
FIG. 14B is a schematic block diagram of an embodiment of AC-DC conversion circuitry and associated DC output signals in accordance with the present invention.

FIG. 14B is a schematic block diagram of an embodiment 1402 of AC-DC conversion circuitry and associated DC output signals in accordance with the present invention. This diagram shows a circuitry implemented to perform AC-DC conversion. This is implemented using diode bridge rectifier circuit (e.g., implemented using power diodes in some examples). An AC input signal is provided to a transformer, and the output of the transformer is appropriately connected to the diode bridge rectifier circuit such that full wave rectification converts both polarities of the implant AC signal to pulsating DC signals. A DC output signal is provided to the load, which is shown here as an impedance, ZL. Note that the impedance may be purely resistive, purely reactive, or any combination of resistive and reactive components including inductive and capacitive components. Also, a capacitor is implemented across the load to facilitate a more stable output DC signal. For example, looking at the waveform diagrams on the right-hand side of the diagram, the capacitor is charged during an upward cycle of the rectified output signal, and the capacitor is discharged during the downward cycle of the rectified output signal. Note that this can result in some variation of the DC output signal from the power supply. Generally speaking, this variation in the output DC signal may be described as a ripple. Note that the size of the ripple will vary as a function of the load of the power supply. If the load of the power supply is changing, the ripple size also will vary. In this diagram, the ripple is shown is increasing as the size of the load increases.

Note that such rectification circuitries may be implemented in a variety of ways and using a variety of components. For example, high-power rectifiers that may be used in high voltage DC power transmission may be implemented using silicon semiconductor devices. In some examples, properly controlled solid-state switches, which may be implemented using metal-oxide-semiconductor field-effect transistors (MOSFETs), where a MOSFET is a type of field-effect transistor (FET), may also be used such that the devices effectively function as diodes to pass current in only one direction. Various types of power supplies may include one or more sets of rectifiers, switches, transformers, etc.

In addition, note that while a full-wave bridge rectifier is shown in this diagram, a half wave rectifier may alternatively be implemented using two diodes to effectuate the AC-DC conversion, such that only the positive cycles of the AC sinusoidal input signal are provided as output and smooth using the capacitor. In many applications, a full-wave bridge rectifier is preferable to a half-wave rectifier for any of a variety of reasons that may include a much higher ripple factor, a very low rectification efficiency given that power is delivered only during one-half cycle of the AC input signal, low transformer utilization factor, DC saturation of the transformer core that may adversely result in a variety of problems such as magnetizing current, hysteresis, harmonic generation, etc. note that such functionality and operations as described herein may be applicable to any type of power supply that may be implemented including those that operate to effectuate AC-DC conversion using full-wave bridge rectification or half-wave rectification.

Figure 15:
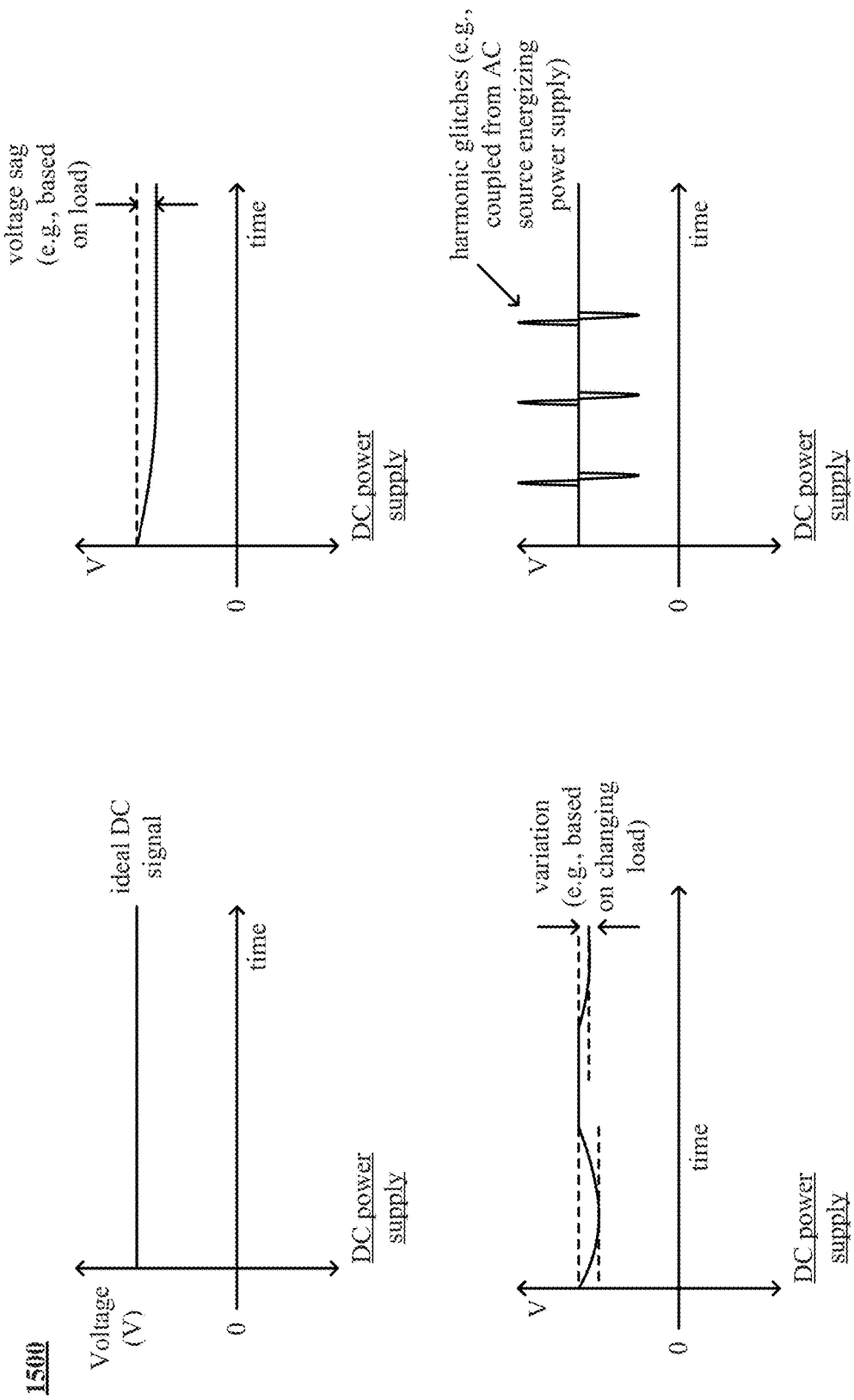
FIG. 15 is a schematic block diagram of other examples of power signals in accordance with the present invention.

FIG. 15 is a schematic block diagram of other examples 1500 of power signals in accordance with the present invention. This diagram shows some examples of adversely affected DC power supply signals. At the top left of the datagram is an ideal DC signal showing a constant voltage as a function of time output from a DC power supply. The top right of the diagram shows a DC signal that is adversely experiencing voltage sag. This voltage sag may be based on the load that is being serviced by the DC power supply. For example, if the DC power supply is not sufficiently rated to deliver adequate power that is required by the load, the voltage may sag.

At the bottom left of the diagram is a time varying DC signal that is adversely experiencing voltage sag that varies as a function of time (e.g., such as based on changing characteristics of the load). At the bottom right of the diagram is a DC signal that is deleteriously affected by harmonic glitches. Such harmonic glitches may be coupled into the power supply signal from any of a number of sources including the AC source that is energizing the power supply, noise in the environment in which the power supply is implemented, or coupled into the power supply from one or more other components. These diagrams show some possible deleterious effects they may adversely affect the quality of a signal output from a DC power supply. In addition, note that any one or more of such deleterious effects may be included within a DC power supply signal. For example, a DC power supply signal may unfortunately be affected by both voltage sag and harmonic glitches.

In some embodiments, a DSC is appropriately implemented simultaneously to sense the power supply signal and compensate for any such deleterious effects in the power supply signal. For example, a DSC may be implemented to detect such variations in DC the power supply signal and to drive a signal into the DC power supply signal to counteract such variations in the DC power supply signal.

Figure 16:
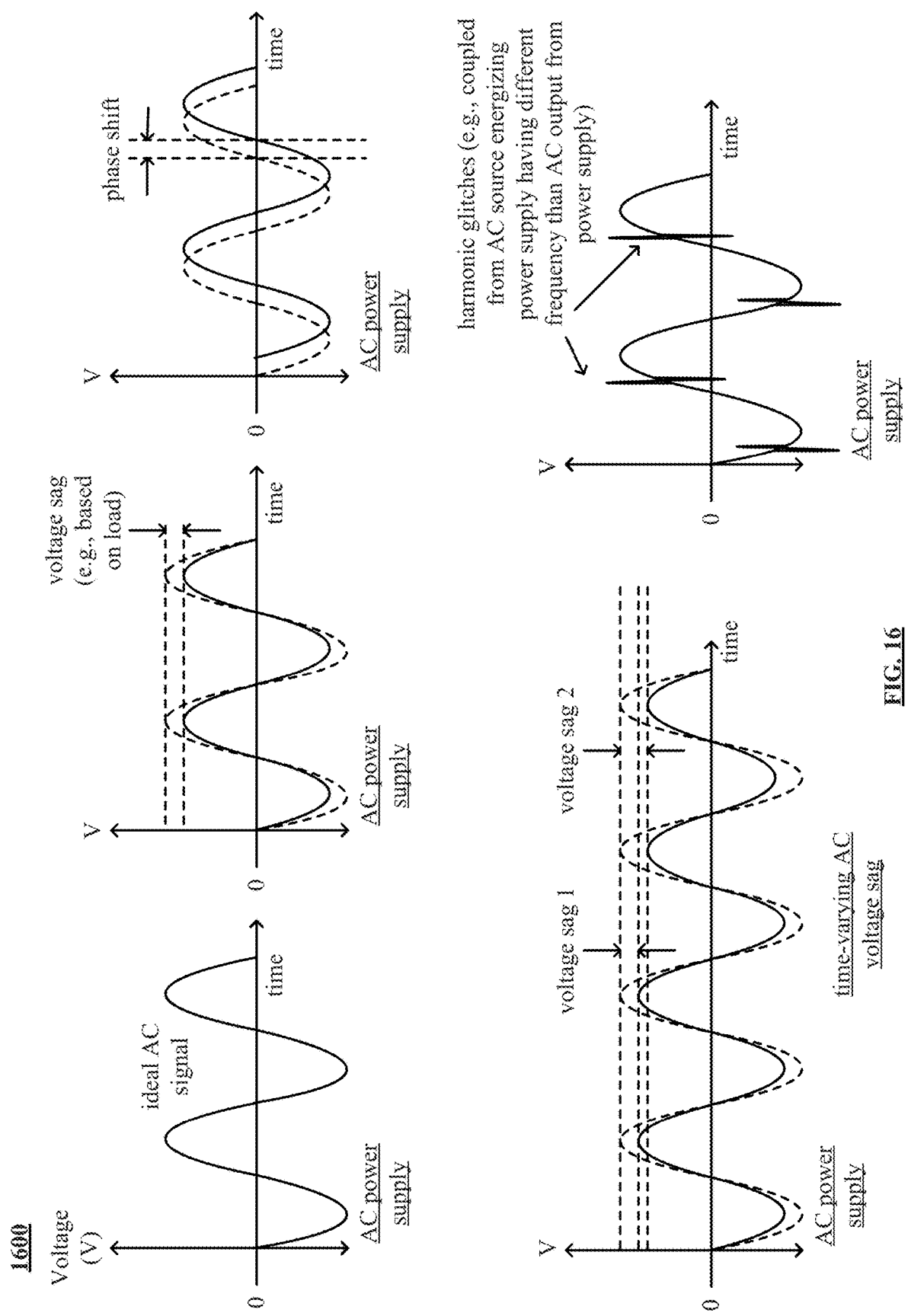
FIG. 16 is a schematic block diagram of other examples of power signals in accordance with the present invention.

FIG. 16 is a schematic block diagram of other examples 1600 of power signals in accordance with the present invention. This diagram shows some example of adversely affected AC power supply signals. At the top left of the diagram is an ideal DC signal showing a constant sinusoidal signal as a function of time output from an AC power supply. The top middle of the diagram shows an AC signal that is adversely experiencing voltage sag based on the load. The magnitude or amplitude of the AC signal is reduced (e.g., as a function of the load). The top right of the diagram shows an AC signal that is adversely experiencing phase shift. Such a shift may be caused by a variety of reasons. For example, the phase shift may be based on the load that is being serviced by the power supply and/or the interaction of the load that is being serviced by the power supply and one or more components of the power supply itself.

At the bottom left of the diagram is an AC signal that is adversely experiencing voltage sag that varies as a function of time. As can be seen in the diagram, different amounts of voltage sag are manifested in the AC signal as a function of time such that the magnitude of the AC signal is not only sagging, but the amount of sag is time varying and changing. At the bottom right of the diagram is an AC signal that is deleteriously affected by harmonic glitches. Such harmonic glitches may be coupled into the power supply signal from any of a number of sources including the AC source that is energizing the power supply, noise in the environment in which the power supply is implemented, or coupled into the power supply from one or more other components. These diagrams show some possible deleterious effects they may adversely affect the quality of an AC signal output from an AC power supply. In addition, note that any one or more of such deleterious effects may be included within an AC power supply signal. For example, an AC power supply signal may unfortunately be affected by both voltage sag and harmonic glitches.

In some embodiments, a DSC is appropriately implemented simultaneously to sense the power supply signal and compensate for any such deleterious effects in the AC power supply signal. For example, a DSC may be implemented to detect such variations in the AC power supply signal and to drive a signal into the AC power supply signal to counteract such variations in the AC power supply signal. In some examples, the DSC is configured to inject a signal that is equal and opposite to the deleterious effects in the AC power supply signal to generate a conditioned power supply signal such that the deleterious effects are reduced or eliminated. In some examples, note that the injected signal corresponds to an inverse of the deleterious effects.

In addition, with respect to DC power supply signals and/or combination DC and AC power supply signals that may suffer adversely from such deleterious effects, in some examples, an appropriately implemented DSC is configured to inject a signal that is equal and opposite to the deleterious effects in the DC power supply signal and/or combination DC and AC power supply signal to generate a conditioned power supply signal such that the deleterious effects are reduced or eliminated. In general, regardless of the type of power supply being implemented, an appropriately implemented DSC is configured to inject a signal that is equal and opposite to any deleterious effects in the power supply signal to generate a conditioned power supply signal such that the deleterious effects are reduced or eliminated (e.g., irrespective of what particular type of power supply signal is implemented in a given example). In some examples, note that the injected signal corresponds to an inverse of the deleterious effects such that, when combined with the power supply signal that includes the deleterious effects, the generated conditioned power supply signal includes reduced deleterious effects or is devoid of the deleterious effects.

Various aspects, embodiments, and/or examples of the invention (and/or their equivalents) provide implementations by which a power supply signal is sensed, and appropriately processed to counter-act any such deleterious effects that may be detected in the power supply signal to generate a conditioned power supply signal such that the deleterious effects are reduced or eliminated. From certain perspectives, a conditioned power supply signal may be viewed as a substantially and/or approximately ideal power supply signal that includes fewer or no deleterious effects. Also, from certain perspectives, a conditioned power supply signal may be viewed as being an improved signal that compares more favorably to an ideal power supply signal (e.g., with fewer or no deleterious effects) as compared to the actual power supply signal output from the power supply that may unfortunately suffer from some such deleterious effects.

Figure 17A:
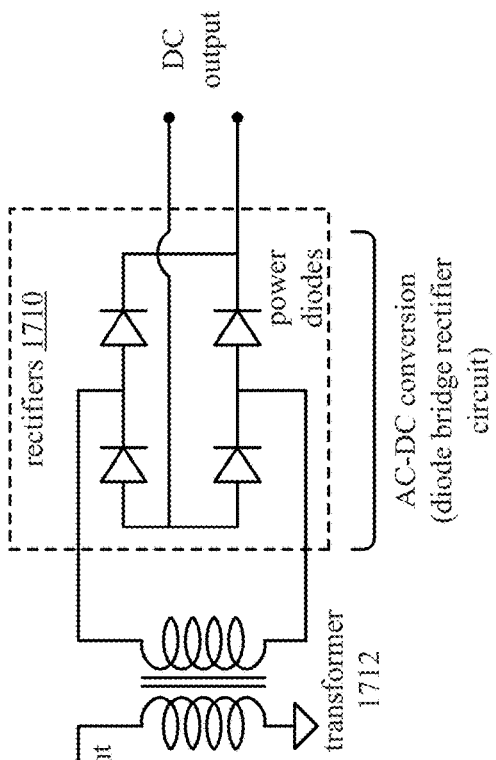
FIG. 17A is a schematic block diagram of an embodiment of AC-DC conversion circuitry that includes a drive-sense circuit (DSC) in accordance with the present invention.

FIG. 17A is a schematic block diagram of an embodiment 1701 of AC-DC conversion circuitry that includes a drive-sense circuit (DSC) in accordance with the present invention. This circuitry of this diagram performs an AC-DC conversion using a transformer 1712 and rectifiers 1710. In some examples, rectifiers are implemented as power diodes. One or more processing modules 1730 is coupled to a DSC 1728. Note that the one or more processing modules 1730 may include integrated memory and/or be coupled to other memory. At least some of the memory stores operational instructions to be executed by the one or more processing modules 1730. In addition, note that the one or more processing modules 1730 may interface with one or more other devices, components, elements, etc. via one or more communication links, networks, communication pathways, channels, etc.

The one or more processing module 1730 are configured to direct the operation of the DSC 1728 that is coupled or connected via a single-line drive sense-signal to a terminal of one of the windings of the transformer 1712. The output terminals of the transformer 1712 are properly connected to the rectifiers 1710 to provide a DC output signal. In an example of operation and implementation, the one or more processing module 1730 are configured to provide a reference signal to the DSC 1728 that then outputs an AC signal, based on the reference signal provided from the one or more processing modules 1730, to the terminal of one of the windings of the transformer 1712.

Figure 17C:
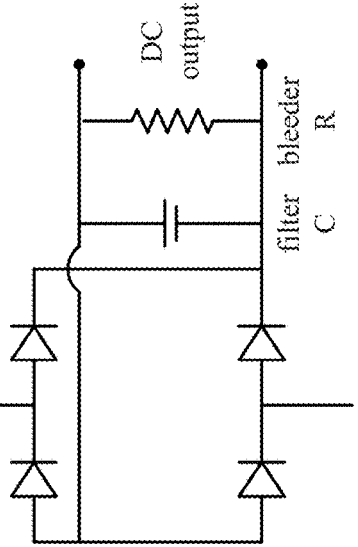
FIG. 17C is a schematic block diagram of another embodiment of an output stage of the AC-DC conversion circuitry of FIG. 17A in accordance with the present invention.
Figure 17B:
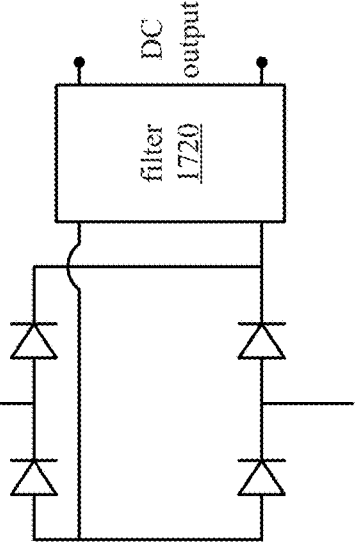
FIG. 17B is a schematic block diagram of an embodiment of an output stage of the AC-DC conversion circuitry of FIG. 17A in accordance with the present invention.

FIG. 17B is a schematic block diagram of an embodiment 1702 of an output stage of the AC-DC conversion circuitry of FIG. 17A in accordance with the present invention. This diagram shows one possible example of output filtering that is performed on the DC output signal by the power supply using a filter 1720. The filter 1720 may be implemented as any of a number of different types of filters including a low pass filter, an RC circuit, etc. Generally speaking with respect to a device implemented performed AC-DC conversion, the filter 1720 may be implemented to reduce the ripple of the DC output signal and maintain a substantially or approximately constant output voltage from the power supply to one or more loads that the power supply is servicing.

FIG. 17C is a schematic block diagram of another embodiment 1703 of an output stage of the AC-DC conversion circuitry of FIG. 17A in accordance with the present invention. This diagram shows a particular implementation using a filter capacitor and a bleeder resistor to perform the appropriate filtering of the DC output signal that is provided from the power supply. In general, note that any of a variety of different types of filtering operations may be performed by appropriately implemented components within the power supply. Again, in general, with respect to a device implemented performed AC-DC conversion, such filtering may be implemented to reduce the ripple of the DC output signal and maintain a substantially or approximately constant output voltage from the power supply to one or more loads that the power supply is servicing.

Figure 18A:
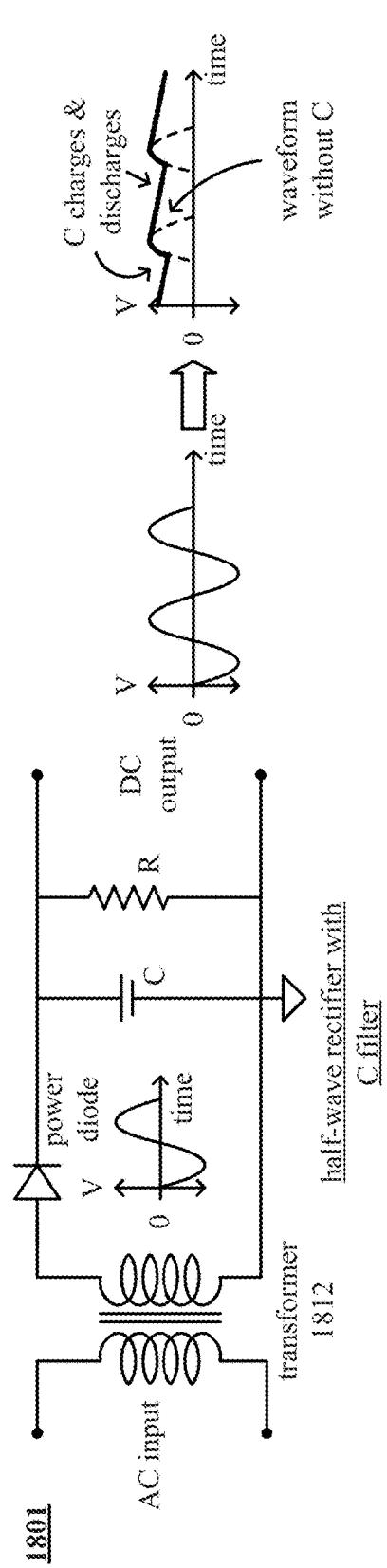
FIG. 18A is a schematic block diagram of an embodiment of a half-wave rectifier with capacitor (C) filter in accordance with the present invention.

FIG. 18A is a schematic block diagram of an embodiment 1801 of a half-wave rectifier with capacitor (C) filter in accordance with the present invention. This diagram shows half-wave rectification such that an AC input signal is provided to first terminals of a transformer 1812 and a diode, such as a power diode, is implemented performed half-wave rectification of the output signal from the second terminals of the transformer 1812. This diagram shows a half-wave rectifier with a capacitor, C, filter to smooth DC output signal. Note also that a bleeder resistor, R, is included in this implementation. As can be seen on the right-hand side of the diagram, only the positive cycles of the AC sinusoidal input signal are output, and a ripple of the DC output signal occurs during the charging and discharging operations of the capacitor filter. Also, on the right-hand side of the diagram with respect to the dotted line, note the output waveform without the capacitor filter.

Figure 18B:
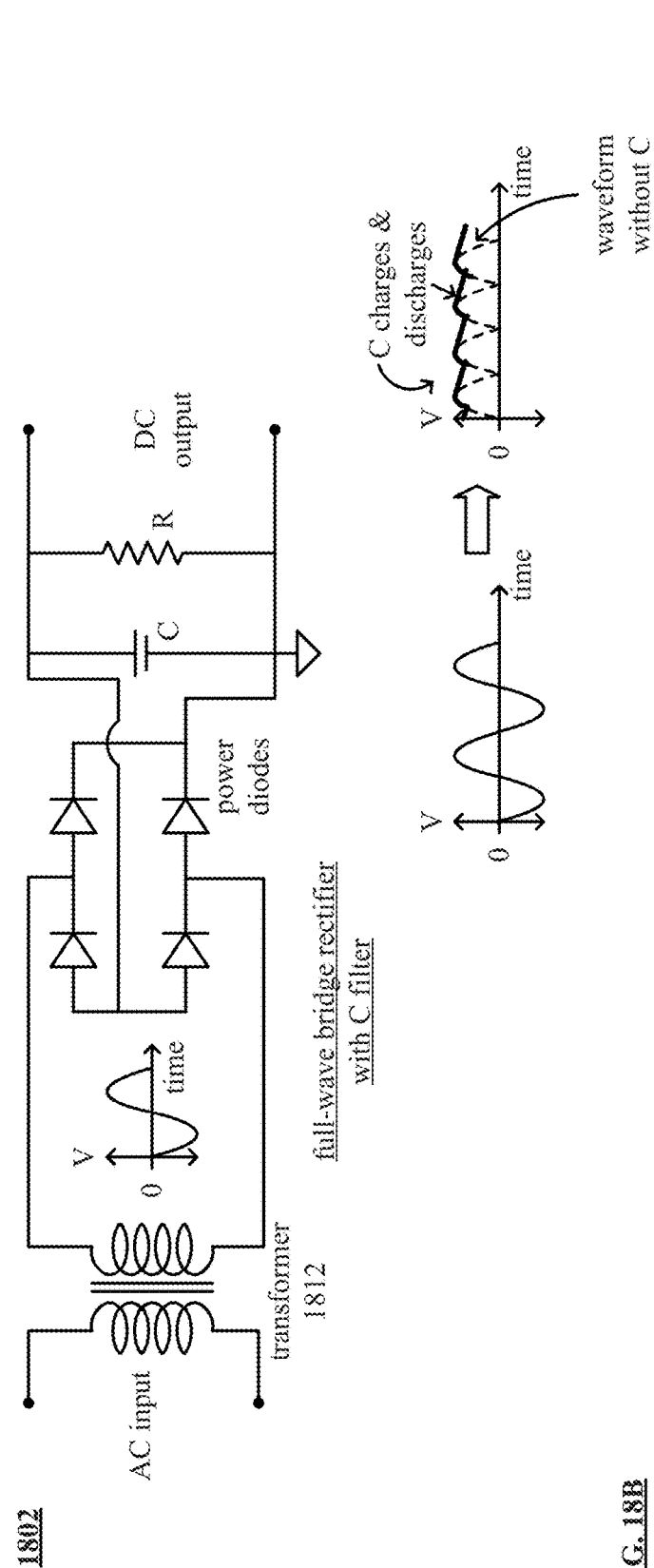
FIG. 18B is a schematic block diagram of an embodiment of a full-wave bridge rectifier with capacitor (C) filter in accordance with the present invention.

FIG. 18B is a schematic block diagram of an embodiment 1802 of a full-wave bridge rectifier with capacitor (C) filter in accordance with the present invention. This diagram shows full-wave bridge rectification such that an AC input signal is provided to first terminals of a transformer 1812 and a full bridge of four diodes, such as power diodes, is implemented performed full-wave rectification of the output signal from the second terminals of the transformer 1812. This diagram shows a full-wave rectifier with a capacitor, C, filter to smooth DC output signal. Note also that a bleeder resistor, R, is included in this implementation. As can be seen on the right-hand side of the diagram, only the positive cycles of the AC sinusoidal input signal are output, and a ripple of the DC output signal occurs during the charging and discharging operations of the capacitor filter. Also, on the right-hand side of the diagram with respect to the dotted line, note the output waveform without the capacitor filter.

Figure 19:
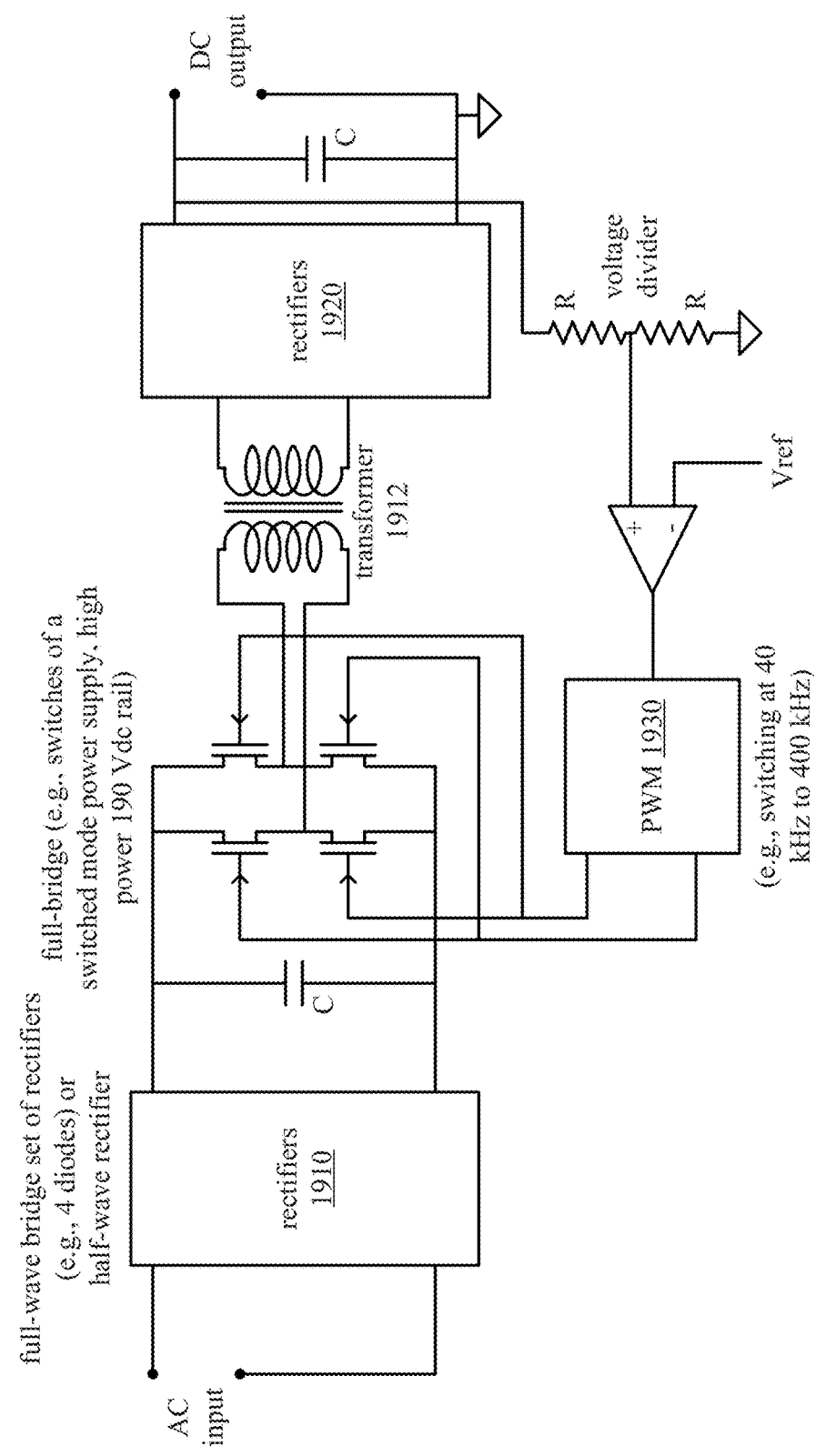
FIG. 19 is a schematic block diagram of an embodiment of a switched mode power supply implemented using a full-wave bridge in accordance with the present invention.

FIG. 19 is a schematic block diagram of an embodiment 1900 of a switched mode power supply implemented using a full-wave bridge in accordance with the present invention. This diagram and the following diagram show possible implementations of switched mode power supplies. In general, switched mode power supplies provide the ability to deliver much more power than linear regulated power supplies, with some additional complexity in the switched mode operation.

In this particular implementation, an AC input signal is provided to a first set of rectifiers 1910. This set of rectifiers 1910 is sometimes referred to as a rectifier and reservoir circuit. Note that the rectifiers 1910 may be implemented in any of a variety of ways including half-wave rectification, full-wave bridge rectification, etc. The output signal from the rectifiers 1910 are provided to a switching network (e.g., which may be implemented using appropriately connected MOSFETs) that provides an output signal to the first terminals of a transformer 1912. The second terminals of the transformer 1912 are coupled to another set of rectifiers 1920. An output capacitor filter, C, conditions the DC signal output from the rectifiers 1920. Also, the output the positive output signal from the rectifiers 1920 is fed through a voltage divider (e.g., shown in this example as a two-stage voltage divider that includes two resistors, R) and provides a feedback signal to a comparator or operational amplifier that generates a control signal to a pulse width modulation (PWM) 1930.

Within operation of the switched mode power supply, the output of the rectifiers 1910 is provided to a switching circuit that receives pulse width modulation (PWM) pulses from a PWM 1930 that is driven from the output of the comparator or operational amplifier having two inputs including a voltage reference signal (Vref) and the feedback from the output of the set of rectifiers 1920 after being appropriately scaled using the voltage divider.

Generally speaking, a switched mode power supply is implemented to use a high-frequency square wave to drive an electronic power switching circuit. The AC-DC conversion process is performed in multiple steps. The circuit converts an initial DC supply into a high-frequency, high current AC signal, which is been reconverted into a regulated DC output signal. This is sometimes referred to as a double conversion process. By performing this double conversion process, the preliminary DC signal or the initial AC input signal is converted to a very high-frequency AC signal, and as such, the respective components of the switched mode power supply can be much smaller than if they were implemented at lower frequencies. For example, the transformer 1912, any reactive components such as inductors and capacitors, that may be used for conversion back to the DC output signal may be much smaller, and often times much cheaper than would be required to perform such conversion operations at lower frequencies, including typical power system AC line frequency such as 60 Hz.

In some examples, the switching network is implemented as a half-wave bridge that includes the switches of the switched mode power supply, and operate at a very high power and high voltage DC signal. In a particular limitation, the switching of the PWM 1930 is performed at a high-frequency such as within the range of 40 kHz to 400 kHz, and the DC rail of the square wave signal that is provided to the switching network use a high-power 220 Volt DC rail.

Note that the very high-frequency AC signal that is output from the switching network to the first terminals of the transformer 1912 is a square wave, and as such, PWM may be used to control the output voltage of the switching network.

Figure 20:
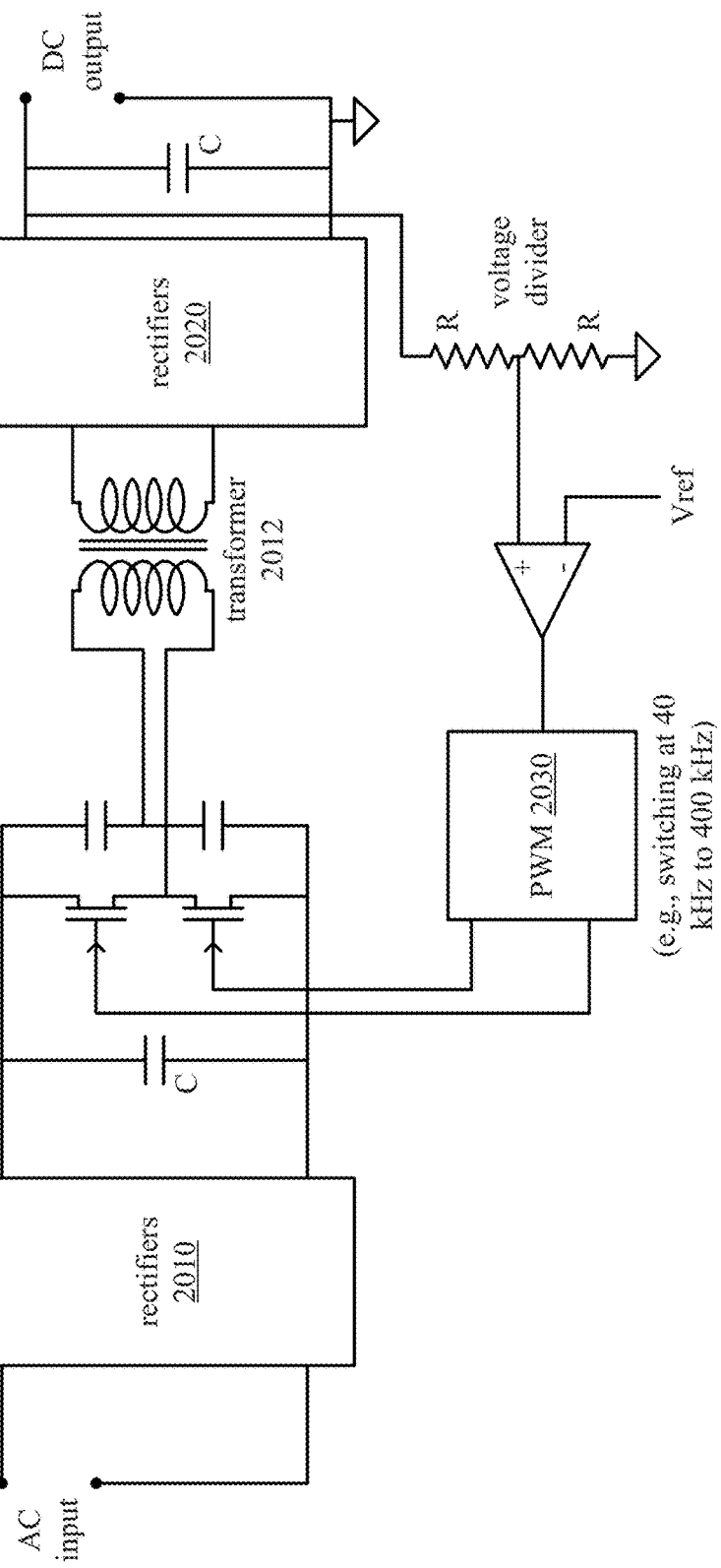
FIG. 20 is a schematic block diagram of an embodiment of a switched mode power supply implemented using a half-wave bridge in accordance with the present invention.

FIG. 20 is a schematic block diagram of an embodiment 2000 of a switched mode power supply implemented using a half-wave bridge in accordance with the present invention. This diagram has many similarities to the previous diagram with at least one difference being the switching network is implemented using half-way rectification. In this particular implementation, an AC input signal is provided to a first set of rectifiers 2010. Note that the rectifiers 2010 may be implemented in any of a variety of ways including half-wave rectification, half-wave bridge rectification, etc. The output signal from the rectifiers 2010 are provided to a switching network (e.g., which may be implemented using appropriately connected MOSFETs) that provides an output signal to the first terminals of a transformer 2012. The second terminals of the transformer 2012 are coupled to another set of rectifiers 2020. An output capacitor filter, C, conditions the DC signal output from the rectifiers 2020. Also, the output the positive output signal from the rectifiers 2020 is fed through a voltage divider (e.g., shown in this example as a two-stage voltage divider that includes two resistors, R) and provides a feedback signal to a comparator or operational amplifier that generates a control signal to a pulse width modulation (PWM) 2030.

Within operation of the switched mode power supply, the output of the rectifiers 2010 is provided to a switching circuit that receives PWM pulses from a PWM 2030 that is driven from the output of the comparator or operational amplifier having two inputs including a voltage reference signal (Vref) and the feedback from the output of the set of rectifiers 2020 after being appropriately scaled using the voltage divider.

Generally speaking, a switched mode power supply is implemented to use a high-frequency square wave to drive an electronic power switching circuit. The AC-DC conversion process is performed in multiple steps. The circuit converts an initial DC supply into a high-frequency, high current AC signal, which is been reconverted into a regulated DC output signal. This is sometimes referred to as a double conversion process. By performing this double conversion process, the preliminary DC signal or the initial AC input signal is converted to a very high-frequency AC signal, and as such, the respective components of the switched mode power supply can be much smaller than if they were implemented at lower frequencies. For example, the transformer 2012, any reactive components such as inductors and capacitors, that may be used for conversion back to the DC output signal may be much smaller, and often times much cheaper than would be required to perform such conversion operations at lower frequencies, including typical power system AC line frequency such as 60 Hz.

In some examples, the switching network is implemented as a half-wave bridge that includes the switches of the switched mode power supply, and operate at a very high power and high voltage DC signal. In a particular limitation, the switching of the PWM 2030 is performed at a high-frequency such as within the range of 40 kHz to 400 kHz, and the DC rail of the square wave signal that is provided to the switching network use a high-power 220 Volt DC rail.

The previous two diagrams provide some background on switched mode power supplies. Other previous diagrams provide other examples of alternative types of power supplies including those that perform AC-DC conversion using one or both of half-wave rectification or full-wave bridge rectification. Note that these types of power supplies are examples of power supplies that may benefit from the appropriate implementation of one or more DSCs to improve their performance. The operation of these types of power supplies and others that provide output signals that are non-ideal is improved based on the operation of one or more DSCs that are operative to provide a more accurate, more stable, power supply signal to one or more loads. In general, note that any power supply signal that suffers from any deleterious effect, variation, instability, noise, interference, problem, etc. may be improved using one or more DSCs in accordance with various aspects, embodiments, and/or examples of the invention (and/or their equivalents).

Certain of the following diagrams show one or more processing modules. In certain instances, the one or more processing modules is configured to communicate with and interact with one or more other devices including one or more of DSCs, one or more components with a DSC, one or more power supplies, one or more components within a power supply, one or more loads, etc. Note that any such implementation of one or more processing modules may include integrated memory and/or be coupled to other memory. At least some of the memory stores operational instructions to be executed by the one or more processing modules. In addition, note that the one or more processing modules may interface with one or more other devices, components, elements, etc. via one or more communication links, networks, communication pathways, channels, etc.

In addition, when a DSC is implemented to communicate with and interact with one or more loads, the DSC is configured simultaneously to transmit and receive one or more signals with the one or more loads. For example, a DSC is configured simultaneously to sense and to drive one or more signals to the one or more loads. During transmission of a signal from a DSC, that same DSC is configured simultaneously to sense the signal being transmitted from the DSC and any other signal may be coupled into the signal that is being transmitted from the DSC.

Figure 21A:
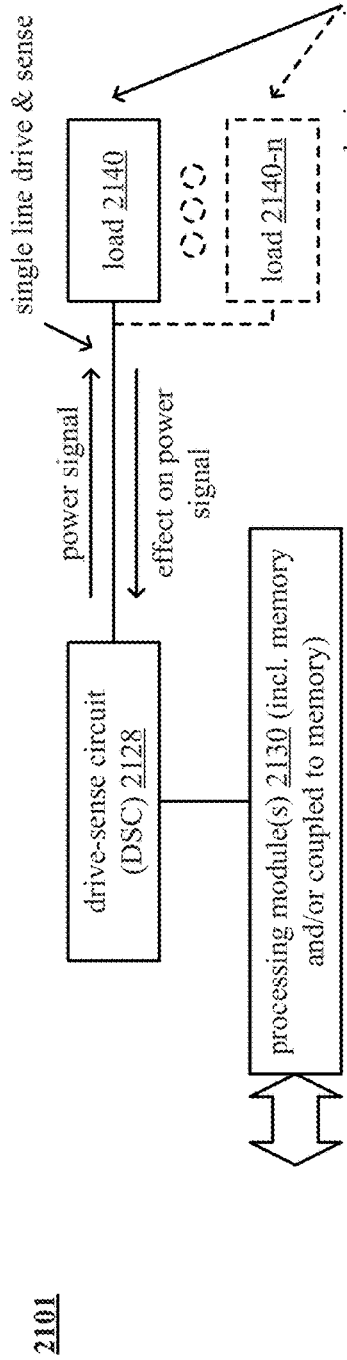
FIG. 21A is a schematic block diagram of an embodiment of a DSC configured simultaneously to drive and sense a power signal in accordance with the present invention.

FIG. 21A is a schematic block diagram of an embodiment 2101 of a DSC configured simultaneously to drive and sense a power signal in accordance with the present invention. In this diagram, one or more processing modules 2130 is configured to communicate with and interact with a drive-sense circuit (DSC) 2128. The DSC is configured to provide a power signal to one or more loads of shown as load 2140 to load 2140-$n$. Note that such a load may be any device that is being provided a power signal. Examples of such loads may include any one or more of an integrated circuit, circuitry, a computer, a tablet, a smartphone, an appliance, a motor, etc. In general, any device that is being provided a power signal from the power supply may be viewed as a load. Note that one or more loads are depicted in other diagrams as well, and, in general, any such loads may be any such device that is being provided power via one or more signals. Generally speaking, any device that consumes electricity in accordance with being provided a power signal may be viewed as a load herein.

In this diagram, the DSC 2128 operates to provide the power signal to the one or more loads 2140 to 2140-$n$ and also simultaneously to detect any effect on the power signal. A power supply is integrated into the DSC 2128 in this diagram. From certain perspectives, a DSC, as implemented in accordance with various aspects, embodiments, and/or examples of the invention (and/or their equivalents) may be viewed to perform the operation of the power supply by delivering power to one or more loads.

Figure 21B:
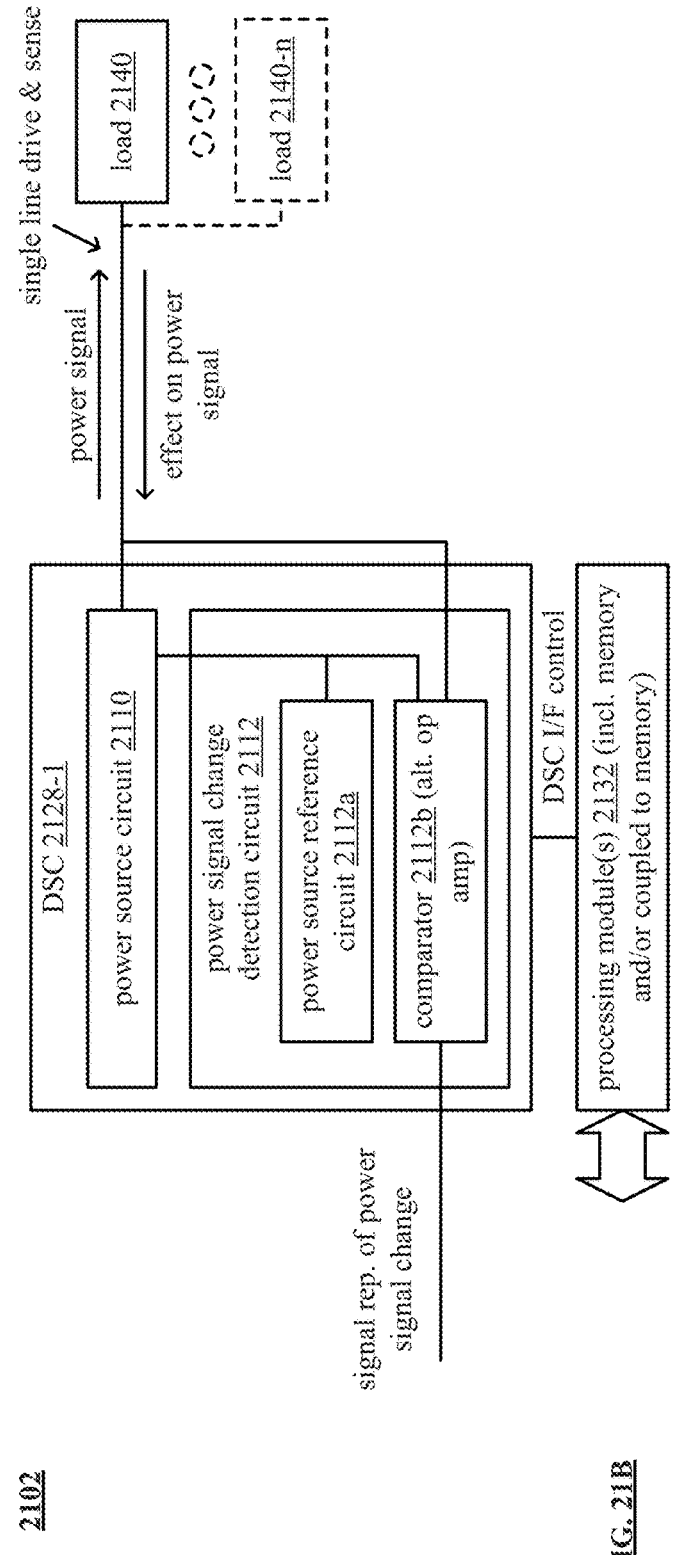
FIG. 21B is a schematic block diagram of another embodiment of a DSC configured simultaneously to drive and sense a power signal in accordance with the present invention.

FIG. 21B is a schematic block diagram of another embodiment 2102 of a DSC configured simultaneously to drive and sense a power signal in accordance with the present invention. In this diagram, DSC 2128-1 includes a power source circuit 2110 and a power signal change detection circuit 2112. The power signal change detection circuit 2112 includes a power source reference circuit 2112$a$ and a comparator 2112$b$. With respect to this diagram as well as others, note than any comparator may alternatively implemented as an operational amplifier as desired in certain examples. For example, while come examples are implemented such that a comparator operates to output a binary signal (e.g., either a 1 or a 0), an operational amplifier may alternatively be implemented to output any signal within a range of signals as may be desired in certain applications. In some examples, the power source circuit 2112 may be an independent current source, a dependent current source, a current mirror circuit, etc., or alternatively, an independent voltage source, a dependent voltage source, etc.

In addition, one or more processing modules 2132 is configured to interact with and communicate with the DSC 2128-1. In some examples, the one or more processing modules 2132 is configured to provide control signals to one or more of the components within the DSC 2128-1. In addition, the one or more processing modules 2132 is configured to receive information from DSC 2128-1. The one or more processing modules 2132 is configured to process information that is received and to direct operation of one or more of the components within the DSC 2128-1.

In an example of operation based on a current related implementation of the DSC 2128-1, the power source reference circuit 2112$a$ provides a current reference with at least one of DC and oscillating components to the power source circuit 2110. The current source generates a current as the power signal based on the current reference. An electrical characteristic of the one or more loads 2140 to 2140-$n$ has an effect on the current power signal. For example, if the impedance of the one or more loads 2140 to 2140-$n$ decreases and the current power signal remains substantially unchanged, the voltage across the one or more loads 2140 to 2140-$n$ is decreased.

The comparator 2112*b* compares the current reference with the affected power signal to produce a signal that is representative of the change to the power signal. For example, the current reference signal corresponds to a given current (I) times a given impedance (Z). The current reference generates the power signal to produce the given current (I). If the impedance of the one or more loads 2140 to 2140-$n$ substantially matches the given impedance (Z), then the comparator's output is reflective of the impedances substantially matching. If the impedance of the one or more loads 2140 to 2140-$n$ is greater than the given impedance (Z), then the comparator's output is indicative of how much greater the impedance of the one or more loads 2140 to 2140-$n$ is than that of the given impedance (Z). If the impedance of the one or more loads 2140 to 2140-$n$ is less than the given impedance (Z), then the comparator's output is indicative of how much less the impedance of the one or more loads 2140 to 2140-$n$ is than that of the given impedance (Z).

In an example of operation based on a voltage related implementation of the DSC 2128-1, the power source reference circuit 2112*a* provides a voltage reference with at least one of DC and oscillating components to the power source circuit 2110. The power source circuit 2110 generates a voltage as the power signal based on the voltage reference. An electrical characteristic of the one or more loads 2140 to 2140-$n$ has an effect on the voltage power signal. For example, if the impedance of the sensor decreases and the voltage power signal remains substantially unchanged, the current through the sensor is increased.

The comparator 2112*b* compares the voltage reference with the affected power signal to produce the signal that is representative of the change to the power signal. For example, the voltage reference signal corresponds to a given voltage (V) divided by a given impedance (Z). The voltage reference generates the power signal to produce the given voltage (V). If the impedance of the one or more loads 2140 to 2140-$n$ substantially matches the given impedance (Z), then the comparator's output is reflective of the impedances substantially matching. If the impedance of the one or more loads 2140 to 2140-$n$ is greater than the given impedance (Z), then the comparator's output is indicative of how much greater the impedance of the one or more loads 2140 to 2140-$n$ is than that of the given impedance (Z). If the impedance of the one or more loads 2140 to 2140-$n$ is less than the given impedance (Z), then the comparator's output is indicative of how much less the impedance of the one or more loads 2140 to 2140-$n$ is than that of the given impedance (Z).

FIG. 22A is a schematic block diagram of another embodiment 2202 of a DSC configured simultaneously to drive and sense a power signal in accordance with the present invention. In this diagram, a DSC 2228 includes a regulation circuit 2212 includes a feedback circuit 2213, a power source circuit 2210, and a comparator 2215. The DSC 2228 interfaces with one or more processing modules 2230 using a digital to analog converter (DAC) 2252 and an analog to digital converter (ADC) 2252. The one or more processing modules 2230 is configured to provide a digital control signal via the DAC 2252 to the comparator 2215 to be used as a reference signal by the comparator 2215. Note that the digital control signal is transformed into an analog signal by the DAC 2252 before being provided to the comparator 2215. The one or more processing modules 2230 is also configured to receive a signal output from the comparator 2215 via the ADC 2250. For example, the analog signal output from the comparator 2215, when comparing the power signal that is provided from the power source circuit 2210 to the one or more loads 2240 to 2240-$n$ and any effect thereof to the reference signal received from the one or more processing modules 2230 via the DAC 2252, is processed by the ADC 2252 provided digital representation of that analog signal to the one or more processing modules 2230.

The analog signal output from the comparator 2215 is provided to the feedback circuit 2213 of the regulation circuit 2212 to generate a signal to be provided to the power source circuit 2210 to modify operation of the power source circuit 2210 to ensure that the power signal provided to the one or more loads 2240 to 2240-$n$ is regulated to be same as the reference signal received by the comparator 2215 from the one or more processing modules 2230 via the DAC 2252. This implementation includes a DSC 2228 that interfaces with one or more processing modules 2230 via externally located and implemented ADC 2250 and DAC 2252.

FIG. 22B is a schematic block diagram of another embodiment 2202 of a DSC configured simultaneously to drive and sense a power signal in accordance with the present invention. In this diagram, a DSC 2228-1 includes a regulation circuit 2212 includes a feedback circuit 2213, a power source circuit 2210, a comparator 2215, and also an integrated ADC 2260 and DAC 2262 that are configured to facilitate interfacing with one or more processing modules 2230. This diagram has many similarities to the prior diagram with at least one difference being that ADC 2260 and DAC 2262 are implemented within or integrated within the DSC 2228-1. Note that alternative and limitations of a DSC may be made including one or more means of interfacing with one or more other devices, components, etc. using one or more integrated and/or externally implemented ADC and/or DAC.

Figure 23:
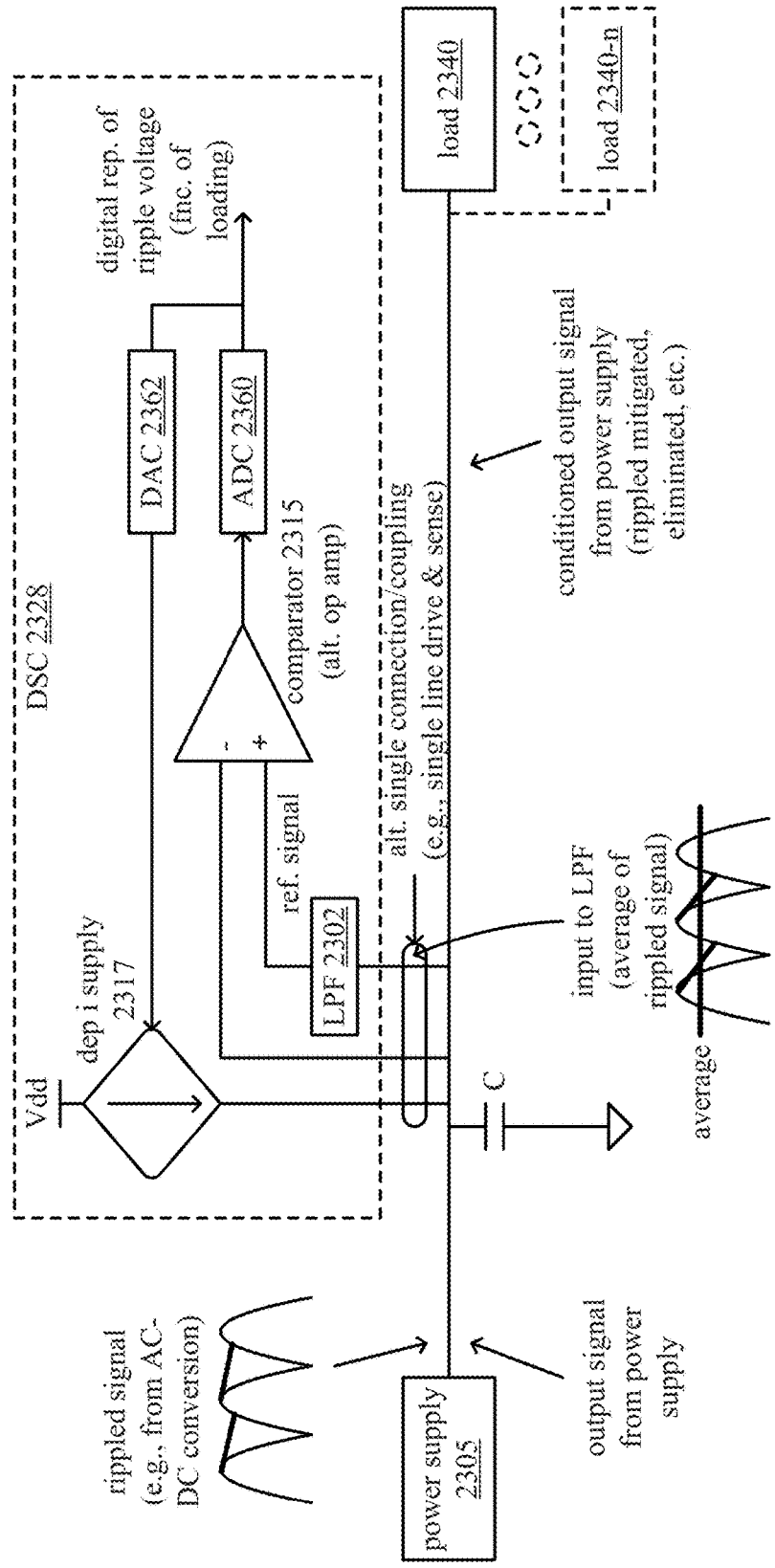
FIG. 23 is a schematic block diagram of an embodiment of a DSC configured to perform power supply signal conditioning in accordance with the present invention.

FIG. 23 is a schematic block diagram of an embodiment 2300 of a DSC configured to perform power supply signal conditioning in accordance with the present invention. In this diagram, a DSC 2328 includes a dependent current supply 2317. The dependent current supply 2317 is controlled by an output signal that is based on operation of a comparator 2315 that compares a reference signal to the output signal from a power supply. Note that power Vdd of the dependent current supply 2317 may be implemented as being from any one or more of different sources in various examples. In some examples, the power supply Vdd is same as a power supply source of the power supply 2305. In other examples, the power supply Vdd is from a battery. In even other examples, the power supply Vdd is a highly conditioned power supply signal that has undergone extensive filtering (e.g., removal of all AC components with only a DC component remaining or alternatively removal of all DC components with only an AC component remaining). In yet other examples, the power supply Vdd is provide from a very capacitor (e.g., a super-cap) that is implemented to be charged and to provide energy to the dependent current supply 2317 as needed. Similarly, in other diagrams, examples, embodiments, etc. herein, such a power supply Vdd may be implemented as being from any one or more of different sources.

As described previously, some signals output from power supplies may include one or more adverse effects, such as a ripple. In general, any deleterious effect on output signal from a power supply may be reduced or eliminated using the processing of a DSC 2328 as described in this diagram.

A power supply 2305 outputs a signal and provides it to one or more loads 2340 to 2340-*n*. A filtering capacitor, C, may be implemented to filter the signal that is output from the power supply. The DSC 2328 is configured simultaneously to sense the signal output from the power supply and to modify the signal output from this power supply, as may be needed, to facilitate power supply signal conditioning. In some instances, the DSC 2328 interacts with a coupling or connection between the power supply 2305 and the one or more loads 2340 to 2340-*n* via multiple connection points. In other instances, the DSC 2328 interacts with a coupling or connection between the power supply 2305 and the one or more loads 2340 to 2340-*n* via a single connection/coupling. That is to say, in such an example, the DSC 2328 connects for couples to the coupling or connection between the power supply 2305 and the one or more loads 2340 to 2340-*n* via a single line. As described herein, any desired implementation of a DSC may be made such that the DSC is configured simultaneously to transmit and receive via a single line, or simultaneously to sense and drive a signal via the single line.

In an example of operation and implementation, the output signal from the power supply is passed through a low pass filter (LPF) 2302 that outputs a reference signal as one of the inputs to comparator 2315 of the DSC 2328. In addition, the output signal from the power supply itself is provided as the other input to the comparator 2315 of the DSC 2328. The comparator 2315 compares the reference signal and the output signal from the power supply to generate a signal that is provided to an ADC 2360 that processes that signal to generate a digital signal that is representative of any effect of the output signal from the power supply. For example, when the output signal from the power supply includes a ripple component, the digital signal output from the ADC 2360 includes a digital representation of that ripple voltage. As also described herein, note that the amount of ripple in the output signal from the power supply will be a function of the one or more loads 2340 to 2340-*n*. Within this diagram as well as with respect to others that generate a signal that is a digital representation of any deleteriously effects of the power supply signal (e.g., ripple voltage), note that such information may be fed into one or more processing modules to be used for any one or more of various applications including analysis, decision-making, etc. In some examples, this digital information is fed into an artificial intelligence (AI) engine implemented to perform machine learning.

Moreover, note that some alternative examples may also or alternatively include a sensing-only configuration of an alternative implementation of the DSC 2328 such that the DAC 2361 and the dependent current supply 2317 are excluded and the alternative implementation of the DSC 2328 includes the LPF 2302, the comparator 2315 (or operational amplifier), and the ADC 2360 implemented to provide the signal that is a digital representation of any deleteriously effects of the power supply signal (e.g., ripple voltage) to be used for any one or more of various applications. In such an example, such an alternative implementation of the DSC 2328 is a sensing device implemented to provide digital information.

In this diagram, the digital signal that is representative of the ripple voltage is passed through a DAC 2362 to generate an analog control signal that is provided to the dependent current supply 2317 that is configured to drive a current signal into the output signal from the power supply to reduce or eliminate any deleterious effect of the output signal from the power supply. For example, when the output signal from the power supply includes a ripple component, the dependent current supply 2317 is configured to drive the current into the output signal from the power supply to reduce or eliminate that ripple component and ensure a stable, regulated, etc. output signal from the power supply to be provided to the one or more loads 2340 to 2340-*n*.

In an example of operation and implementation, this diagram includes a power supply signal conditioning system that includes a power supply and the DSC. The power supply is operably coupled to one or more loads. Also, when enabled, the power supply is configured to output a power supply signal having a DC (direct current) voltage component and a ripple voltage component that is based on conversion of an AC (alternating current) signal in accordance with generating the power supply signal.

The DSC 2328 is operably coupled to the power supply. When enabled, the DSC 2328 configured simultaneously to sense the power supply signal and, based on sensing of the power supply signal, adaptively to process the power supply signal in accordance with reducing or eliminating the ripple voltage component of the power supply signal to generate a conditioned power supply signal to service the one or more loads 2340 to 2340-*n*.

In some examples, the DSC 2328, when enabled, is further configured simultaneously to sense the power supply signal and adaptively to inject a current signal that is based on the sensing of the power supply signal into the power supply signal in accordance with reducing or eliminating the ripple voltage component of the power supply signal to generate the conditioned power supply signal to service the one or more loads 2340 to 2340-*n*.

In some examples, the DSC 2328 also includes a low pass filter (LPF) 2302 that is configured to process the power supply signal to generate an LPF signal. The DSC 2328 also includes a comparator 2315 configured to compare the LPF signal to the power supply signal to produce an analog comparator output signal. The DSC 2328 also includes a current supply circuit 2317 configured adaptively, based on the analog comparator output signal, to inject the current signal that is based on the sensing of the power supply signal into the power supply signal. In other examples, the DSC 2328 also includes a low pass filter (LPF) 2302 configured to process the power supply signal to generate an LPF signal. In alternative examples such as this that include an LPF 2302, note that the LPF 2302 may be replaced with an alternative filter (e.g., a high pass filter (HPF), a band pass filter (BPF), etc.). In this diagram, the LPF 2302 is implemented to reject higher frequency components of the power supply signal. In alternative designs and implementations, any such desired filtering may alternatively be performed (e.g., BPF, HPF, etc.).

The DSC 2328 also includes a comparator that is configured to compare the LPF signal to the power supply signal to produce an analog comparator output signal. The DSC 2328 also includes an analog to digital converter (ADC) 2360 that is configured to process the analog comparator output signal to generate a digital comparator output signal that is representative of the ripple voltage component of the power supply signal. The DSC 2328 also includes a digital to analog converter (DAC) 2362 that is configured to process the analog comparator output signal to generate another analog comparator output signal. The DSC 2328 also includes a current supply circuit 2317 configured adaptively, based on the another analog comparator output signal, to inject the current signal that is based on the sensing of the power supply signal into the power supply signal.

In some examples, the DSC 2328 operably coupled via a single line to a connection between the power supply and the one or more loads 2340 to 2340-n. Also, when enabled, the DSC 2328 is further configured simultaneously to sense the power supply signal and, based on the sensing of the power supply signal, adaptively to inject the current signal that is based on the sensing of the power supply signal into the power supply signal.

Note that the power supply 2305 may be on any of a number of varieties and types of power supplies including any one or more of a half-wave bridge rectifier circuit, a full-wave bridge rectifier circuit, or a switched mode power supply.

In some examples, the DSC 2328 also includes a power source circuit operably coupled via a single line to a connection between the power supply and the one or more loads 2340 to 2340-n. When enabled, the power source circuit is configured adaptively to inject an analog signal into the power supply signal in accordance with reducing or eliminating the ripple voltage component of the power supply signal to generate the conditioned power supply signal to service the one or more loads 2340 to 2340-n. The analog signal includes at least one of a DC (direct current) component or an oscillating component. The DSC 2228 also includes a power signal change detection circuit operably coupled to the power source circuit. When enabled, the power signal change detection circuit is configured to detect an effect on the analog signal that is based on an electrical characteristic of at least one of the power supply and the one or more loads 2340 to 2340-n and to generate a digital signal that is representative of the ripple voltage component of the power supply signal.

Also, in some particular examples the power source circuit includes a power source to source at least one of a voltage or a current via the single line to the connection between the power supply and the one or more loads 2340 to 2340-n. The power signal change detection circuit includes a power source reference circuit configured to provide at least one of a voltage reference or a current reference. The power signal change detection circuit also includes a comparator configured to compare the at least one of the voltage and the current provided via the single line to the connection between the power supply and the one or more loads 2340 to 2340-n to the at least one of the voltage reference and the current reference to produce the analog signal.

Figure 24:
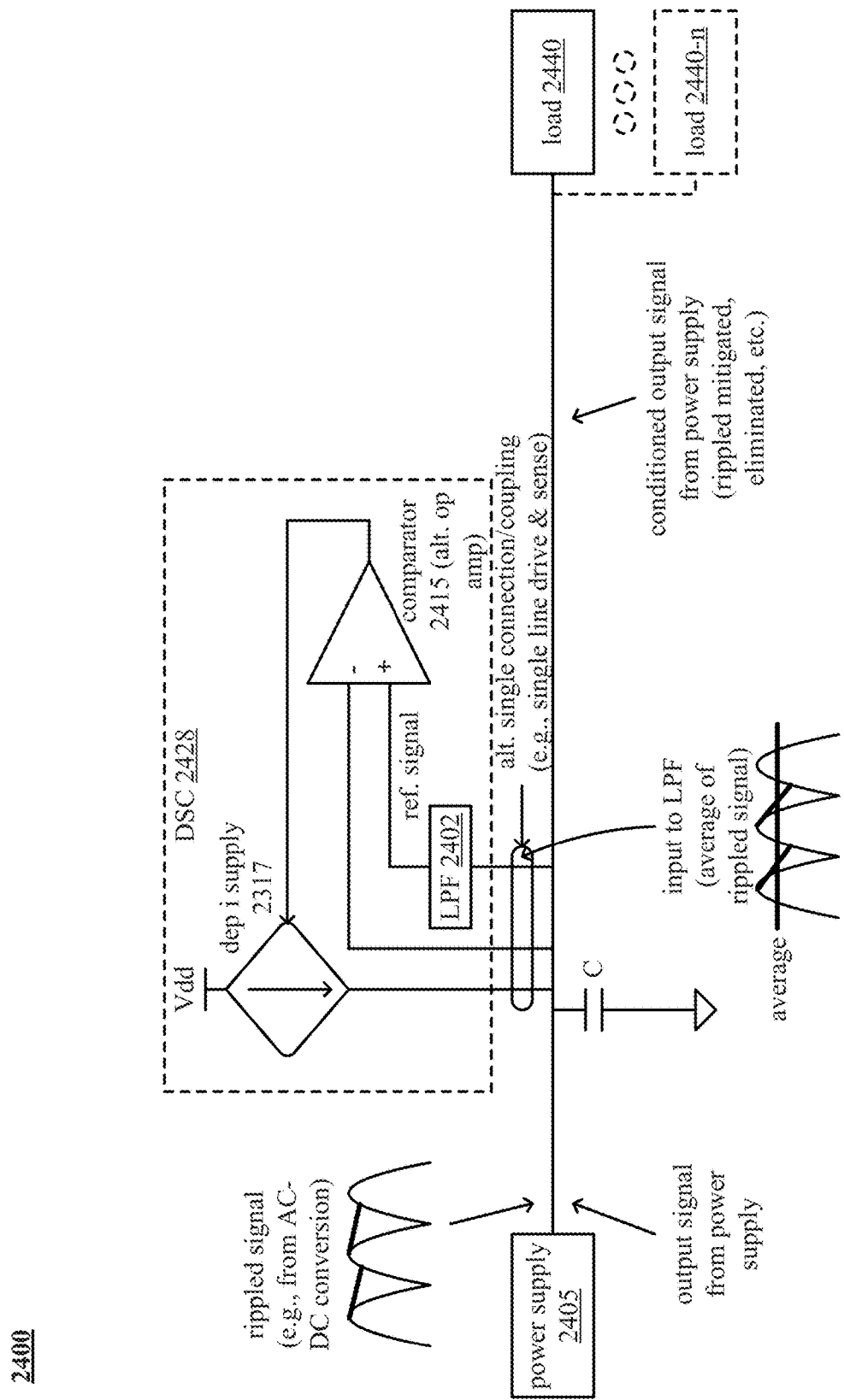
FIG. 24 is a schematic block diagram of another embodiment of a DSC configured to perform power supply signal conditioning in accordance with the present invention.

FIG. 24 is a schematic block diagram of another embodiment 2400 of a DSC configured to perform power supply signal conditioning in accordance with the present invention. This diagram is very similar to the prior diagram with at least one difference being that the output from the comparator 2415 is fed directly to the dependent current supply 2317 without passing through a feedback path that includes an ADC and a DAC. Note that there may be some implementations in which a digital signal that is representative of any deleterious effects of the power supply signal is not needed or wanted. In such examples, note that the output from the comparator 2415 is the signal that controls the dependent current supply 2317.

FIG. 25A is a schematic block diagram of an embodiment of a method 2501 for execution by one or more devices in accordance with the present invention. The method 2501 operates in step 2510 by outputting, from a power supply operably coupled to one or more loads, a power supply signal having a DC (direct current) voltage component and a ripple voltage component that is based on conversion of an AC (alternating current) signal in accordance with generating the power supply signal.

Via a drive-sense circuit (DSC) operably coupled to the power supply, the method 2501 also operates in step 2520 by simultaneously sensing the power supply signal and, based on the sensing of the power supply signal, adaptively processing the power supply signal in accordance with reducing or eliminating the ripple voltage component of the power supply signal to generate a conditioned power supply signal to service the one or more loads.

FIG. 25B is a schematic block diagram of an embodiment of a method 2502 for execution by one or more devices in accordance with the present invention. The method 2502 operates in step 2511 by outputting, from a power supply operably coupled to one or more loads, a power supply signal having a DC voltage component and a ripple voltage component that is based on conversion of an AC signal in accordance with generating the power supply signal.

Via a drive-sense circuit (DSC) operably coupled to the power supply, the method 2502 also operates in step 2521 by simultaneously sensing the power supply signal and adaptively injecting a current signal that is based on the sensing of the power supply signal into the power supply signal in accordance with reducing or eliminating the ripple voltage component of the power supply signal to generate the conditioned power supply signal to service the one or more loads.

In some examples, the DSC also includes a low pass filter (LPF) configured to process the power supply signal to generate an LPF signal, a comparator configured to compare the LPF signal to the power supply signal to produce an analog comparator output signal, and a current supply circuit configured adaptively, based on the analog comparator output signal, to inject the current signal that is based on the sensing of the power supply signal into the power supply signal.

In other examples, the DSC includes a low pass filter (LPF) configured to process the power supply signal to generate an LPF signal, a comparator configured to compare the LPF signal to the power supply signal to produce an analog comparator output signal, an analog to digital converter (ADC) configured to process the analog comparator output signal to generate a digital comparator output signal that is representative of the ripple voltage component of the power supply signal, a digital to analog converter (DAC) configured to process the analog comparator output signal to generate another analog comparator output signal, and a current supply circuit that is configured adaptively, based on the another analog comparator output signal, to inject the current signal that is based on the sensing of the power supply signal into the power supply signal.

Note also that the DSC may be operably coupled via a single line to a connection between the power supply and the one or more loads. In such examples, a variant of the method 2501 and/or the method 2502 also includes, via the DSC, simultaneously sensing the power supply signal and, based on the sensing of the power supply signal, adaptively injecting the current signal that is based on the sensing of the power supply signal into the power supply signal via the single line.

Note that the power supply of the method 2501 and/or the method 2502 may be of any of a variety of types include any one or more of a half-wave bridge rectifier circuit, a full-wave bridge rectifier circuit, or a switched mode power supply.

In some specific examples, note that the DSC includes a power source circuit operably coupled via a single line to a connection between the power supply and the one or more loads. When enabled, the power source circuit is configured adaptively to inject an analog signal into the power supply signal in accordance with reducing or eliminating the ripple voltage component of the power supply signal to generate the conditioned power supply signal to service the one or more loads. The analog signal includes at least one of a DC (direct current) component or an oscillating component. Also, a power signal change detection circuit operably coupled to the power source circuit. When enabled, the power signal change detection circuit is configured to detect an effect on the analog signal that is based on an electrical characteristic of at least one of the power supply and the one or more loads, and to generate a digital signal that is representative of the ripple voltage component of the power supply signal.

The power source circuit also includes a power source to source at least one of a voltage or a current via the single line to the connection between the power supply and the one or more loads. Also, the power signal change detection circuit includes a power source reference circuit configured to provide at least one of a voltage reference or a current reference, and a comparator configured to compare the at least one of the voltage and the current provided via the single line to the connection between the power supply and the one or more loads to the at least one of the voltage reference and the current reference to produce the analog signal.

Figure 26A:
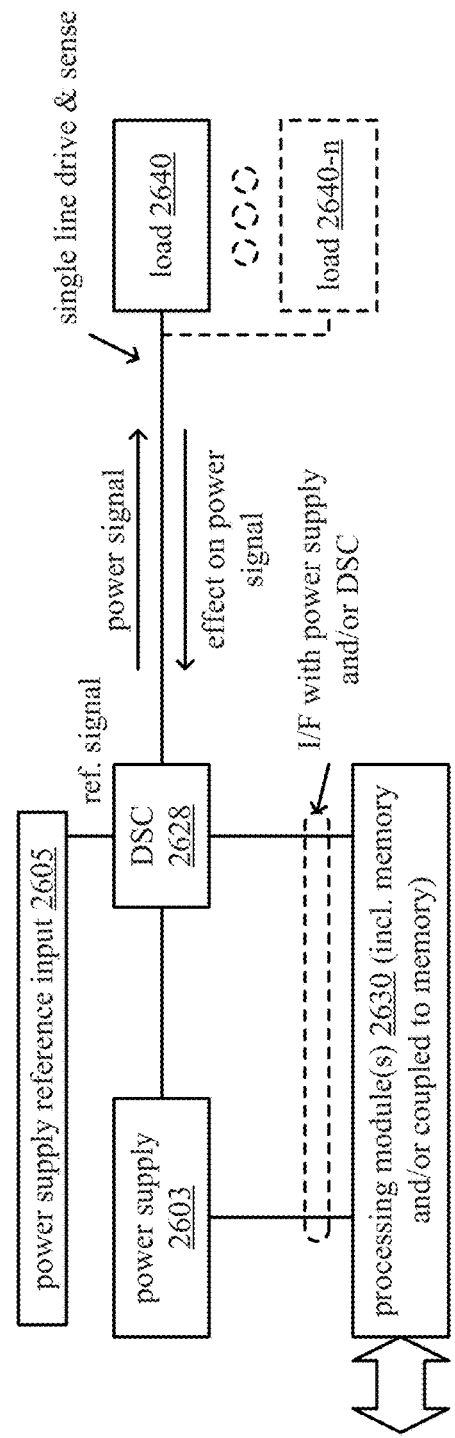
FIG. 26A is a schematic block diagram of an embodiment of power supply adaptation using a DSC in accordance with the present invention.

FIG. 26A is a schematic block diagram of an embodiment 2601 of power supply adaptation using a DSC in accordance with the present invention. In this diagram, one or more processing modules 2630 interface and communicate with a power supply 2603 and a DSC 2628. The power supply reference input 2605 is provided to the DSC 2628. In some examples, one or more processing modules 2630 is configured to provide the power supply reference input 2605. In other examples, one or more other devices is implemented to provide the power supply reference input 2605.

Based on a reference signal provided from the power supply reference input 2605, the DSC 2628 is configured to generate a power signal to be provided to one or more loads 2640 to 2640-$n$ based on power that is provided from the power supply 2603. The DSC 2628 is configured to regulate a signal from a power supply to the one or more loads 2640 to 2640-$n$. In some examples, the DSC 2628 is configured to provide the power signal to the one or more loads 2640 to 2640-$n$ via a single line on which simultaneous driving and sensing performed by the DSC 2628.

In some examples, the one or more processing modules 2630 is configured to interface with one or both of the power supply 2603 and the DSC 2628. The one or more processing modules 2630 is configured to monitor one or both of the power supply 2603 and the DSC 2628. Also, in some examples, the one or more processing modules 2630 is configured to receive information from one or both of the power supply 2603 and the DSC 2628. Also, in some examples, the one or more processing modules 2630 is configured to direct operation of one or both of the power supply 2603 and the DSC 2628. This diagram shows one possible implementation by which one or more processing modules 2630 is configured to interact with an interface with a power supply 2603 and a DSC 2628 in a manner by which a controlled power signal may be provided to the one or more loads 2640 to 2640-$n$. Note also that the DSC is configured to perform monitoring and detection of power signal in any effect on the power signal from any of the one or more loads 2640 to 2640-$n$, the power supply 2603 itself, and/or any other element or component that produces any effect on the power signal that is electrically coupled into the power signal. The one or more processing modules 2630 is configured to adapt operation of one or both of the power supply 2603 and the DSC 2628.

For example, in accordance with power supply adaptation in this diagram (e.g., and other in which power supply adaptation is performed), the power supply operation itself is modified. In an example of operation and implementation, when it is determined that more power is needed from the power supply (e.g., based on increased one or more loads), then the power supply is directed to adapt the output power upwards (e.g., increase the output power appropriately) while maintaining the same voltage to ensure that the requisite amount of power is being provided to service the one or more loads. Alternatively, when it is determined that lees power may be adequate from the power supply (e.g., based on decreased one or more loads), then the power supply is directed to adapt the output power (e.g., decrease the output power appropriately) while maintaining the same voltage while still ensuring that the requisite amount of power is being provided to service the one or more loads. Generally speaking, in such embodiments in which power supply adaptation may be performed, the power supply itself is an adaptable and configurable device whose operation may be modified.

Similarly, in accordance with DSC adaptation in this diagram (e.g., and other in which DSC adaptation is performed), the DSC operation itself is modified. The operation of various components within the DSC (e.g., the power output there from, the reference signal used including its magnitude, type, characteristics, parameters, frequency, phase, etc., and/or other components) may be may be adapted based on such considerations as increased one or more loads, decreased one or more loads, etc.

Generally speaking, the one or more processing modules 2630 is configured to process the information received from the power supply 2603 and/or the DSC 2628 to determine any adaptation that is to be performed by any of the power supply 2603 and/or the DSC 2628 in accordance with power supply signal conditioning of a power signal from the power supply 2603 to the one or more loads 2640 to 2640-$n$. Based on the determination by the one or more processing modules 2630 to perform such adaptation to ensure an effectively regulated and conditioned power signal, the one or more processing modules 2630 directs the control and/or adaptation of one or more of the appropriate components.

Figure 26B:
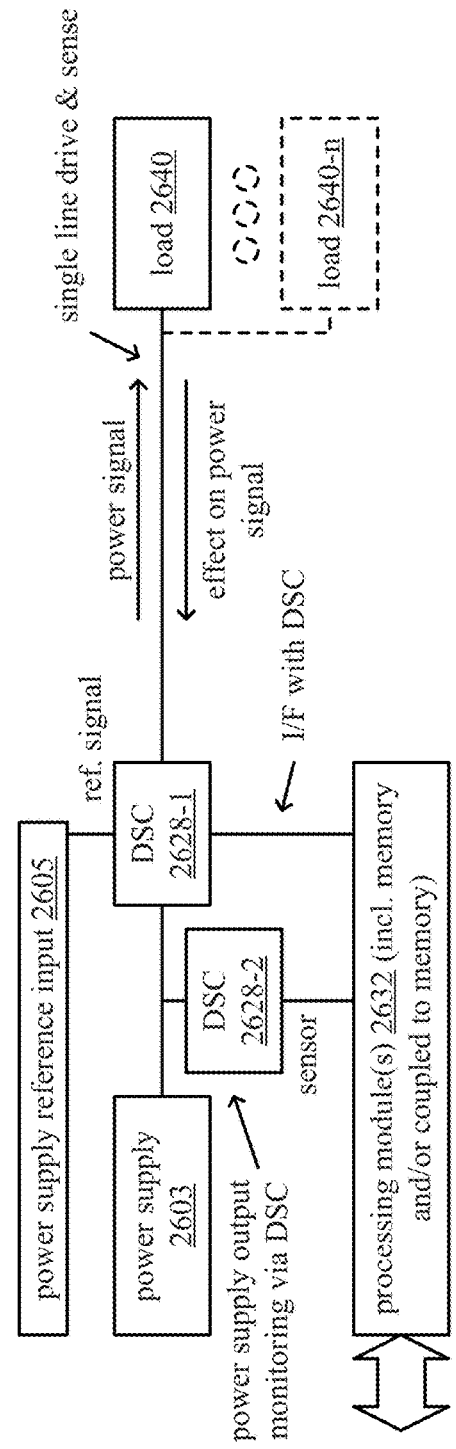
FIG. 26B is a schematic block diagram of an embodiment of power supply adaptation using DSCs in accordance with the present invention.

FIG. 26B is a schematic block diagram of an embodiment 2602 of power supply adaptation using DSCs in accordance with the present invention. In this diagram, one or more processing modules 2632 interface and communicate with the DSC 2628-1 and a DSC 2628-2. The power supply reference input 2605 is provided to the DSC 2628-1. In some examples, one or more processing modules 2632 is configured to provide the power supply reference input 2605. In other examples, one or more other devices is implemented to provide the power supply reference input 2605.

Based on a reference signal provided from the power supply reference input 2605, the DSC 2628-1 is configured to generate a power signal to be provided to one or more loads 2640 to 2640-$n$ based on power that is provided from the power supply 2603. The DSC 2628-1 is configured to regulate a signal from the power supply 2603 to the one or more loads 2640 to 2640-$n$. In some examples, the DSC 2628 is configured to provide the power signal to the one or more loads 2640 to 2640-n via a single line on which simultaneous driving and sensing performed by the DSC 2628.

In addition, note that many other implementations, embodiments, examples, variations, etc. described herein include a DSC that is configured to provide a power signal to one or more loads via a single line, such as shown in this diagram with respect to the one or more loads 2640 to 2640. With respect to such a single line coupling or connecting at the DSC with respect to this diagram or any other herein within which a DSC is coupled or connected to one or more loads, note that there may be different couplings or connections downstream from the DSC that provide coupling or connectivity among the various one or more loads, yet a single line couples or connects to the DSC itself via which simultaneous transmit and receive operations are performed and/or simultaneous drive and sense operations are performed. Any such DSC that is coupled or connected to one or more other elements via a single line is configured simultaneously to perform providing of the power signal and sensing of that power signal via the single line.

In addition, in this diagram, the DSC 2628-2 is configured to perform power supply output monitoring. The DSC 2628-2 is configured to sense the output signal from the power supply 2603 that is used to power the DSC 2628-1. The one or more processing modules 2632 is configured to interface and communicate with both the DSC 2628-1 and the DSC 2628-2. Based on information related to the sensing of the power supply output signal from the power supply 2603 that is provided to the one or more processing modules 2632 via the DSC 2628-2, one or more processing modules 2632 is configured to adapt operation of the DSC 2628-1 in accordance with regulation of a signal from the power supply 2603 to the one or more loads 2640 to 2640-n.

In this diagram, monitoring of the power supply output signal is performed using the DSC 2628-2, and the one or more processing modules 2632 is configured to generate one or more control signals to direct operation of the DSC 2628-1 based on the power supply monitoring. In some examples, the one or more processing modules 2632 is configured to direct the DSC 2620-1 to counter any variation of the power supply output signal provided from the power supply 2603 to ensure proper regulation of the signal from the power supply 2603 to the one or more loads 2640 to 2640-n.

Generally speaking, the one or more processing modules 2632 is configured to process the information received from the power supply 2603, the DSC 2628-1, and/or the DSC 2628-2 to determine any adaptation that is to be performed by any of the power supply 2603, the DSC 2628-1, and/or the DSC 2628-2 in accordance with power supply signal conditioning of a power signal from the power supply 2603 to the one or more loads 2640 to 2640-n. Based on the determination by the one or more processing modules 2632 to perform such adaptation to ensure an effectively regulated and conditioned power signal, the one or more processing modules 2632 directs the control and/or adaptation of one or more of the appropriate components. Based on the determination by the one or more processing modules 2632 to perform such adaptation to ensure an effectively regulated and conditioned power signal, the one or more processing modules 2632 directs the control and/or adaptation of one or more of the appropriate components.

FIG. 27A is a schematic block diagram of another embodiment 2701 of power supply adaptation using a DSC in accordance with the present invention. In this diagram, one or more processing modules 2730 interface and communicate with a power supply 2703 and a DSC 2728. In addition, in this diagram, the DSC 2728 is configured to perform power supply output monitoring. The DSC 2728 is configured to sense the output signal from the power supply 2703 that is used to service the one or more loads 2740 to 2740-n. The one or more processing modules 2730 is configured to interface and communicate with both the power supply 2703 and the DSC 2728. Based on information related to the sensing of the power supply output signal from the power supply 2703 that is provided to the one or more processing modules 2730 via the DSC 2728, one or more processing modules 2730 is configured to adapt operation of the power supply in accordance with regulation of a signal from the power supply 2703 to the one or more loads 2740 to 2740-n.

This diagram shows one possible example by which control signaling is provided from the one or more processing models 2730 to modify and adapt operation of the power supply 2703 based on power supply monitoring. Adaptation of the operation of the power supply is performed based on the sensing of the power supply output signal from the power supply 2703 via the DSC 2728.

In one implementation of this diagram, the DSC 2728 operates as a sensor of the power supply output signal from the power supply 2703, and the one or more processing modules 2730 is configured to adapt operation of the power supply 2703 to ensure and effectively regulated signal is provided from the power supply 2703 to the one or more loads 2740 to 2740-n. In another implementation of this diagram, the DSC 2728 operates as a both sensor of the power supply output signal from the power supply 2703 and also as a means via which modification of the power supply output signal is made based on the direction and control of the one or more processing modules 2730. For example, in such an implementation, the one or more processing models 2730 is configured to interact with the DSC 2728 to modify the power supply output signal from the power supply 2703 in addition to sensing of the power supply output signal from the house by 2703.

Generally speaking, the one or more processing modules 2730 is configured to process the information received from the power supply 2703 and/or the DSC 2728 to determine any adaptation that is to be performed by the power supply 2703 and/or the DSC 2728 in accordance with power supply signal conditioning of a power signal from the power supply 2703 to the one or more loads 2740 to 2740-n. Based on the determination by the one or more processing modules 2730 to perform such adaptation to ensure an effectively regulated and conditioned power signal, the one or more processing modules 2730 directs the control and/or adaptation of one or more of the appropriate components.

FIG. 27B is a schematic block diagram of another embodiment 2702 of power supply adaptation using DSCs in accordance with the present invention. In this diagram, one or more processing modules 2730 interface and communicate with a power supply 2703, a DSC 2738-1, and a DSC 2728-2. A power supply reference input 2705 is provided to the DSC 2728-1. In some examples, one or more processing modules 2730 is configured to provide the power supply reference input 2705. In other examples, one or more other devices is implemented to provide the power supply reference input 2705.

Based on a reference signal provided from the power supply reference input 2705, the DSC 2728-1 is configured to generate a power signal to be provided to one or more loads 2740 to 2740-n based on power that is provided from the power supply 2703. The DSC 2728-1 is configured to regulate a signal from the power supply 2703 to the one or more loads 2740 to 2740-*n*. In some examples, the DSC 2728 is configured to provide the power signal to the one or more loads 2740 to 2740-*n* via a single line on which simultaneous driving and sensing performed by the DSC 2728.

In addition, in this diagram, the DSC 2728-2 is configured to perform power supply output monitoring. The DSC 2728-2 is configured to sense the output signal from the power supply 2703 that is used to service the one or more loads 2740 to 2740-*n*. The one or more processing modules 2730 is configured to interface and communicate with both the power supply 2703 and the DSC 2728-2 as well as with the DSC 2728-1. Based on information related to the sensing of the power supply output signal from the power supply 2703 that is provided to the one or more processing modules 2730 via the DSC 2728-2, the one or more processing modules 2730 is configured to adapt operation of the power supply in accordance with regulation of a signal from the power supply 2703 to the one or more loads 2740 to 2740-*n*.

Note that the one or more processing modules 2732 is configured to receive information from and provide information to any one or more of the power supply 2703, the DSC 2728-1, and the DSC 2728-2. The one or more processing modules 2732 is configured to direct operation of any one or more of the power supply 2703, the DSC 2728-1, and the DSC 2728-2 based on information that is provided to it from any one of these components. The one or more processing modules 2732 is configured to perform adaptation of any one or more of the power supply 2703, the DSC 2728-1, and the DSC 2728-2 in accordance with providing a regulated signal from the power supply 2703 to the one or more loads 2740 to 2740-*n*.

Generally speaking, the one or more processing modules 2732 is configured to process the information received from the power supply 2703, the DSC 2728-1, and/or the DSC 2728-2 to determine any adaptation that is to be performed by any of the power supply 2703, the DSC 2728-1, and/or the DSC 2728-2 in accordance with power supply signal conditioning of a power signal from the power supply 2703 to the one or more loads 2740 to 2740-*n*. Based on the determination by the one or more processing modules 2732 to perform such adaptation to ensure an effectively regulated and conditioned power signal, the one or more processing modules 2732 directs the control and/or adaptation of one or more of the appropriate components.

Figure 28A:
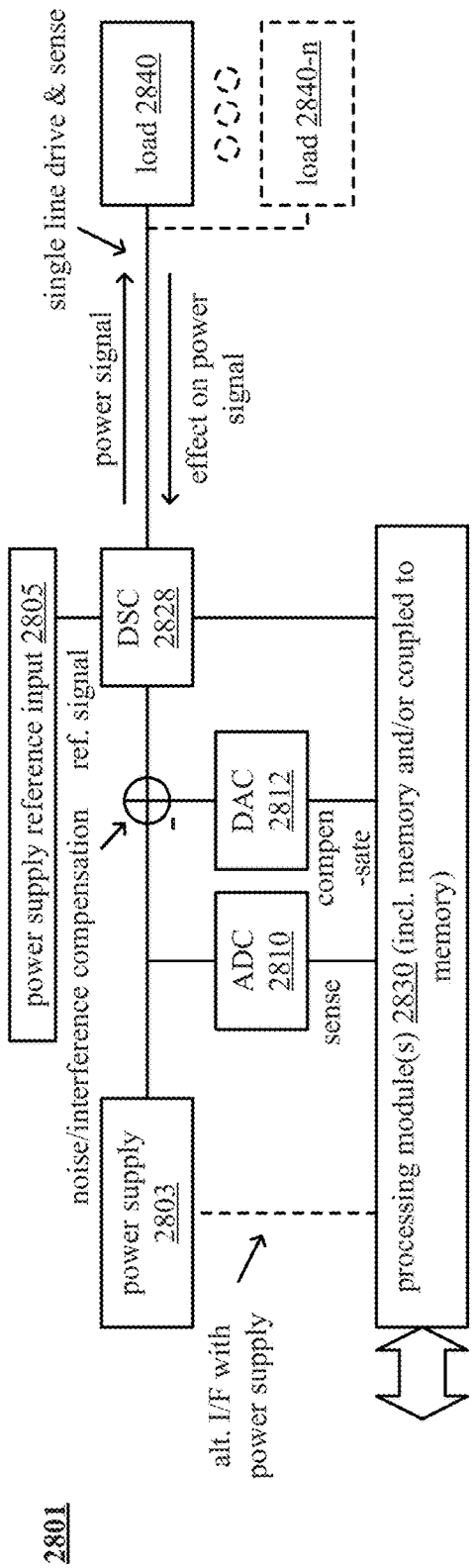
FIG. 28A is a schematic block diagram of another embodiment of power supply adaptation using a DSC in accordance with the present invention.

FIG. 28A is a schematic block diagram of another embodiment 2801 of power supply adaptation using a DSC in accordance with the present invention. In this diagram, one or more processing modules 2830 interface and communicate with a power supply 2803, an analog to digital converter (ADC) 2810, a digital to analog converter (DAC) 2812, and a DSC 2828. A power supply reference input 2805 is provided to the DSC 2828. In some examples, one or more processing modules 2830 is configured to provide the power supply reference input 2805. In other examples, one or more other devices is implemented to provide the power supply reference input 2805.

Based on a reference signal provided from the power supply reference input 2805, the DSC 2828 is configured to generate a power signal to be provided to one or more loads 2840 to 2840-*n* based on power that is provided from the power supply 2803. The DSC 2828 is configured to regulate a signal from the power supply 2803 to the one or more loads 2840 to 2840-*n*. In some examples, the DSC 2828 is configured to provide the power signal to the one or more loads 2840 to 2840-*n* via a single line on which simultaneous driving and sensing performed by the DSC 2828.

In this diagram, the one or more processing modules 2830 receives digital information corresponding to the output signal from the power supply 2803 via the ADC 2810. The one or more processing modules 2830 is configured to process the digital information corresponding to the output signal from the power supply 2803 that is received via the ADC 2810 to determine what possible modifications, compensations, processing, etc. may be appropriate to perform to the output signal from the power supply 2803 (e.g., based on comparison of the output signal from the power supply 2903 to or more output signal parameters, considerations, etc.). When such modification, compensation, processing, etc., is determined to be appropriate (e.g., based on an unfavorable comparison of the output signal from the power supply 2803 to or more output signal parameters, considerations, etc.), the one or more processing modules 2830 is configured to generate a digital signal that is provided to the DAC 2812 to direct to the DAC 2812 to generate an analog signal to be combined with the output signal from the power supply 2803. The combination of the analog signal from the DAC 2812 with the output signal from the power supply 2803 is configured to compensate for any deleterious effects within the output signal from the power supply 2803 in accordance with regulation of a signal from the power supply 2803 to the one or more loads 2840 to 2840-*n*. In some embodiments, alternatively to or in combination with the operations associated with the DAC 2812, the one or more processing modules 2830 is configured to modify operation of the DSC 2828 in accordance with regulation of a signal from the power supply 2803 to the one or more loads 2840 to 2840-*n*.

With respect to FIG. 28A, monitoring of the output signal from the power supply 2803 is performed using an ADC 2810. As may be determined based on processing of input signals received by the one or more processing modules 2830, power supply output signal adaptation is performed using one or both of the DAC 2812 and the DSC 2828. From certain perspectives, this diagram shows an example by which noise and/or interference subtraction from the output signal the power supply is performed using the one or more processing modules 2830, the ADC 2810, and the DAC 2812. In some alternative examples, such noise and/or interference subtraction from the output signal the power supply is performed using the one or more processing modules 2830, the ADC 2810, and one of both of the DAC 2812 and the DSC 2828.

Generally speaking, the one or more processing modules 2830 is configured to process the information received from the ADC 2810 and/or the DSC 2828-1 to determine any adaptation that is to be performed by any of the power supply 2803, the DAC 2812, and/or the DSC 2828 in accordance with power supply signal conditioning of a power signal from the power supply 2803 to the one or more loads 2840 to 2840-*n*. Based on the determination by the one or more processing modules 2830 to perform such adaptation to ensure an effectively regulated and conditioned power signal, the one or more processing modules 2830 directs the control and/or adaptation of one or more of the appropriate components.

Figure 28B:
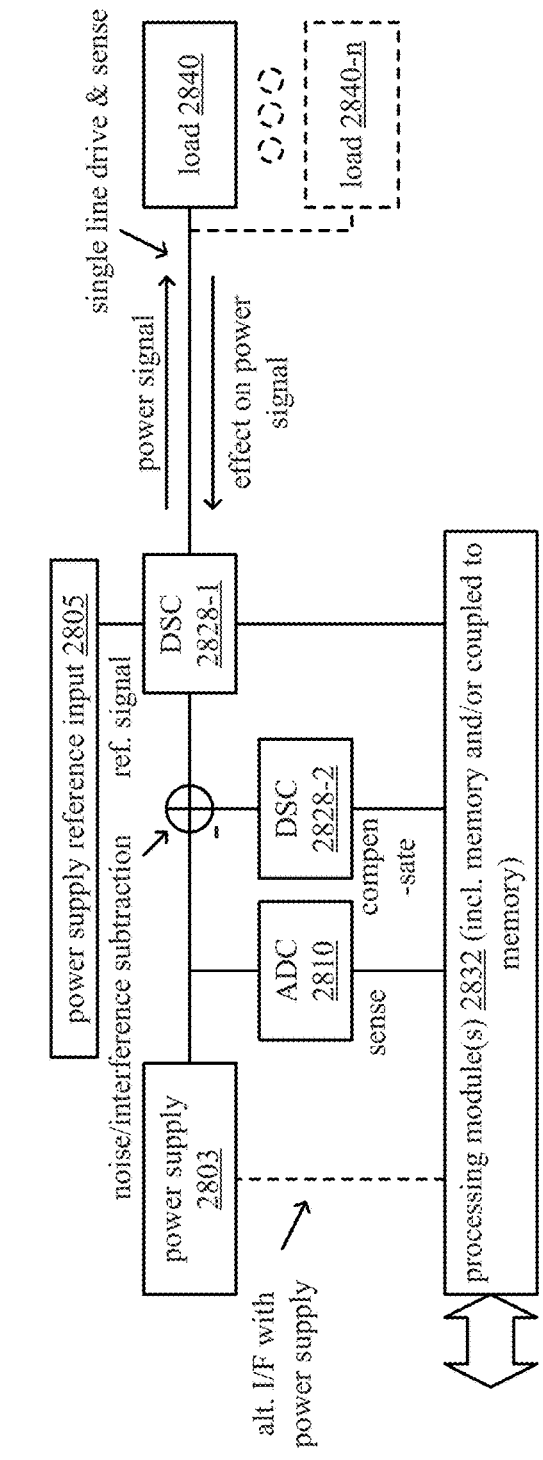
FIG. 28B is a schematic block diagram of another embodiment of power supply adaptation using DSCs in accordance with the present invention.

FIG. 28B is a schematic block diagram of another embodiment 2802 of power supply adaptation using DSCs in accordance with the present invention. In this diagram, one or more processing modules 2830 interface and communicate with a power supply 2803, an analog to digital converter (ADC) 2810, a DSC 2828-1, and a DSC 2828-2.

A power supply reference input 2805 is provided to the DSC 2828. In some examples, one or more processing modules 2830 is configured to provide the power supply reference input 2805. In other examples, one or more other devices is implemented to provide the power supply reference input 2805.

Based on a reference signal provided from the power supply reference input 2805, the DSC 2828-1 is configured to generate a power signal to be provided to one or more loads 2840 to 2840-n based on power that is provided from the power supply 2803. The DSC 2828-2 is configured to regulate a signal from the power supply 2803 to the one or more loads 2840 to 2840-n. In some examples, the DSC 2828-1 is configured to provide the power signal to the one or more loads 2840 to 2840-n via a single line on which simultaneous driving and sensing performed by the DSC 2828-1.

In this diagram, the one or more processing modules 2830 receives digital information corresponding to the output signal from the power supply 2803 via the ADC 2810. The one or more processing modules 2830 is configured to process the digital information corresponding to the output signal from the power supply 2803 that is received via the ADC 2810 to determine what possible modifications, compensations, processing, etc. may be appropriate to perform to the output signal from the power supply 2803 (e.g., based on comparison of the output signal from the power supply 2903 to or more output signal parameters, considerations, etc.). When such modification, compensation, processing, etc., is determined to be appropriate (e.g., based on an unfavorable comparison of the output signal from the power supply 2803 to or more output signal parameters, considerations, etc.), the one or more processing modules 2830 is configured to direct to the DSC 2828-2 to drive another analog signal into the output signal of the power supply 2003 in accordance with regulation of a signal from the power supply 2803 to the one or more loads 2840 to 2840-n. For example, in some embodiments, the one or more processing modules 2832 is configured to direct the DSC 2828-2 to drive a signal to be combined with the output signal from the power supply 2803 to ensure that a regulated signal is provided to the DSC 2828-1.

The combination of the analog signal from the DSC 2828-2 with the output signal from the power supply 2803 is configured to compensate for any deleterious effects within the output signal from the power supply 2803 in accordance with regulation of a signal from the power supply 2803 to the one or more loads 2840 to 2840-n. In some embodiments, alternatively to or in combination with the operations associated with the DAC 2812-2, the one or more processing modules 2830 is configured to modify operation of the DSC 2828-1 in accordance with regulation of a signal from the power supply 2803 to the one or more loads 2840 to 2840-n.

With respect to FIG. 28B, monitoring of the output signal from the power supply 2803 is also performed using an ADC 2810. As may be determined based on processing of input signals received by the one or more processing modules 2830, power supply output signal adaptation is performed using one or both of the DSC 2828-2 and the DSC 2828-2. From certain perspectives, this diagram shows an example by which noise and/or interference subtraction from the output signal the power supply is performed using the one or more processing modules 2830, the ADC 2810, and the DSC 2828-2. In some alternative examples, such noise and/or interference subtraction from the output signal the power supply is performed using the one or more processing modules 2830, the ADC 2810, and one of both of the DSC 2828-2 and the DSC 2828-1.

In addition, with respect to either of the FIG. 28A and the FIG. 28B, note that communication and interfacing may be implemented between the one or more processing modules 2830 in the power supply 2803 as well. In some examples, the one or more processing modules 2830 is also configured to adapt operation of the power supply 2803 based on information it receives via sensing via one or more of the DSCs implemented therein. In addition, and some examples, the one or more processing modules 2830 is also configured to receive information from the power supply 2803 and to use it to adapt operation of the power supply 2803 and/or any of the one or more of the DSCs implemented therein.

Generally speaking, the one or more processing modules 2832 is configured to process the information received from the ADC 2810 and/or the DSC 2828-1 to determine any adaptation that is to be performed by any of the power supply 2803 and/or the DSCs 2828-1 and/or 2828-2 in accordance with power supply signal conditioning of a power signal from the power supply 2803 to the one or more loads 2840 to 2840-n. Based on the determination by the one or more processing modules 2832 to perform such adaptation to ensure an effectively regulated and conditioned power signal, the one or more processing modules 2832 directs the control and/or adaptation of one or more of the appropriate components.

Figure 29A:
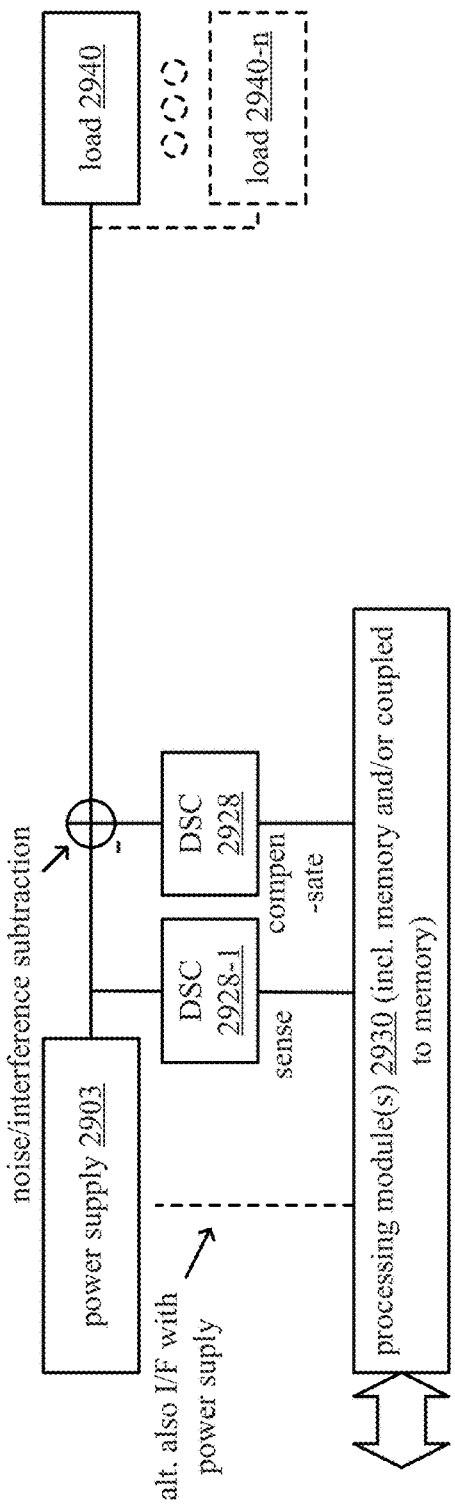
FIG. 29A is a schematic block diagram of another embodiment of power supply adaptation using DSCs in accordance with the present invention.

FIG. 29A is a schematic block diagram of another embodiment 2901 of power supply adaptation using DSCs in accordance with the present invention. In this diagram, one or more processing modules 2930 interface and communicate with a power supply 2903, a DSC 2928-1, and a DSC 2928. A power supply reference input 2905 is provided to the DSC 2928. In some examples, one or more processing modules 2930 is configured to provide the power supply reference input 2905. In other examples, one or more other devices is implemented to provide the power supply reference input 2905.

The power supply 2903 is configured to generate a power signal to be provided to one or more loads 2940 to 2940-n. In this diagram, the one or more processing modules 2930 receives information (e.g., digital and/or analog) corresponding to the output signal from the power supply 2903 via the ADC 2910. The one or more processing modules 2930 is configured to process the information corresponding to the output signal from the power supply 2903 to determine what possible modifications, compensations, processing, etc. may be appropriate to perform to the output signal from the power supply 2903 (e.g., based on comparison of the output signal from the power supply 2903 to or more output signal parameters, considerations, etc.). When such modification, compensation, processing, etc., is determined to be appropriate (e.g., based on an unfavorable comparison of the output signal from the power supply 2903 to or more output signal parameters, considerations, etc.), the one or more processing modules 2930 is configured to direct to the DSC 2928-1 to drive another analog signal into the output signal of the power supply 2003 in accordance with regulation of a signal from the power supply 2903 to the one or more loads 2940 to 2940-n. For example, in some embodiments, the one or more processing modules 2932 is configured to direct the DAC 2928-1 to drive a signal to be combined with the output signal from the power supply 2903 to ensure that a regulated signal is provided to the one or more loads 2940 to 2940-n.

With respect to FIG. 29A, monitoring of the output signal from the power supply 2903 is performed using a DSC 2928-1. As may be determined based on processing of input signals received by the one or more processing modules 2930, power supply output signal adaptation is performed using DSC 2928. From certain perspectives, this diagram shows an example by which noise and/or interference subtraction from the output signal the power supply is performed using the one or more processing modules 2930, the DSC 2928-1, and the DSC 2928.

Generally speaking, the one or more processing modules 2930 is configured to process the information received from the DSCs 2928-1 and/or 2928-2 to determine any adaptation that is to be performed by any of the power supply 2903 and/or the DSCs 2928-1 and/or 2928-2 in accordance with power supply signal conditioning of a power signal from the power supply 2903 to the one or more loads 2940 to 2940-$n$. Based on the determination by the one or more processing modules 2930 to perform such adaptation to ensure an effectively regulated and conditioned power signal, the one or more processing modules 2932 directs the control and/or adaptation of one or more of the appropriate components. Based on the determination by the one or more processing modules 293- to perform such adaptation to ensure an effectively regulated and conditioned power signal, the one or more processing modules 2930 directs the control and/or adaptation of one or more of the appropriate components.

Figure 29B:
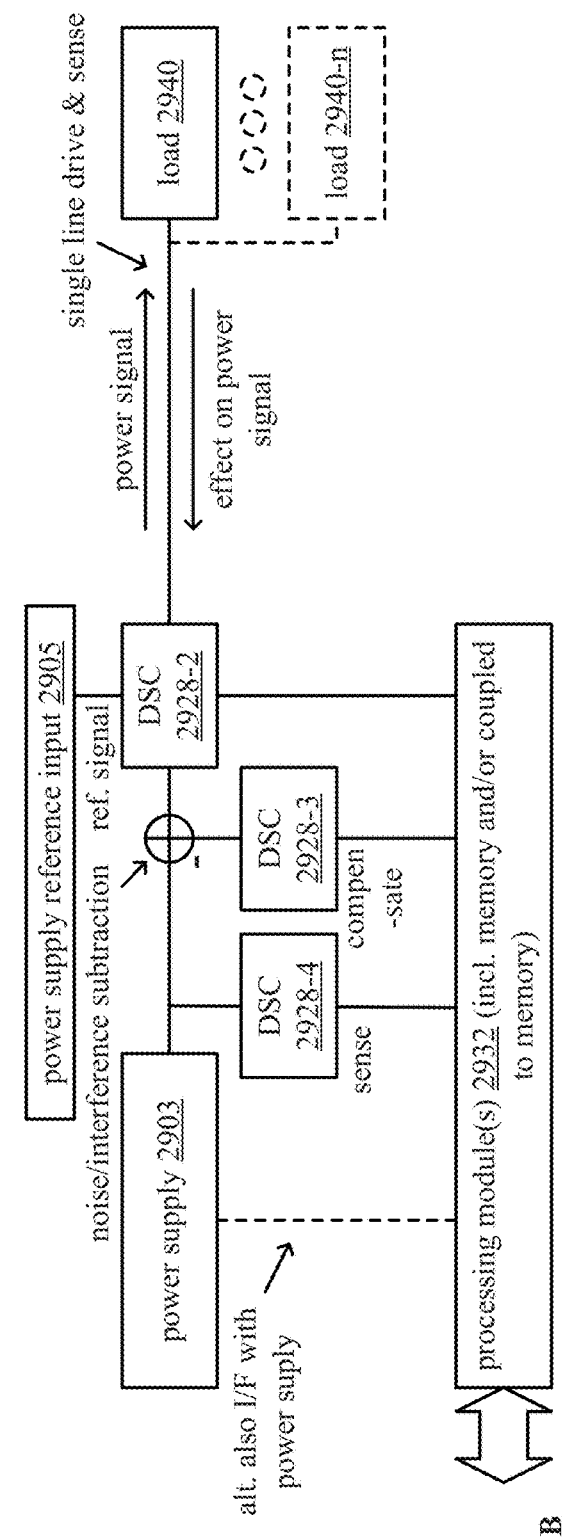
FIG. 29B is a schematic block diagram of another embodiment of power supply adaptation using DSCs in accordance with the present invention.

FIG. 29B is a schematic block diagram of another embodiment 2902 of power supply adaptation using DSCs in accordance with the present invention. In this diagram, one or more processing modules 2930 interface and communicate with a power supply 2903, a DSC 2928-4, a DSC 2928-3, and a DSC 2928-2. A power supply reference input 2905 is provided to the DSC 2928-2. In some examples, one or more processing modules 2930 is configured to provide the power supply reference input 2905. In other examples, one or more other devices is implemented to provide the power supply reference input 2905.

Based on a reference signal provided from the power supply reference input 2905, the DSC 2928-2 is configured to generate a power signal to be provided to one or more loads 2940 to 2940-$n$ based on power that is provided from the power supply 2903. The DSC 2928-2 is configured to regulate a signal from the power supply 2903 to the one or more loads 2940 to 2940-$n$. In some examples, the DSC 2928-2 is configured to provide the power signal to the one or more loads 2940 to 2940-$n$ via a single line on which simultaneous driving and sensing performed by the DSC 2928-2.

In this diagram, the one or more processing modules 2930 receives digital information corresponding to the output signal from the power supply 2903 via the DSC 2928-4. The one or more processing modules 2930 is configured to process the digital information corresponding to the output signal from the power supply 2903 that is received via the DSC 2928-4 to determine what possible modifications, compensations, processing, etc. may be appropriate to perform to the output signal from the power supply 2903 (e.g., based on comparison of the output signal from the power supply 2903 to or more output signal parameters, considerations, etc.). When such modification, compensation, processing, etc., is determined to be appropriate (e.g., based on an unfavorable comparison of the output signal from the power supply 2903 to or more output signal parameters, considerations, etc.), the one or more processing modules 2930 is configured to direct to the DSC 2928-3 to drive another analog signal into the output signal of the power supply 2003 in accordance with regulation of a signal from the power supply 2903 to the one or more loads 2940 to 2940-$n$. For example, in some embodiments, the one or more processing modules 2932 is configured to direct the DAC 2928-3 to drive a signal to be combined with the output signal from the power supply 2903 to ensure that a regulated signal is provided to the DSC 2928-1.

The combination of the analog signal from the DSC 2928-3 with the output signal from the power supply 2903 is configured to compensate for any deleterious effects within the output signal from the power supply 2903 in accordance with regulation of a signal from the power supply 2903 to the one or more loads 2940 to 2940-$n$. In some embodiments, alternatively to or in combination with the operations associated with the DAC 2912-2, the one or more processing modules 2930 is configured to modify operation of the DSC 2928-2 in accordance with regulation of a signal from the power supply 2903 to the one or more loads 2940 to 2940-$n$.

With respect to FIG. 29B, monitoring of the output signal from the power supply 2903 is also performed using a DSC 2928-4. As may be determined based on processing of input signals received by the one or more processing modules 2930, power supply output signal adaptation is performed using one or both of the DSC 2928-3 and the DSC 2928-2. From certain perspectives, this diagram shows an example by which noise and/or interference subtraction from the output signal the power supply is performed using the one or more processing modules 2930, the DSC 2928-4, the DSC 2928-3, and the DSC 2928-2. In some alternative examples, such noise and/or interference subtraction from the output signal the power supply is performed using the one or more processing modules 2930, the DSC 2928-4, and one of both of the DSC 2928-3 and the DSC 2928-2.

In addition, with respect to either of the FIG. 29A and the FIG. 29B, note that communication and interfacing may be implemented between the one or more processing modules 2930 in the power supply 2903 as well. In some examples, the one or more processing modules 2930 is also configured to adapt operation of the power supply 2903 based on information it receives via sensing via one or more of the DSCs implemented therein. In addition, and some examples, the one or more processing modules 2930 is also configured to receive information from the power supply 2903 and to use it to adapt operation of the power supply 2903 and/or any of the one or more of the DSCs implemented therein.

Generally speaking, the one or more processing modules 2932 is configured to process the information received from any one or more of the DSCs 2928-4, 2928-3, and/or 2928-2 to determine any adaptation that is to be performed by any of the power supply 2903 and/or the DSCs 2928-4, 2928-3, and/or 2928-2 in accordance with power supply signal conditioning of a power signal from the power supply 2903 to the one or more loads 2940 to 2940-$n$. Based on the determination by the one or more processing modules 2932 to perform such adaptation to ensure an effectively regulated and conditioned power signal, the one or more processing modules 2932 directs the control and/or adaptation of one or more of the appropriate components.

FIG. 30A is a schematic block diagram of another embodiment 3001 of power supply adaptation using a DSC in accordance with the present invention. In this diagram, a power supply reference input 3005 is provided to a DSC 3028. In some examples, one or more processing modules is configured to provide the power supply reference input

3005. In other examples, one or more other devices is implemented to provide the power supply reference input 3005.

Based on the reference signal provided from the power supply reference input 3005, the DSC 3028 is configured to generate a power signal to be provided to one or more loads 3040 to 3040-n based on power that is provided from a power supply 3003. The DSC 3028 is configured to regulate a signal from the power supply 3003 to the one or more loads 3040 to 3040-n. In some examples, the DSC 3028 is configured to provide the power signal to the one or more loads 3040 to 3040-n via a single line on which simultaneous driving and sensing performed by the DSC 3028.

In addition to receiving power signal from the power supply 3003, the DSC 3028 configured to process the power signal from the power supply 3003 and to generate a digital signal that is representative of any one or more effects of loading on the power supply signal from the power supply 3003 by the one or more loads 3040 to 3040-n. For example, depending upon the loading on the power supply signal from the power supply 3003 by the one or more loads 3040 to 3040-n, the power supply signal may suffer any one or more deleterious effects including those described herein.

The DSC 3028 is configured to process the power supply reference input 3005 and it generate the power signal to be provided to the one or more loads 3040 to 3040-n based on power that is provided from the power supply 3003. In some alternative embodiments, interfacing between the power supply 3005 and the power supply reference input 3005 is also performed implemented. In this diagram, a regulated power signal that is based on the power that is provided from the power supply 3003 is provided to the one or more loads 3040 to 3040-n via the DSC 3028.

FIG. 30B is a schematic block diagram of another embodiment 3002 of power supply adaptation using a DSC in accordance with the present invention. In this diagram, a power supply reference input 3005 is provided to a DSC 3028-1 via a reference generator 3017. The reference generator 3017 is configured to generate a reference signal for the DSC 3028-1 based on the power supply reference input 3005. In some examples, the reference generator 3017 is implemented as a voltage divider, such as might be implemented using two or more impedances, to generate the reference signal is provided to the DSC 3028-1. In other examples, the reference generator 3017 is implemented as a coupler that generates the reference signal based on the power supply reference input 3005. In some examples, one or more processing modules is configured to provide the power supply reference input 3005. In other examples, one or more other devices is implemented to provide the power supply reference input 3005.

Based on the reference signal provided from the power supply reference input 3005, the DSC 3028-1 is configured to generate a power signal to be provided to one or more loads 3040 to 3040-n based on power that is provided from a power supply 3003. The DSC 3028 is configured to regulate a signal from the power supply 3003 to the one or more loads 3040 to 3040-n. In some examples, the DSC 3028-1 is configured to provide the power signal to the one or more loads 3040 to 3040-n via a single line on which simultaneous driving and sensing performed by the DSC 3028-1.

In addition to receiving power signal from the power supply 3003, the DSC 3028 configured to process the power signal from the power supply 3003 and to generate a digital signal that is representative of any one or more effects of loading on the power supply signal from the power supply 3003 by the one or more loads 3040 to 3040-n. For example, depending upon the loading on the power supply signal from the power supply 3003 by the one or more loads 3040 to 3040-n, the power supply signal may suffer any one or more deleterious effects including those described herein.

The DSC 3028 is configured to process the power supply reference input 3005 and it generate the power signal to be provided to the one or more loads 3040 to 3040-n based on power that is provided from the power supply 3003. In some alternative embodiments, interfacing between the power supply 3005 and the power supply reference input 3005 is also performed implemented. In this diagram, a regulated power signal that is based on the power that is provided from the power supply 3003 is provided to the one or more loads 3040 to 3040-n via the DSC 3028.

In this diagram, a DSC 3028 includes a regulation circuit 3012 includes a feedback circuit 3013, a power source circuit 3010, and a comparator 3015. An analog signal output from the comparator 3015, when comparing the power signal that is provided from the power source circuit 3010 to the one or more loads 3040 to 3040-n and any effect thereof to the reference signal received from the reference generator 3017, is provided to the feedback circuit 3013 of the regulation circuit 3012. The regulation circuit 3012 provides a digital signal that is representative of the loading of the one or more loads 3040 to 3040-n to the power supply 3003. The power supply 3003 is configured to process the digital signal received from the regulation circuit 3012 to determine any adaptation to be performed in accordance with providing an output power supply signal from the power supply 3003 to the power source circuit 3010 of the DSC 3028-1. In some examples, the power supply 3003 includes one or more processing modules therein that are configured to process the digital signal received from the regulation circuit 3012 to determine any adaptation to be performed in accordance with providing an output power supply signal from the power supply 3003 to the power source circuit 3010 of the DSC 3028-1.

The analog signal output from the comparator 3015 is provided to the feedback circuit 3013 of the regulation circuit 3012 to generate a signal to be provided to the power source circuit 3010 to modify operation of the power source circuit 3010 to ensure that the power signal provided to the one or more loads 3040 to 3040-n is regulated to be same as the reference signal received by the comparator 3015 from the reference generator 3017.

Figure 31:
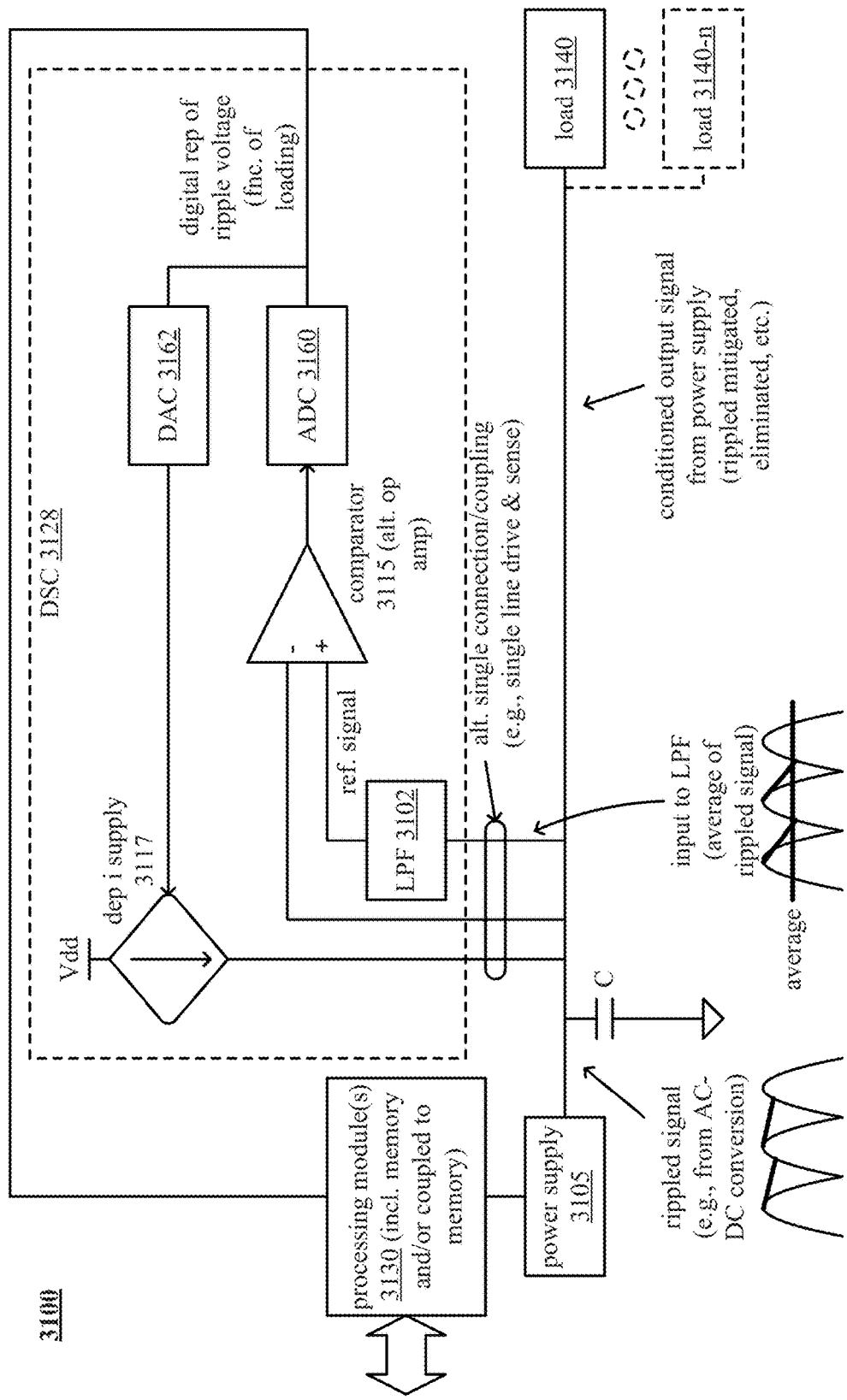
FIG. 31 is a schematic block diagram of another embodiment of power supply adaptation using a DSC in accordance with the present invention.

FIG. 31 is a schematic block diagram of another embodiment 3100 of power supply adaptation using a DSC in accordance with the present invention. In this diagram, a power supply 3105 provides a signal to one or more loads 3140 to 3140-n. A DSC 3128 is configured to perform monitoring of the power signal provided from the power supply 3105 and to perform one or both of injection of a signal into the power signal provided from the power supply 3105 and generation of a digital signal that is representative of any deleterious effects of the power signal provided from the power supply 3105. For example, the power signal provided from the power supply 3105 may be adversely affected due to certain operations performed by the power supply 3105 such as AC-DC conversion, rectification, etc. and may include a rippled signal. One or more processing modules 3130 is configured to receive the digital signal that is representative of any deleterious effects of the power signal provided from the power supply 3105 as has been generated by the DSC 3128.

The DSC 3128 includes a dependent current supply 3117. The dependent current supply 3117 is controlled by an output signal that is based on operation of a comparator 3115 that compares a reference signal to the output signal from the power supply 3105. As described previously, some signals output from power supplies may include one or more adverse effects, such as a ripple. In general, any deleterious effect on output signal from a power supply may be reduced or eliminated using the processing of a DSC 3128 and/or the one or more processing modules 3130 is configured to adapt operation of the power supply 3105 as described in this diagram.

A power supply 3105 outputs a signal and provides it to one or more loads 3140 to 3140-n. A filtering capacitor, C, may be implemented to filter the signal that is output from the power supply. The DSC 3128 is configured simultaneously to sense the signal output from the power supply and to modify the signal output from this power supply, as may be needed, to facilitate power supply signal conditioning. In some instances, the DSC 3128 interacts with a coupling or connection between the power supply 3105 and the one or more loads 3140 to 3140-n via multiple connection points. In other instances, the DSC 3128 interacts with a coupling or connection between the power supply 3105 and the one or more loads 3140 to 3140-n via a single connection/coupling. That is to say, in such an example, the DSC 3128 connects for couples to the coupling or connection between the power supply 3105 and the one or more loads 3140 to 3140-n via a single line. As described herein, any desired implementation of a DSC may be made such that the DSC is configured simultaneously to transmit and receive via a single line, or simultaneously to sense and drive a signal via the single line.

In an example of operation and implementation, the output signal from the power supply is passed through a low pass filter (LPF) 3102 that outputs a reference signal as one of the inputs to comparator 3115 of the DSC 3128. In addition, the output signal from the power supply itself is provided as the other input to the comparator 3115 of the DSC 3128. The comparator 3115 compares the reference signal and the output signal from the power supply to generate a signal that is provided to an ADC 3160 that processes that signal to generate a digital signal that is representative of any effect of the output signal from the power supply. For example, when the output signal from the power supply includes a ripple component, the digital signal output from the ADC 3160 includes a digital representation of that ripple voltage. As also described herein, note that the amount of ripple in the output signal from the power supply will be a function of the one or more loads 3140 to 3140-n.

In this diagram, the digital signal that is representative of the ripple voltage is passed through a DAC 3162 to generate an analog control signal that is provided to the dependent current supply 3117 that is configured to drive a current signal into the output signal from the power supply to reduce or eliminate any deleterious effect of the output signal from the power supply. For example, when the output signal from the power supply includes a ripple component, the dependent current supply 3117 is configured to drive the current into the output signal from the power supply to reduce or eliminate that ripple component and ensure a stable, regulated, etc. output signal from the power supply to be provided to the one or more loads 3140 to 3140-n.

In an example of operation and implementation, this diagram includes a power supply signal conditioning system as well as a power supply monitoring and sensing system that includes the power supply 3105, the DSC 3228, and the one or more processing modules 3130. The power supply 3105 is operably coupled to the one or more loads 3140 to 3140-n. Also, when enabled, the power supply is configured to output a power supply signal having a DC (direct current) voltage component and a ripple voltage component that is based on conversion of an AC (alternating current) signal in accordance with generating the power supply signal.

The DSC 3128 is operably coupled to the power supply 3105. When enabled, the DSC 3128 configured simultaneously to sense the power supply signal and, based on sensing of the power supply signal, adaptively to process the power supply signal in accordance with reducing or eliminating the ripple voltage component of the power supply signal to generate a conditioned power supply signal to service the one or more loads 3140 to 3140-n. In addition, when enabled, the DSC 3128 configured to generate a digital signal that is representative of any deleterious effects of the output signal from the power supply 3105 to be provided to the one or more processing modules 3130 is configured to perform appropriate adaptation of the operation of the power supply 3105 as well in accordance with reducing or eliminating the ripple voltage component of the power supply signal to generate the conditioned power supply signal to service the one or more loads 3140 to 3140-n.

Generally speaking, the one or more processing modules 3130 is configured to process the information received from the DSC 3128 to determine any adaptation that is to be performed by any of the power supply 3103 and/or the DSC 3128 that is the two or more cascaded DSCs that are implemented between the power supply 3103 and the one or more loads 3140 to 3140-n in accordance with multi-staged DSCs signal conditioning of a power signal from the power supply 3103 to the one or more loads 3140 to 3140-n.

Figure 32:
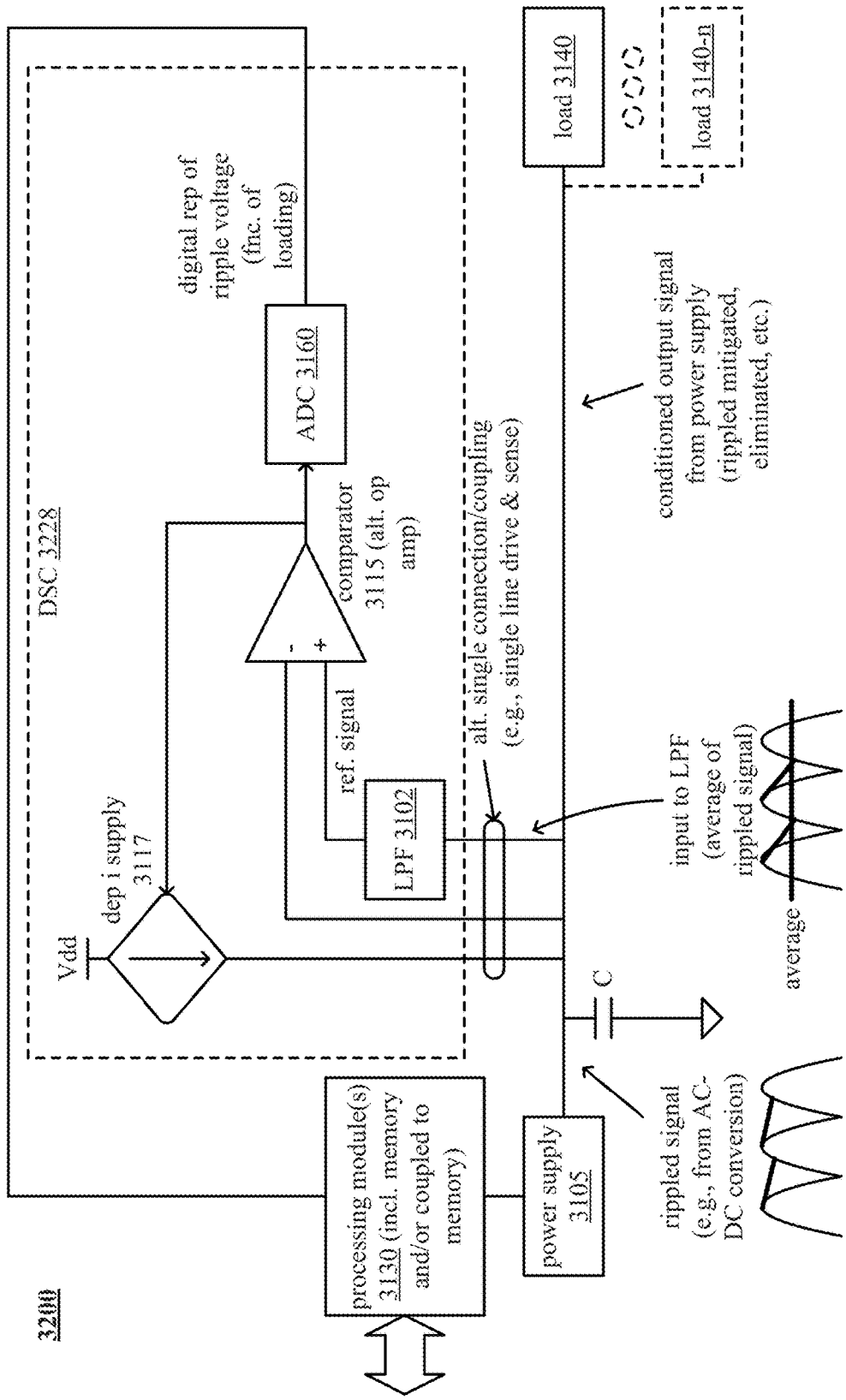
FIG. 32 is a schematic block diagram of another embodiment of power supply adaptation using a DSC in accordance with the present invention.

FIG. 32 is a schematic block diagram of another embodiment 3200 of power supply adaptation using a DSC in accordance with the present invention. This diagram is very similar to the prior diagram with at least one difference being that the output from the comparator 3115 is fed to the ADC 3160 and also is fed directly to the dependent current supply 3117 without passing through a feedback path that includes an ADC and a DAC. In such examples, note that the output from the comparator 3115 is the signal that controls the dependent current supply 3117.

FIG. 33 is a schematic block diagram of another embodiment of a method 3300 for execution by one or more devices in accordance with the present invention. The method 3300 operates in step 3310 by outputting, from a power supply operably coupled to one or more loads, a power supply signal having a DC (direct current) voltage component and a ripple voltage component that is based on conversion of an AC (alternating current) signal in accordance with generating the power supply signal.

In some alternative variants of the method 3300, via a drive-sense circuit (DSC) operably coupled to the power supply, the method 3300 operates in the optional step 3320 by simultaneously sensing the power supply signal and, based on the sensing of the power supply signal, adaptively processing the power supply signal in accordance with reducing or eliminating the ripple voltage component of the power supply signal to generate a conditioned power supply signal to service the one or more loads.

Also, in some other alternative variants of the method 3300, via a DSC operably coupled to the power supply, the method 3300 operates in step 3321 by simultaneously sensing the power supply signal and adaptively injecting a current signal that is based on the sensing of the power supply signal into the power supply signal in accordance with reducing or eliminating the ripple voltage component of the power supply signal to generate the conditioned power supply signal to service the one or more loads.

The method 3300 also operates in step 3330, via a DSC operably coupled to the power supply, by generating a digital signal that is representative of any non-uniformity of the power supply signal (e.g., ripple, harmonic glitches, voltage sag, etc.). The method 3300 also operates in step 3340 by adapting operation of the power supply, based on the digital signal, in accordance with reducing or eliminating the non-uniformity of the power supply signal to generate a conditioned power supply signal to service the one or more loads.

Figure 34A:
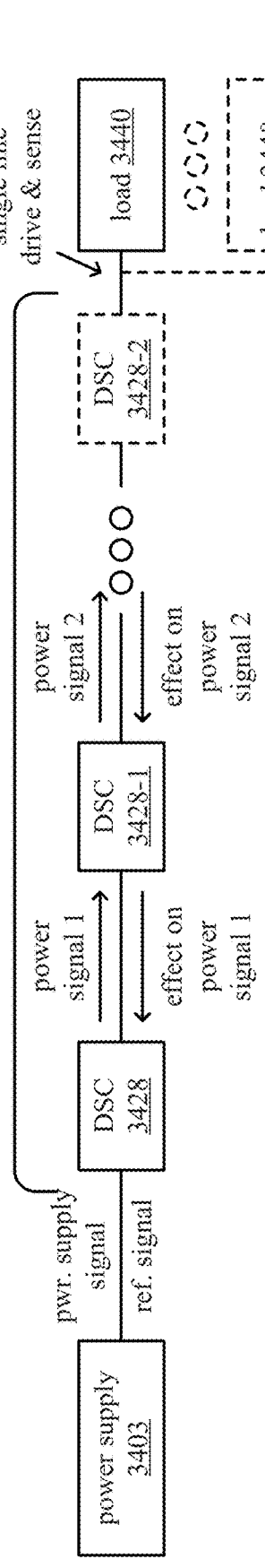
FIG. 34A is a schematic block diagram of an embodiment of multi-stage power supply signal conditioning using DSCs in accordance with the present invention.

FIG. 34A is a schematic block diagram of an embodiment 3401 of multi-stage power supply signal conditioning using DSCs in accordance with the present invention. In this diagram, the power supply 3403 provides a power signal to a DSC 3428. In some examples, the power supply 3403 also provides a reference signal to the DSC 3428. Two or more cascaded DSCs are implemented between the power supply 3403 and one or more loads 3440 to 3440-n. The DSC 3428 is configured to provide a power signal to DSC 3428-1 and simultaneously sense the power signal that is provided to the DSC 3428-1. Such multi-stage power supply signal conditioning using DSCs may be implemented for a variety of applications. In some examples, the different respective DSC of the multi-stage power supply signal conditioning using DSCs operate as back-ups to one another such as in the event that any power failure to one of the DSCs may be compensated for by power provided by one or more other of the DSCs. Consider an example in which the DSCs are energized based on different respective batteries. A failure of one or more of the batteries will not adversely affect the overall system, in that, one or more other of the DSCs is configured to fulfil any power requirement that is not being met by such a failure of one or more of the batteries.

Depending on the number of DSCs that are implemented between the power supply 3403 and the one or more loads 3440 to 3440-n being more than two, the DSC 3428-1 is configured to provide another power signal to another DSC in the cascaded chain of DSCs between the power supply 3403 and the one or more loads 3440 to 3440-n and simultaneously sense the other power signal that is provided to this other DSC. The final DSC and the cascaded chain of DSCs that is implemented between the power supply 3403 and the one or more loads 3440 to 3440-n (e.g., DSC 3428-2) is configured to provide a power signal to the one or more loads 3440 to 3440-n and also simultaneously to sense the power signal that is provided to the one or more loads 3440 to 3440-n.

Note that the cascaded chain of DSCs is operative to perform multi-stage power supply signal conditioning of the output signal of the power supply 3403. Generally speaking, any desired number of stages or DSCs may be implemented in the cascaded chain of DSCs that is implemented between the power supply 3403 and the one or more loads 3440 to 3440-n. The regulation and control of the power supply signal that is ultimately provided to the one or more loads 3440 to 3440-n (e.g., via a single line from the DSC 3428-2 to the one or more loads 3440 to 3440-n) undergoes conditioning and regulation over multiple stages.

Figure 34B:
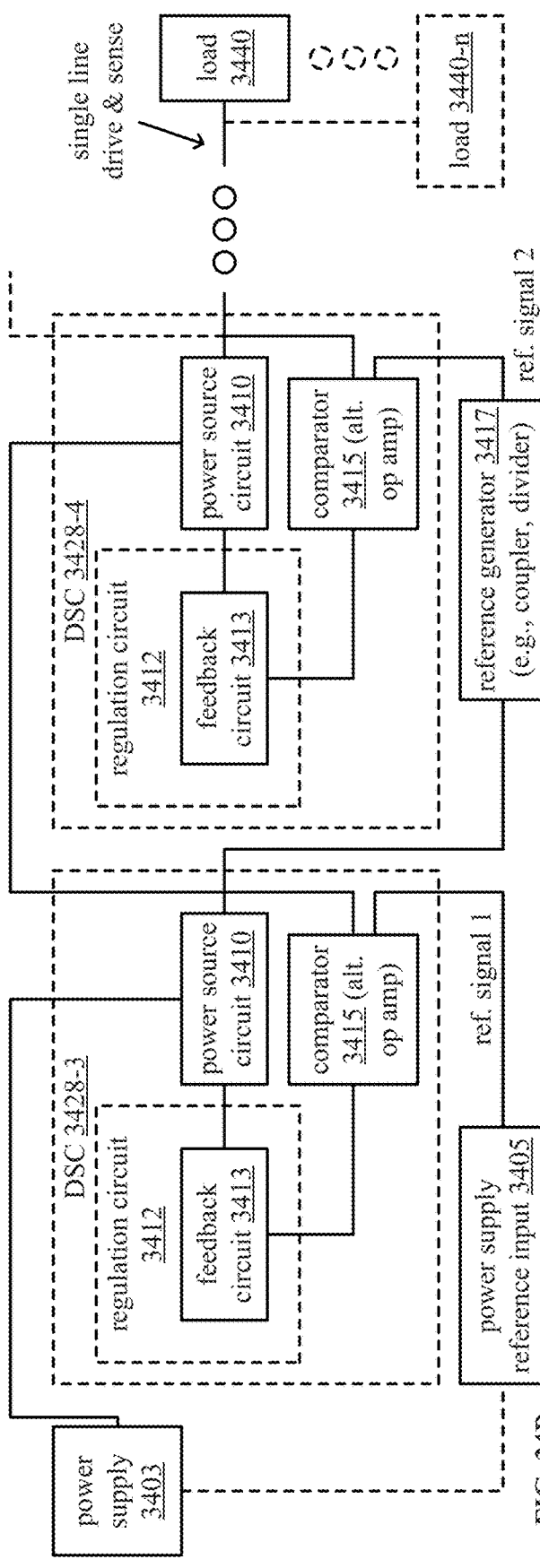
FIG. 34B is a schematic block diagram of another embodiment of multi-stage power supply signal conditioning using DSCs in accordance with the present invention.

FIG. 34B is a schematic block diagram of another embodiment 3402 of multi-stage power supply signal conditioning using DSCs in accordance with the present invention. In this diagram, a first power supply reference input 3405 is provided to a DSC 3428-3, and a second power supply reference input, which is provided from a reference generator 3417 that is coupled to the 3428-3, is provided to a DSC 3428-4. In some examples, one or more processing modules is configured to provide the power supply reference input 3405. In other examples, one or more other devices is implemented to provide the power supply reference input 3405. In even other examples, the power supply 3403 is implemented to provide the power supply reference input 3405.

In addition, a power supply 3403 provides a power signal to a DSC 3428-3. The DSC 3428-3 is configured to provide a power signal to the DSC 3428-4 and simultaneously sense the power signal that is provided to the DSC 3428-4. Also, this power signal that is provided from the DSC 3428-3 to the DSC 3428-4 is also provided to the reference generator 3417. The reference generator 3417 processes the power signal to generate the second power supply reference input and provides it to the DSC 3428-4.

Depending on the number of DSCs that are implemented between the power supply 3403 and the one or more loads 3440 to 3440-n being more than two, the DSC 3428-3 is configured to provide another power signal to another DSC in the cascaded chain of DSCs between the power supply 3403 and the one or more loads 3440 to 3440-n and simultaneously sense the other power signal that is provided to this other DSC. The final DSC and the cascaded chain of DSCs that is implemented between the power supply 3403 and the one or more loads 3440 to 3440-n (e.g., DSC 3428-4) is configured to provide a power signal to the one or more loads 3440 to 3440-n and also simultaneously to sense the power signal that is provided to the one or more loads 3440 to 3440-n.

In this diagram, each of the DSCs includes a regulation circuit 3412 includes a feedback circuit 3413, a power source circuit 3410, and a comparator 3415. Considering the operation of the DSC 3428-3, an analog signal output from the comparator 3415, when comparing the power signal that is provided from the power source circuit 3410 to the power source circuit 3410 of the DSC 3428-4 and also to the reference generator 3417 and any effect thereof to the reference signal received from the power supply reference input 3405, is provided to the feedback circuit 3413 of the regulation circuit 3412. The analog signal output from the comparator 3415 is provided to the feedback circuit 3413 of the regulation circuit 3412 to generate a signal to be provided to the power source circuit 3410 to modify operation of the power source circuit 3410 to ensure that the power signal provided to the power source circuit 3410 of the DSC 3428-4 and also to the reference generator 3417 is regulated to be same as the first reference signal received by the comparator 3415 from the power supply reference input 3405.

Considering the operation of the DSC 3428-4 (e.g., considering to DSCs in the cascaded chain of DSCs that are implemented between the power supply 3403 and the one or more loads 3440 to 3440-n), an analog signal output from the comparator 3415, when comparing the power signal that is provided from the power source circuit 3410 to the one or more loads 3440 to 3440-n and any effect thereof to the reference signal received from the reference generator 3417, is provided to the feedback circuit 3413 of the regulation circuit 3412. The analog signal output from the comparator 3415 is provided to the feedback circuit 3413 of the regulation circuit 3412 to generate a signal to be provided to the power source circuit 3410 to modify operation of the power source circuit 3410 to ensure that the power signal provided to the one or more loads 3440 to 3440-n is regulated to be same as the reference signal received by the comparator 3415 from the reference generator 3417.

Generally speaking, any desired number of stages or DSCs may be implemented in the cascaded chain of DSCs that is implemented between the power supply 3403 and the one or more loads 3440 to 3440-n. The regulation and control of the power supply signal that is ultimately provided to the one or more loads 3440 to 3440-n (e.g., via a single line from the DSC 3428-2 to the one or more loads 3440 to 3440-n) undergoes conditioning and regulation over multiple stages.

Figure 35:
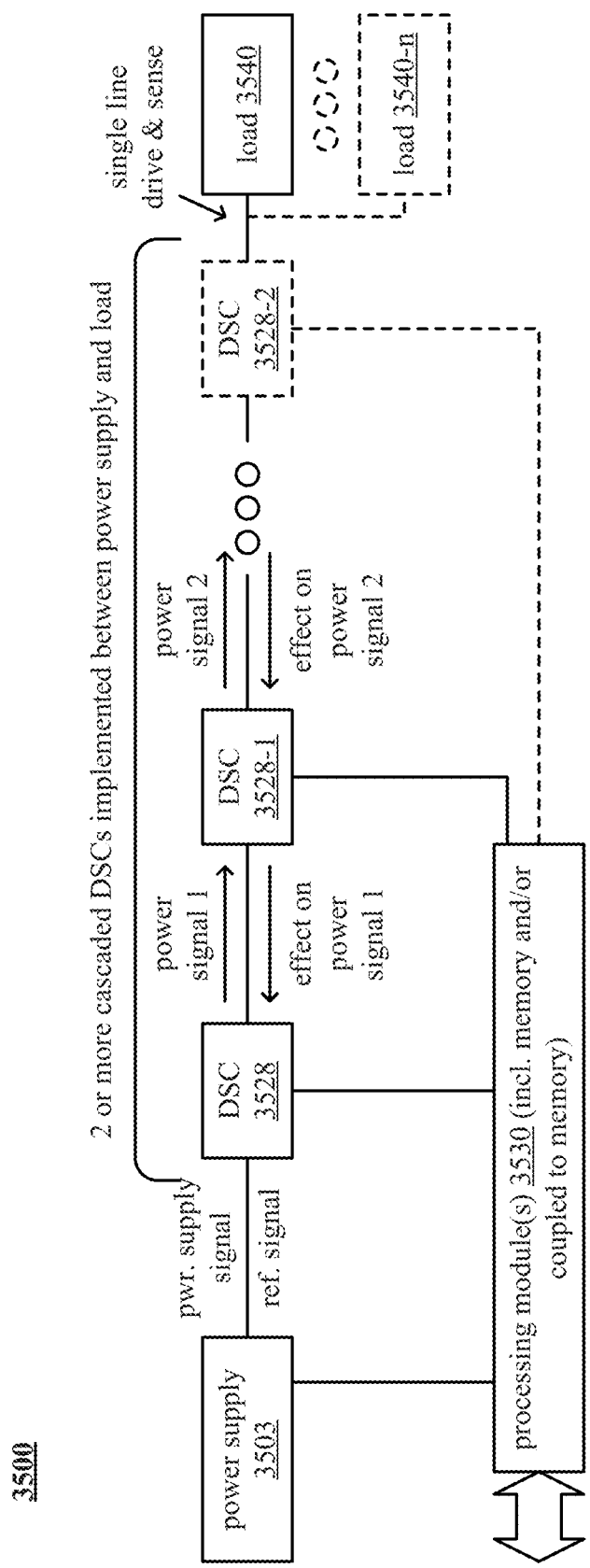
FIG. 35 is a schematic block diagram of another embodiment of multi-stage power supply signal conditioning using DSCs in accordance with the present invention.

FIG. 35 is a schematic block diagram of another embodiment 3500 of multi-stage power supply signal conditioning using DSCs in accordance with the present invention. In this diagram, one or more processing modules 3530 using communication and interfaces with each of a power supply 3505 and a number of cascaded DSCs that are implemented between the power supply 3403 and one or more loads 3440 to 3440-n.

Also, the power supply 3403 provides a power signal to the DSC 3428. In some examples, the power supply 3403 also provides a reference signal to the DSC 3428. In some examples, the one or more processing modules 3530 is configured to provide a reference signal to the DSC 3428 and/or provide additional respective reference signals to the other DSCs within the cascaded chain of DSCs that are implemented between the power supply 3403 and one or more loads 3440 to 3440-n. Note that DSCs are implemented between the power supply 3403 and one or more loads 3440 to 3440-n. The DSC 3428 is configured to provide a power signal to DSC 3428-1 and simultaneously sense the power signal that is provided to the DSC 3428-1.

Depending on the number of DSCs that are implemented between the power supply 3403 and the one or more loads 3440 to 3440-n being more than two, the DSC 3428-1 is configured to provide another power signal to another DSC in the cascaded chain of DSCs between the power supply 3403 and the one or more loads 3440 to 3440-n and simultaneously sense the other power signal that is provided to this other DSC. The final DSC and the cascaded chain of DSCs that is implemented between the power supply 3403 and the one or more loads 3440 to 3440-n (e.g., DSC 3428-2) is configured to provide a power signal to the one or more loads 3440 to 3440-n and also simultaneously to sense the power signal that is provided to the one or more loads 3440 to 3440-n.

Note that the cascaded chain of DSCs is operative to perform multi-stage power supply signal conditioning of the output signal of the power supply 3403. Generally speaking, any desired number of stages or DSCs may be implemented in the cascaded chain of DSCs that is implemented between the power supply 3403 and the one or more loads 3440 to 3440-n. The regulation and control of the power supply signal that is ultimately provided to the one or more loads 3440 to 3440-n (e.g., via a single line from the DSC 3428-2 to the one or more loads 3440 to 3440-n) undergoes conditioning and regulation over multiple stages.

In addition, the one or more processing modules 3530 is configured to receive information from and/or direct the operation of each of the power supply 3503 and the two or more cascaded DSCs that are implemented between the power supply 3403 and the one or more loads 3440 to 3440-n. For example, any one or more of the respective DSCs that are implemented between the power supply 3403 and the one or more loads 3440 to 3440-n may be implemented to provide information to the one or more processing modules 3530 regarding the regulation of the power signal provided from it and simultaneously sensed. In addition, the one or more processing modules 3530 is configured to interface and communicate with the power supply 3503. In some examples, the power supply 3503 provides information regarding the operation of the power supply 3503 to the one or more processing modules 3530. In certain examples, the one or more processing modules 3530 processes information received from the power supply 3503 and/or the two or more cascaded DSCs that are implemented between the power supply 3403 and the one or more loads 3440 to 3440-n, and processes the information to determine any adaptation that is to be performed by any of the power supply 3503 and/or the two or more cascaded DSCs that are implemented between the power supply 3403 and the one or more loads 3440 to 3440-n in accordance with multi-staged DSCs signal conditioning of a power signal from the power supply 3503 to the one or more loads 3540 to 3540-n.

Generally speaking, the one or more processing modules 3530 is configured to process the information received from the power supply 3503 and/or the two or more cascaded DSCs that are implemented between the power supply 3503 and the one or more loads 3540 to 3540-n to determine any adaptation that is to be performed by any of the power supply 3503 and/or the two or more cascaded DSCs that are implemented between the power supply 3503 and the one or more loads 3540 to 3540-n in accordance with multi-staged DSCs signal conditioning of a power signal from the power supply 3503 to the one or more loads 3540 to 3540-n. Based on the determination by the one or more processing modules 3530 to perform such adaptation to ensure an effectively regulated and conditioned power signal, the one or more processing modules 3530 directs the control and/or adaptation one or more of the appropriate components.

In addition, note that such multi-stage power supply signal conditioning using DSCs may be adapted such that different degrees of supply signal conditioning are performed by the DSCs. In some examples, the one or more DSCs located closer to the power supply 3503 perform power supply signal conditioning more directed to dealing with any deleterious effects related to the power supply 3503 whereas the one or more DSCs located closer to the one or more loads 3540 to 3540-n perform power supply signal conditioning more directed to dealing with any deleterious effects related to the one or more loads 3540 to 3540-n. From certain perspectives, the one or more processing modules 3530 is configured to perform such supply signal conditioning based on a profile across the respective DSCs 3528, 3528-2, and optionally up to 3528-2.

FIG. 36 is a schematic block diagram of another embodiment of a method 3600 for execution by one or more devices in accordance with the present invention. The method 3600 operates in step 3620 by outputting, from a power supply operably coupled to a first DSC, a power supply signal. The method 3600 also operates in step 3630 by outputting, from the first DSC, the first conditioned power supply signal to a second DSC. The method 3600 operates in step 3640 by operating the second DSC to process the first conditioned power supply signal to generate a second conditioned power supply signal in accordance with multi-stage power supply signal conditioning.

In some alternative variant of the method 3600, the method 3600 also operates in step 3650 by operating one or more additional DSCs to generate a final conditioned power supply signal in accordance with multi-stage power supply signal conditioning. In general, the one or more additional DSCs, when implemented, are configured to perform additional stages of signal conditioning. The method 3600 operates in step 3660 by outputting, from a final DSC implemented to perform in accordance with multi-stage power supply signal conditioning, a final conditioned power supply signal (e.g., the second conditioned power supply signal when 2 DSCs implemented) to service one or more loads.

Figure 37A:
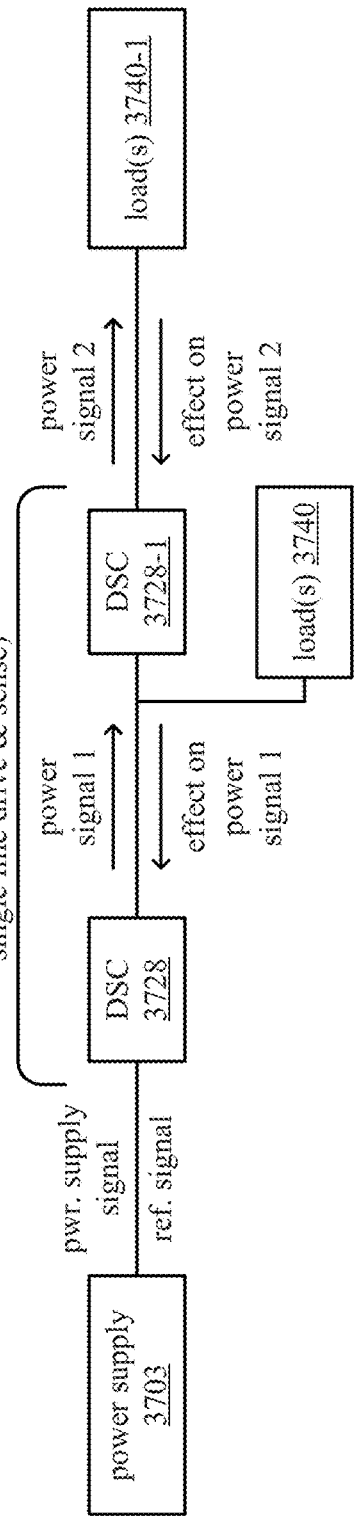
FIG. 37A is a schematic block diagram of an embodiment of a cascaded DSC and load network in accordance with the present invention.

FIG. 37A is a schematic block diagram of an embodiment 3701 of a cascaded DSC and load network in accordance with the present invention. In this diagram, the power supply 3703 provides a power signal to a DSC 3728. The DSC 3728 is configured to provide a power signal to one or more loads 3740. In some examples, the power supply 3703 also provides a reference signal to the DSC 3728. Two cascaded DSCs are implemented in the cascaded DSC and load network, and each DSC may be implemented to provide a respective power signal to one or more respect loads.

For example, considering the implementation of the cascaded DSC and load network of this diagram, the DSC 3728 is configured to provide a power signal to DSC 3728-1 and simultaneously sense the power signal that is provided to the DSC 3728-1. In addition, the DSC 3728 is configured to provide and simultaneously sense that power signal that is also provided to one or more loads 3740. The DSC 3728-1 is configured to provide and simultaneously sense a respective power signal to one or more loads 3740-1.

In some examples, the power supply 3703 is implemented to provide power to respective power source circuits within each of the respective DSCs within the cascaded DSC and load network. Each respective DSC is configured to provide a respective power signal to its respective one or more loads and simultaneously to sense that respective power signal. As such, each respective one or more loads that is serviced by a respective DSC may be monitored individually by the respective DSCs. For example, the DSC 3728 is configured to monitor the one or more loads 3740. The DSC 3728-1 is implemented to monitor the one or more loads 3740-1. As such, in this implementation of a cascaded DSC and load network, different respective loads may be decoupled from one another such that each respective one or more loads can be individually monitored by a respective DSC.

Figure 37B:
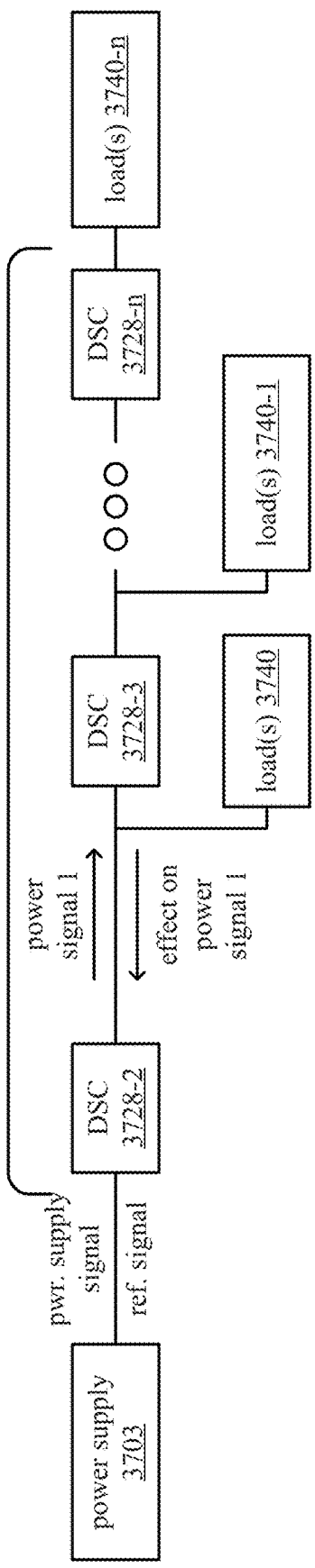
FIG. 37B is a schematic block diagram of another embodiment of a cascaded DSC and load network in accordance with the present invention.

FIG. 37B is a schematic block diagram of another embodiment 3702 of a cascaded DSC and load network in accordance with the present invention. This diagram is similar to the prior diagram with at least one difference being that three or more cascaded DSCs are implemented between the power supply 3703 and the respective one or more loads that are respectively serviced by each of the respective DSCs of the cascaded DSC and load network.

For example, considering the implementation of the cascaded DSC and load network of this diagram, the DSC 3728-2 is configured to provide a power signal to DSC 3728-3 and simultaneously sense the power signal that is provided to the DSC 3728-3. In addition, the DSC 3728-2 is configured to provide and simultaneously sense that power signal that is also provided to one or more loads 3740. The DSC 3728-3 configured to provide and simultaneously sense the power signal that is provided to the next DSC in the cascaded DSC and load network of this diagram. In addition, the DSC 3728-3 is configured to provide and simultaneously sense that power signal that is also provided to one or more loads 3740-1.

This process continues for each of the respective DSCs within the cascaded DSC and load network of this diagram. For example, the last DSC in the chain, DSC 3728-n, where n is a positive integer greater than or equal to three, is configured to provide and simultaneously sense a respective power signal to one or more loads 3740-n.

Figure 38:
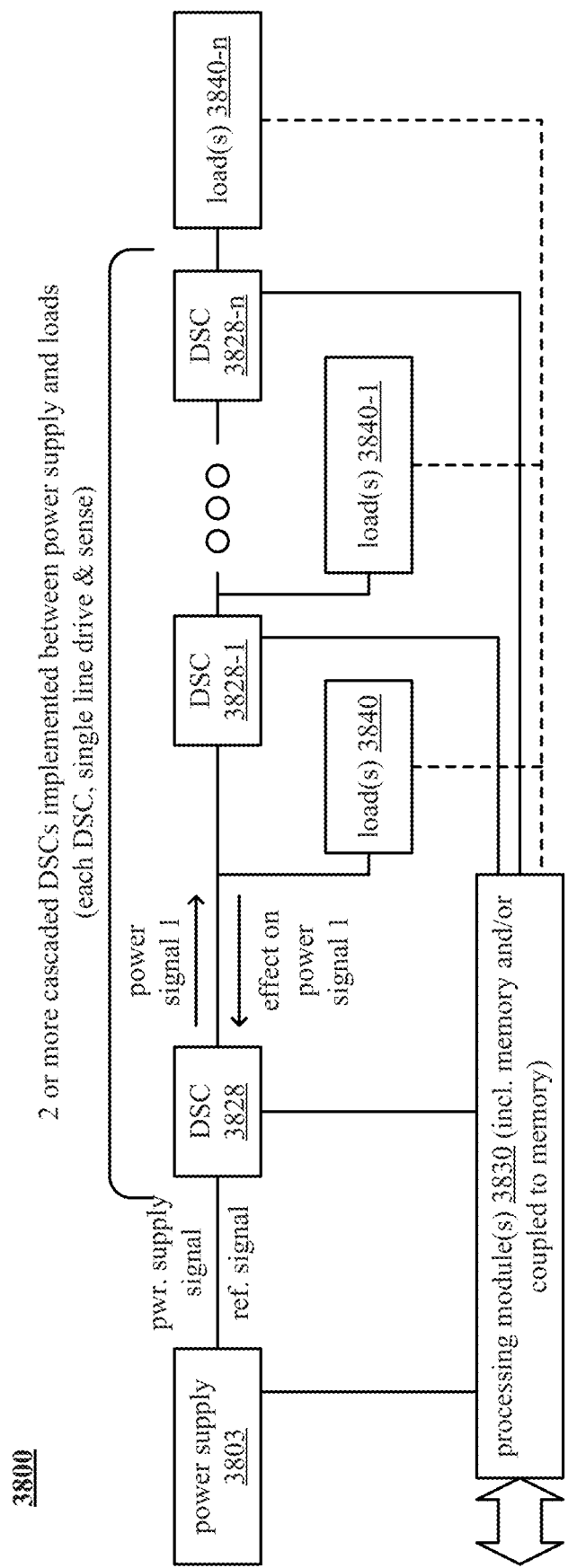
FIG. 38 is a schematic block diagram of another embodiment of a cascaded DSC and load network in accordance with the present invention.

FIG. 38 is a schematic block diagram of another embodiment 3800 of a cascaded DSC and load network in accordance with the present invention. In this diagram, one or more processing modules 3830 interfaces and communicates with the power supply 3803, and one or more of the DSCs of the cascaded DSC and load network of this diagram.

The power supply 3803 provides a power signal to a DSC 3828. The DSC 3828 is configured to provide a power signal to one or more loads 3840. In some examples, the power supply 3803 also provides a reference signal to the DSC 3828. In other examples, the one or more processing modules 3830 is configured to provide the reference signal to the DSC 3828. Two or more cascaded DSCs are implemented in the cascaded DSC and load network, and each DSC may be implemented to provide a respective power signal to one or more respect loads.

For example, considering the implementation of the cascaded DSC and load network of this diagram, the DSC 3828 is configured to provide a power signal to DSC 3828-1 and simultaneously sense the power signal that is provided to the DSC 3828-1. In addition, the DSC 3828 is configured to provide and simultaneously sense that power signal that is also provided to one or more loads 3840. The DSC 3828-1 is configured to provide a power signal to the next DSC and simultaneously sense the power signal that is provided to the next DSC. In addition, the DSC 3828-1 is configured to provide and simultaneously sense that power signal that is also provided to one or more loads 3840-1.

The last DSC in the cascaded DSC and load network of this diagram, shown as DSC 3828-n, where n is a positive integer greater than or equal to 2, is configured to provide and simultaneously sense the power signal that is provided to one or more loads 3840-n.

In some examples, the power supply 3803 is implemented to provide power to respective power source circuits within each of the respective DSCs within the cascaded DSC and load network. Each respective DSC is configured to provide a respective power signal to its respective one or more loads and simultaneously to sense that respective power signal. As such, each respective one or more loads that is serviced by a respective DSC may be monitored individually by the respective DSCs. For example, the DSC 3828 is configured to monitor the one or more loads 3840. The DSC 3828-1 is implemented to monitor the one or more loads 3840-1. As such, in this implementation of a cascaded DSC and load network, different respective loads may be decoupled from one another such that each respective one or more loads can be individually monitored by a respective DSC.

In an example of operation and implementation, the one or more processing modules 3830 is also configured to communicate and interface with the power supply 3803 and/or the DSC 3828, 3828-1, up to 3828-n. The one or more processing modules 3830 is implemented to receive information from the power supply 3803 and/or the DSC 3828, 3828-1, up to 3828-n. The one or more processing modules 3830 is configured to process the information received from the power supply 3803 and/or the DSC 3828, 3828-1, up to 3828-n to determine any adaptation that is to be performed by any of the power supply 3803 and/or the DSC 3828, 3828-1, up to 3828-n in accordance with each of the respective DSCs performing signal conditioning of respective power signals that are serviced there from to the respective one or more loads that are serviced by the DSCs of the cascaded DSC and load network.

In some examples, the one or more processing modules 3830 is also configured to communicate and interface with the respective loads of the cascaded DSC and load network (e.g., the one or more loads 3840, 3804-1, and/or 3840-n). In an example of operation and implementation, the one or more processing modules 3830 is configured to receive information from the respective loads of the cascaded DSC and load network. Based on the determination by the one or more processing modules 3830 to perform such adaptation to ensure effectively regulated and conditioned power signals from the respective DSCs to their respective loads within the cascaded DSC and load network, the one or more processing modules 3830 directs the control and/or adaptation one or more of the appropriate components.

In addition, in certain examples, the one or more processing modules 3830 is configured to monitor each of the respective one or more loads associated with the respective DSCs within the cascaded DSC and load network over time. The one or more processing modules 3030 is configured to determine the change, if any, of any one or more of the respective loads, the power delivered to the loads, the current signals provided to service the loads, variation in the power signals that service the loads, etc. Based on such monitoring of the respective loads and any such characteristics associated with the loads, the one or more processing modules 3830 is configured to identify whether or not any of the loads may be approaching failure, nearing failure, have failed, are problematic, are nearing the end of life of the device, based on any variation from prior performance, expected performance, historical performance, predicted failure of the device, an age of the device being greater than or equal to a maximum age threshold level, and/or an indication that the device is failing, etc.

In certain examples, when the various loads are substantially similar to one another, when change associated with a particular load is different than change associated with other of the loads, then that particular load may be identified as being problematic, possibly problematic, failed, nearing failure, nearing its end of life, etc. Generally speaking, appropriate monitoring of electrical. Generally speaking, appropriate monitoring of the respective loads within the cascaded DSC and load network over time provides for identification of problems and/or possible problems associated with the loads within the cascaded DSC and load network.

When such monitoring is performed and when problems and/or possible problems are identified, appropriate actions may be performed to mitigate, reduce, and/or eliminate any effects that may adversely affect the overall operation of the cascaded DSC and load network. In some examples, the one or more processing modules 3830 is configured to utilize such information in accordance with system management of the cascaded DSC and load network.

Figure 39:
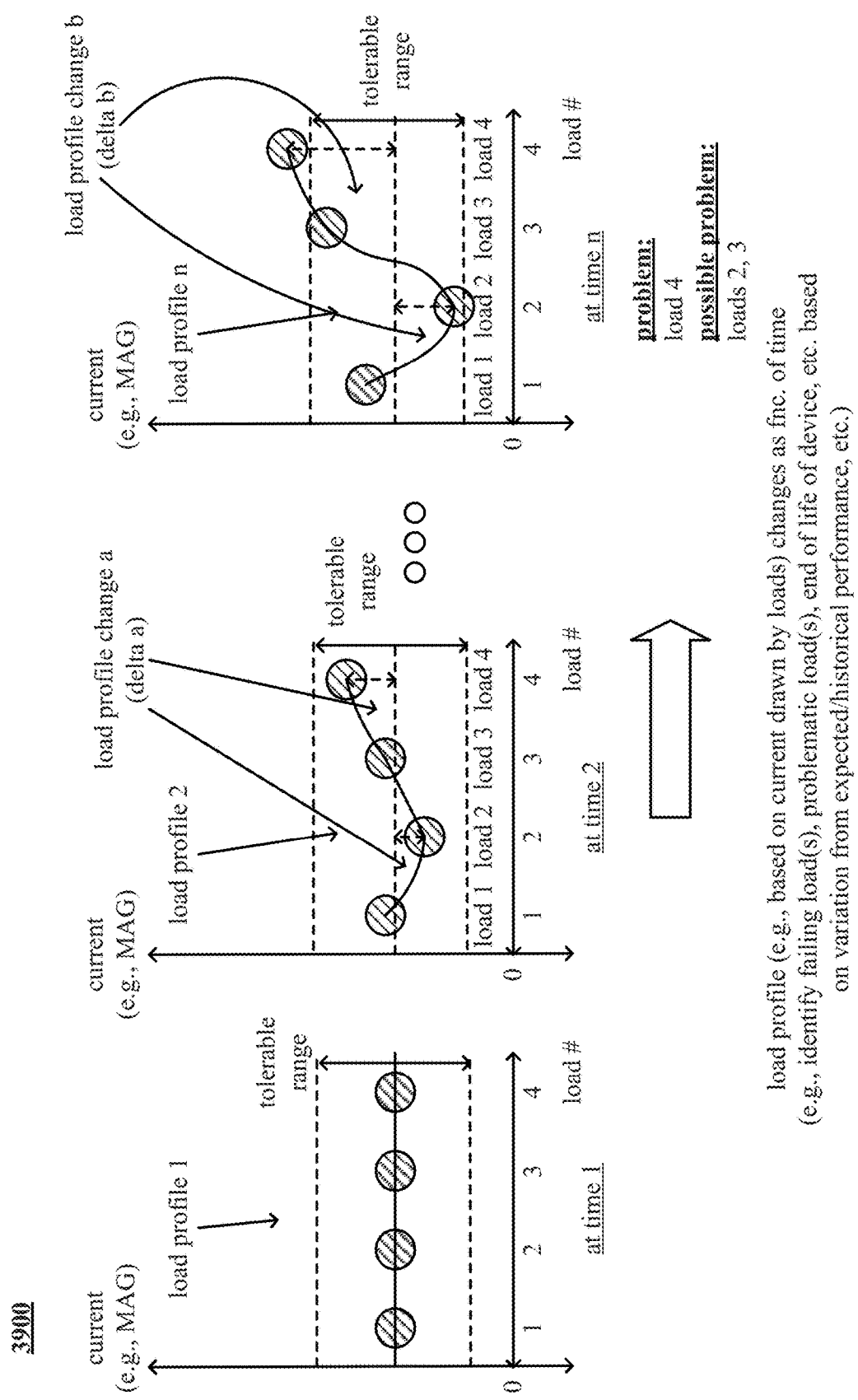
FIG. 39 is a schematic block diagram of an embodiment of load profile monitoring in accordance with system management of a cascaded DSC and load network in accordance with the present invention.

FIG. 39 is a schematic block diagram of an embodiment 3900 of load profile monitoring in accordance with system management of a cascaded DSC and load network in accordance with the present invention. In this diagram, different respective load profiles with respect to the multiple loads within a cascaded DSC and load network are shown as a function of time (e.g., at different snapshots of time). For example, the different respective loads are identified along the horizontal axis of the graphs, and the amount of current consumed (e.g., the magnitude of the current being consumed) for each respective load is shown along the vertical axis of the graphs. Considered together, a profile of all of the loads within the cascaded DSC and load network may be made at any given time and variations or changes of the profile as a function of time may also be monitored.

Also, note that while this diagram shows and uses the current being consumed by the respective loads within the cascaded DSC and load network as a parameter by which the respective load profiles are generated, note that any other electrical characteristics may alternatively be used. Other examples of electrical characteristics associated with the loads of the cascaded DSC and load network may include the power of the power signals being provided respectively to the loads of the cascaded DSC and load network, voltage of the power signals being provided respectively to the loads of the cascaded DSC and load network, any change of impedance of the loads of the cascaded DSC and load network, the rate of change of any such electrical characteristics of the loads of the cascaded DSC and load network (e.g., the rate of change of current, voltage, impedance, etc.) and/or any other parameter, etc.

In an example of operation and implementation, at a time 1, a load profile 1 is generated based on the current that is consumed by four different loads of the cascaded DSC and load network. Considering a particular example in which the respective loads are similar in characteristic (e.g., similar in one or more characteristics such as being similarly implemented types of devices, such as all being of a particular type of device, size, rating, impedance, and/or any other characteristic, such as all being of approximately the same age, with the same amount of remaining usable life, etc.), the amount of current being consumed by the different respective loads may be substantially or approximately similar.

At time 1, load profile 1 shows that the amount of current being consumed by the different respective loads is same. However, at a subsequent time, at time 2, a load profile 2 shows some variation in the amount of current consumed by at least some of the loads. This corresponds to a different load profile of the different respective loads of the cascaded DSC and load network. The variation, change, or delta between the load profile 2 and the load profile 1 provides indication of what is happening with respect to the various loads of the of the cascaded DSC and load network. In addition, further consideration may be made regarding the amount of time that has passed between time 1 and time 2. For example, a very fast rate of change in the amount of current being consumed by the respective loads of the of the cascaded DSC and load network resulting in a vastly different load profile 2 in comparison to load profile 1 (e.g., such as unfavorably comparing to one another based upon one or more considerations, such as overall threshold of load profiles, one or more individual load characteristics, etc.), then identification of one or more problems are possible problems may be made.

This process of generating load profiles based on the amount of current being consumed by the different respective loads of the of the cascaded DSC and load network may be performed any number of times and based on any number of considerations. For example, at a time n, a load profile n is generated for the different respective loads of the cascaded DSC and load network.

In some examples, the different respective profiles are generated at particular times, such as after a certain amount or period of time has elapsed (e.g., every 10 seconds, every 1 min., every 10 min., every hour, every day, every week, etc.). In other examples the different respective profiles are generated in response to detecting changes of one or more of the loads of the of the cascaded DSC and load network. For example, if a change in the amount of current consumed by any one or more of the loads exceeds a particular threshold or compares unfavorably to a particular threshold, then a new load profile may be generated. In another example if change in the amount of current consumed by a particular number of the loads exceeds a particular threshold or compares unfavorably to a particular threshold, then a new load profile may be generated. Generally speaking, in a particular implementation, any desired event may be the basis by which a new load profile is generated. In some particular examples, based upon user initiation, such as via a user interface of a computing device, a new load profile is generated.

Note that the different respective load profiles may be generated by one or more processing modules implemented to interface with and communicate with one or more of the power supply, one or more loads, and/or one or more DSCs within a cascaded DSC and load network. The one or more processing modules is configured to generate a load profile and, as may be appropriate, to process that load profile with respect to one or more other load profiles. For example, the one or more processing modules is configured to determine whether or not a most recently generated load profile compares favorably or unfavorably with one or more other load profiles that have been generated previously. Based upon unfavorable comparison between the most recently generated load profile with those one or more other load profiles, the one or more processing modules is configured to perform one or more operations. In some examples, the one or more processing modules is configured to generate and provide a notification to the cascaded DSC and load network, to a user of the cascaded DSC and load network, to a system manager of the cascaded DSC and load network, and/or some other notification operation is performed.

In other examples, the one or more processing modules is configured to perform some operation to address the unfavorable comparison. For example, based on an unfavorable comparison of one or more electrical characteristics of the one or more loads of the cascaded DSC and load network to operation within a tolerable range, the one or more processing modules is configured to facilitate different and improved operation of the cascaded DSC and load network. For example, if a load within the cascaded DSC and load network is a source of problem and adversely affecting the overall operation of the cascaded DSC and load network, the one or more processing modules is configured to facilitate the offloading, disconnection, discontinuing abuse, etc. of that particular load. In some examples, the one or more processing modules is configured to facilitate one or more different or additional loads to operate in place of that particular load that is identified as being problematic.

Considering this diagram, in some examples, the one or more processing modules is configured to employ one or more tolerable ranges with respect to the current being consumed by the different respective loads of the cascaded DSC and load network. Note that while the tolerable range shown within this diagram is with respect to current, other appropriate tolerable ranges may alternatively be used when other electrical characteristics associated with the loads are used. In this diagram, when the current being consumed by the respective loads is within the tolerable range, then the load profile is acceptable. In some examples, this corresponds to a favorable comparison of the load profile with an acceptable load profile.

However, when the current being consumed by the respective loads is outside of the tolerable range, then the load profile is unacceptable. In some examples, this corresponds to an unfavorable comparison of the load profile with the excepted load profile.

Note that different types of favorable and unfavorable comparison may be made. For example, when the current being consumed by a first particular number of loads is within the tolerable range (e.g., consider 3 out of 4 of the loads with respect to this particular diagram), then the load profile is acceptable. In some examples, this corresponds to a favorable comparison of the load profile with an acceptable load profile. However, if only a second particular number of loads is within the tolerable range (e.g., consider 2 out of 4 of the loads with respect to this particular diagram), then the load profile is unacceptable. In general, any desired parameters by which favorable and unfavorable comparison may be determined may be used.

In an example of operation and implementation, considering the load n at time n in this diagram, load 2 and 3 are at or near the edge of the tolerable range, and load 4 is just outside of the tolerable range. This may indicate a problem with load 4 and possible problems with loads 2 and 3.

Figure 40:
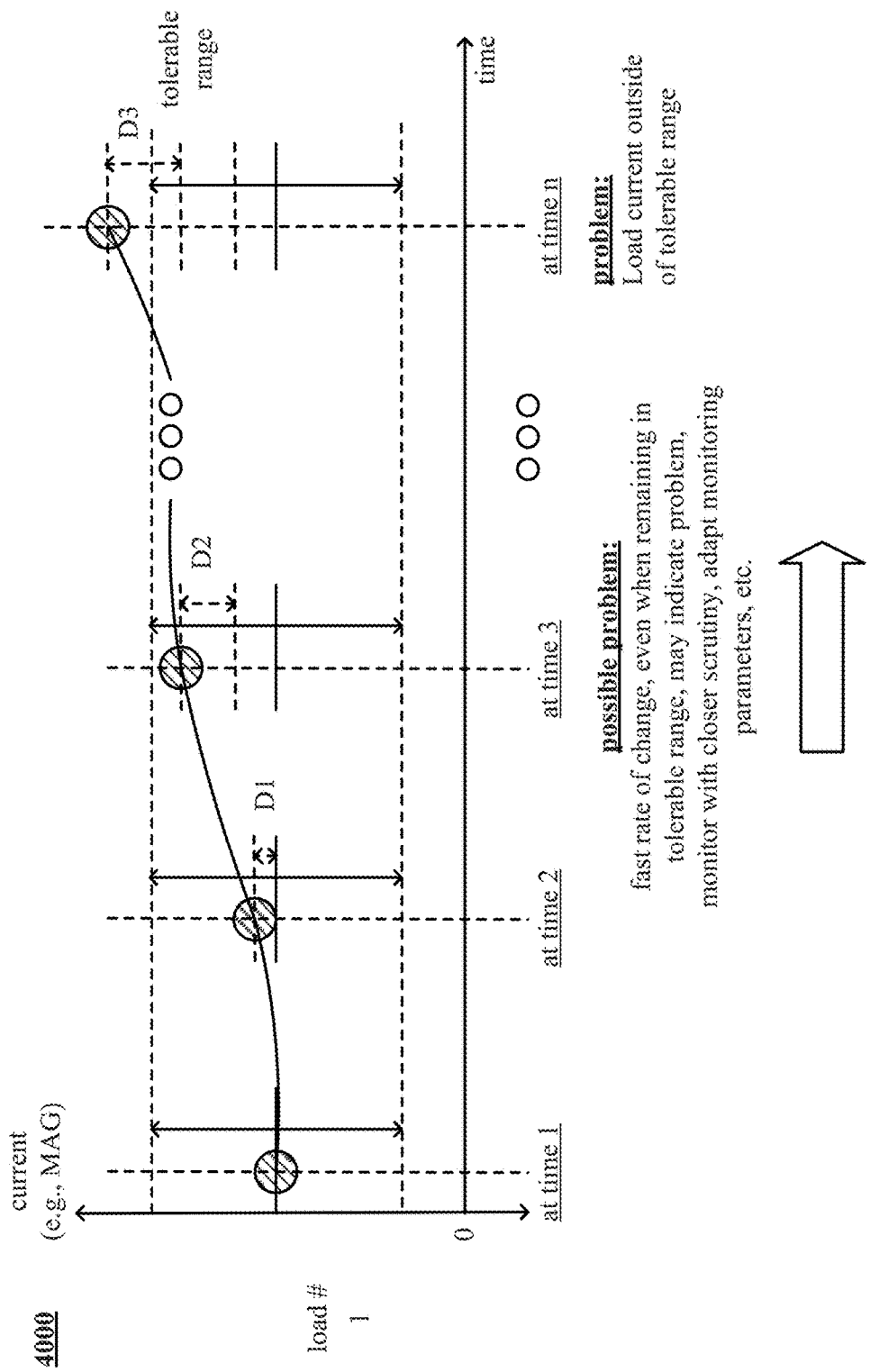
FIG. 40 is a schematic block diagram of an embodiment of load monitoring in accordance with system management of a cascaded DSC and load network in accordance with the present invention.

FIG. 40 is a schematic block diagram of an embodiment 4000 of load monitoring in accordance with system management of a cascaded DSC and load network in accordance with the present invention. This diagram has some similarities to the previous diagram with at least one difference being that only one particular load is being monitored and tracked as opposed to a number of loads corresponding to different respective loads corresponding to associated load profiles.

In this diagram, and electrical characteristics associated with a particular load (e.g., consider load 1) is shown as a function of time (e.g., at different snapshots of time). For example, in the graph of this diagram, time is identified along the horizontal axis of the graphs, and the amount of current consumed (e.g., the magnitude of the current being consumed) by the load is shown along the vertical axis of the graphs.

Also, note that while this diagram shows and uses the current being consumed by the load within the cascaded DSC and load network as a parameter by which the graph is generated, note that any other electrical characteristics may alternatively be used. Other examples of electrical characteristics associated with the load of the cascaded DSC and load network may include the voltage of the power signal being provided to the load of the cascaded DSC and load network, any change of impedance of the load of the cascaded DSC and load network, the rate of change of any such electrical characteristics of the load of the cascaded DSC and load network (e.g., the rate of change of current, voltage, impedance, etc.), and/or any other parameter, etc. Considering only one particular load time can provided very accurate information with respect to any changes associated with one or more electrical characteristics of the load in an effort to perform individual load monitoring. This diagram performs individual load monitoring based on the current drawn by the load.

The graph shows, as a function of time, the amount of current being consumed by the load based on a power signal being provided from a power supply to the load. Identification of possible problems may include identifying a relatively fast rate of change of the current being consumed by the load. This may occur even when the amount of current being consumed remains within a tolerable range. A fast rate of change may indicate a problem with the load. Identification of a fast rate of change (e.g., fast being based on a determination of the amount of change of current being consumed as a function of change of time, such as comparing unfavorably to one or more acceptable rates of change) may be indicative of a problem. In some examples, this initiates a process of performing monitoring with much closer scrutiny. In other examples, this initiates the process by which adaptation of one or more monitoring parameters is performed. Such operations may be performed by one or more processing modules that is implemented to interface with and communicate with one or more of the power supply, the load, and/or one or more DSCs within a cascaded DSC and load network.

Figure 41A:
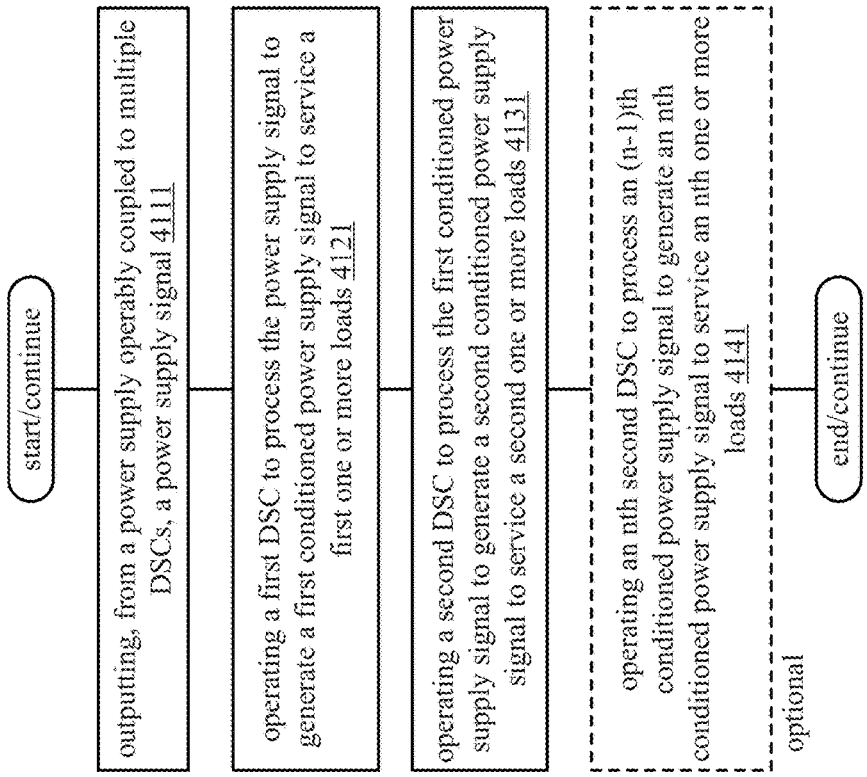
FIG. 41A is a schematic block diagram of another embodiment of a method for execution by one or more devices in accordance with the present invention.

FIG. 41A is a schematic block diagram of another embodiment of a method 4101 for execution by one or more devices in accordance with the present invention. The method 4100 operates in step 4110 by outputting, from a power supply operably coupled to multiple DSCs, a power supply signal. The method 4100 also operates in step 4120 by operating a first DSC to process the power supply signal to generate a first conditioned power supply signal to service a first one or more loads.

The method 4100 operates in step 4130 by operating a second DSC to process the power supply signal to generate a second conditioned power supply signal to service a second one or more loads. In some alternative variants of the method 4100, the method 4100 also operates in step 4140 by operating an nth second DSC to process the power supply signal to generate an nth conditioned power supply signal to service an nth one or more loads.

Figure 41B:
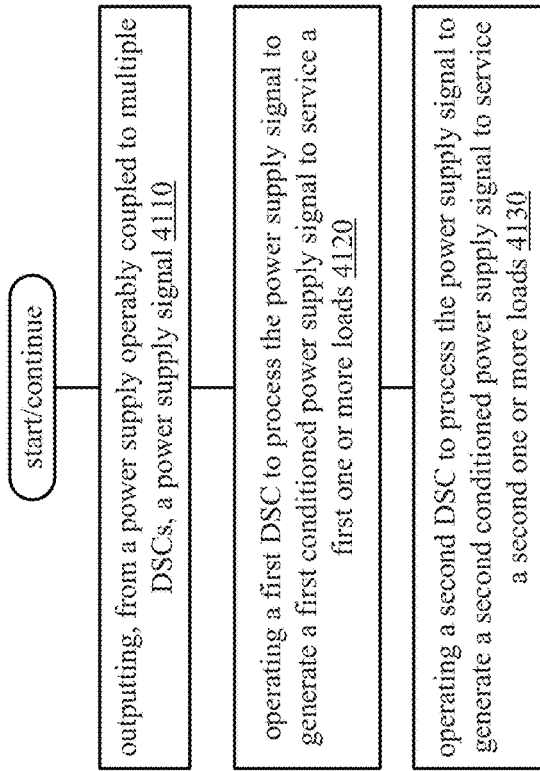
FIG. 41B is a schematic block diagram of another embodiment of a method for execution by one or more devices in accordance with the present invention.

FIG. 41B is a schematic block diagram of another embodiment of a method 4102 for execution by one or more devices in accordance with the present invention. The method 4101 operates in step 4111 by outputting, from a power supply operably coupled to multiple DSCs, a power supply signal. The method 4101 also operates in step 4121 by operating a first DSC to process the power supply signal to generate a first conditioned power supply signal to service a first one or more loads.

The method 4101 operates in step 4131 by operating a second DSC to process the first conditioned power supply signal to generate a second conditioned power supply signal to service a second one or more loads. In some alternative variants of the method 4101, the method 4101 also operates in step 4141 by operating an nth second DSC (where n is a positive integer greater than or equal to 3) to process an (n−1)th conditioned power supply signal to generate an nth conditioned power supply signal to service an nth one or more loads.

Figure 42:
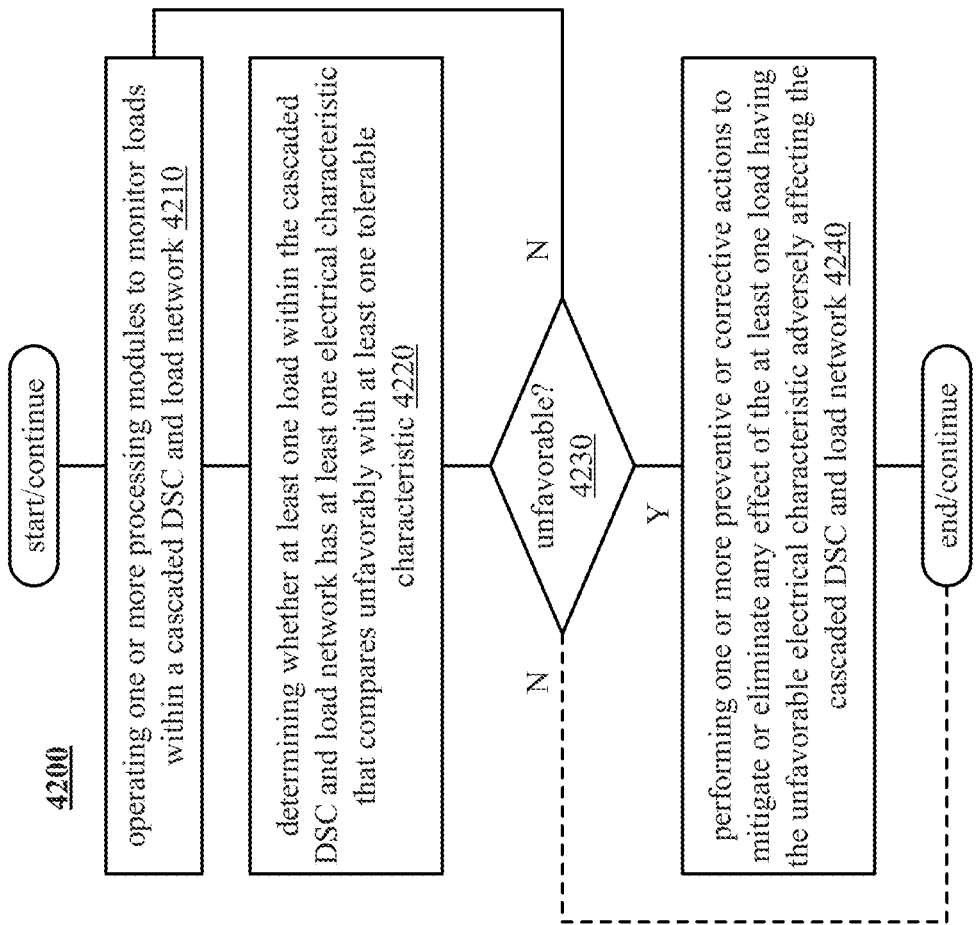
FIG. 42 is a schematic block diagram of another embodiment of a method for execution by one or more devices in accordance with the present invention.

FIG. 42 is a schematic block diagram of another embodiment of a method 4200 for execution by one or more devices in accordance with the present invention. The method 4200 also operates in step 4220 by operating one or more processing modules to monitor loads within a cascaded DSC and load network. The method 4200 operates in step 4230 by determining whether at least one load within the cascaded DSC and load network has at least one electrical characteristic that compares unfavorably with at least one tolerable characteristic.

Based on a determination that there is no load within the cascaded DSC and load network that has at least one electrical characteristic that compares unfavorably with at least one tolerable characteristic, the method 4200 loops back to step 4210 or alternatively ends. Based on a determination that there is there is at least one load within the cascaded DSC and load network that has at least one electrical characteristic that compares unfavorably with at least one tolerable characteristic, the method 4200 also operates in step 4240 by performing one or more preventive or corrective actions to mitigate or eliminate any effect of the at least one load having the unfavorable electrical characteristic adversely affecting the cascaded DSC and load network.

Figure 43:
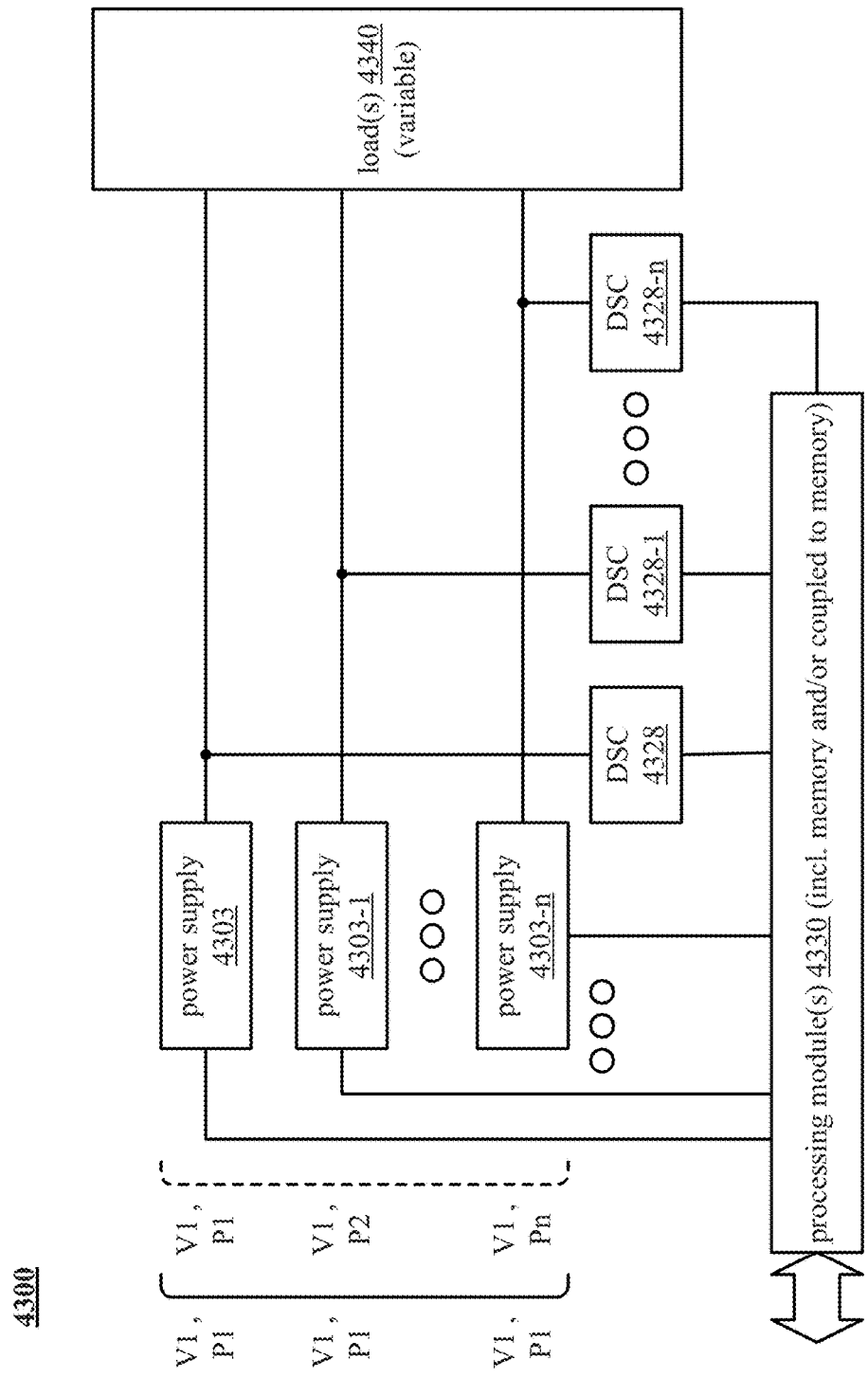
FIG. 43 is a schematic block diagram of an embodiment of a variable power supply and load system in accordance with the present invention.

FIG. 43 is a schematic block diagram of an embodiment 4300 of a variable power supply and load system in accordance with the present invention. In this diagram, a number of power supplies (e.g., two or more power supplies shown as power supply 4303, power supply 4303-1, and up to power supply 4303-n, where n is a positive integer greater than or equal to 2) is configured to provide power signals to one or more loads 4340. Note that the number of loads within the one or more loads 4340 may be variable, the impedance of the one or more loads 4340 may be variable, and/or the individual impedance of any load of the one or more loads 4340 may be variable. Also, note that the amount of power that is provided from the different respective power supplies 4303 to 4303-n may be the same in some instances (e.g., each of the different respective power supplies 4303 to 4303-n providing power signals having the same voltage, V1, and also capable of delivering the same amount of power, P1). However, in other instances, note that the amount of power that is provided from the different respective power supplies 4303 to 4303-n may be different (e.g., each of the different respective power supplies 4303 to 4303-n providing power signals having the same voltage, V1, yet power supply 4303 capable of delivering a first amount of power P1, power supply 4303-1 capable of delivering a second amount of power P2, and power supply 4303-n capable of delivering an nth amount of power Pn).

Also, a number of DSCs (e.g., two or more DSCs shown as DSC 4328, 4328-1, and up to 4328-n, where n is a positive integer greater than or equal to 2) is also configured to perform one or both of monitoring or sensing of the power signals output from the respective power supplies 4303 to 4303-n and driving of signals into the signals output from the respective power supplies 4303 to 4303-n. In some examples, note that only monitoring or sensing of the power signals output from the respective power supplies 4303 to 4303-n. However, note that any of the various examples, embodiments, implementations, etc. described herein by which power signals output from power supplies may be processed and modified to reduce or eliminate any deleterious effects thereof may also be performed in combination with such a variable power supply and load system.

One or more processing modules 4330 also interfaces with and is in communication with the DSCs 4328 to 4328-n and the power supplies 4303 to 4303-n. Based on information received from one or more of the DSCs 4328 to 4328-n and/or one or more of the power supplies 4303 to 4303-n, the one or more processing modules 4330 is configured to determine whether any adaptation of the operation of the DSCs 4328 to 4328-n and/or the power supplies 4303 to 4303-n is to be performed.

In an example of operation and implementation, based on a determination by the one or more processing modules 4330 that the power signals being output from the power supplies 4303 to 4303-n are providing significantly more power than is being consumed by the one or more loads 4330, such as based on information being provided from sensing of the power signals being performed by the DSCs 4328 to 4328-n and/or information that is provided from the power supplies 4303 to 4303-n themselves, the one or more processing modules 4330 is configured to facilitate adaptation of the power being output from one or more of the power supplies 4303 to 4303-n.

For example, if the amount of power being consumed by the one or more loads 4340 compares unfavorably to a threshold amount of power (e.g., the amount of power being consumed is less than a threshold amount of power), the one more processing modules 4330 is configured to facilitate reduction of the power being output from one or more of the power supplies 4303 to 4303-n. Alternatively, if the amount of power being consumed by the one or more loads 4340 compares unfavorably to another threshold amount of power (e.g., the amount of power being consumed is greater than a threshold amount of power), the one more processing modules 4330 is configured to facilitate increasing of the power being output from one or more of the power supplies 4303 to 4303-*n*. In addition, depending on the type of power supplies 4303 to 4303-*n* that are implemented within the variable power supply and load system (e.g., power supplies capable of delivering the same amount of power each, or power supplies capable of delivering different amounts of power), the one or more processing modules 4330 is configured to select which one or more of the power supplies 4303 to 4303-*n* is appropriate to remain in operation and continue servicing the one or more loads 4340. When each of the power supplies 4303 to 4303-*n* is capable of delivering the same amount of power each, a straightforward selection of an adequate number of one or more of the power supplies 4303 to 4303-*n* may be made to ensure acceptable servicing of the one or more loads 4340. However, when the power supplies 4303 to 4303-*n* are capable of delivering different amounts of power, intelligent selection of which combination of one or more of the power supplies 4303 to 4303-*n* may be made by the one or more processing modules 4340 to ensure acceptable servicing of the one or more loads 4340.

In another example of operation and implementation, based on a determination by the one or more processing modules 4330 that the power signals being output from the power supplies 4303 to 4303-*n* include one or more deleterious effects (e.g., ripple, voltage sag, harmonic glitches, phase shift, etc.), such as based on information being provided from sensing of the power signals being performed by the DSCs 4328 to 4328-*n* and/or information that is provided from the power supplies 4303 to 4303-*n* themselves, the one or more processing modules 4330 is configured to facilitate appropriate processing of one or more of the power signals being output from one or more of the power supplies 4303 to 4303-*n* to the one or more loads 4340.

In yet another example of operation and implementation, based on a determination by the one or more processing modules 4330 that the impedance of any one or more of the loads 4340 has changed or is changing, such as based on information being provided from sensing of the power signals being performed by the DSCs 4328 to 4328-*n* and/or information that is provided from the power supplies 4303 to 4303-*n* themselves, the one or more processing modules 4330 is configured to facilitate appropriate processing of one or more of the power signals being output from one or more of the power supplies 4303 to 4303-*n* to the one or more loads 4340 and/or adaptation of the operation of the DSCs 4328 to 4328-*n* and/or the power supplies 4303 to 4303-*n*.

From certain perspectives, this diagram shows one possible example by which a variable power supply and load system may be implemented such that adaptation of the different respective components therein may be facilitated by one or more processing modules 4330 that interfaces with and is in communication with one or more of those different respective components. The overall management and operation of the variable power supply and load system may be performed by the one or more processing modules 4330, in cooperation with one or more of the other components in the variable power supply and load system, to facilitate improved operation of such a system.

Figure 44:
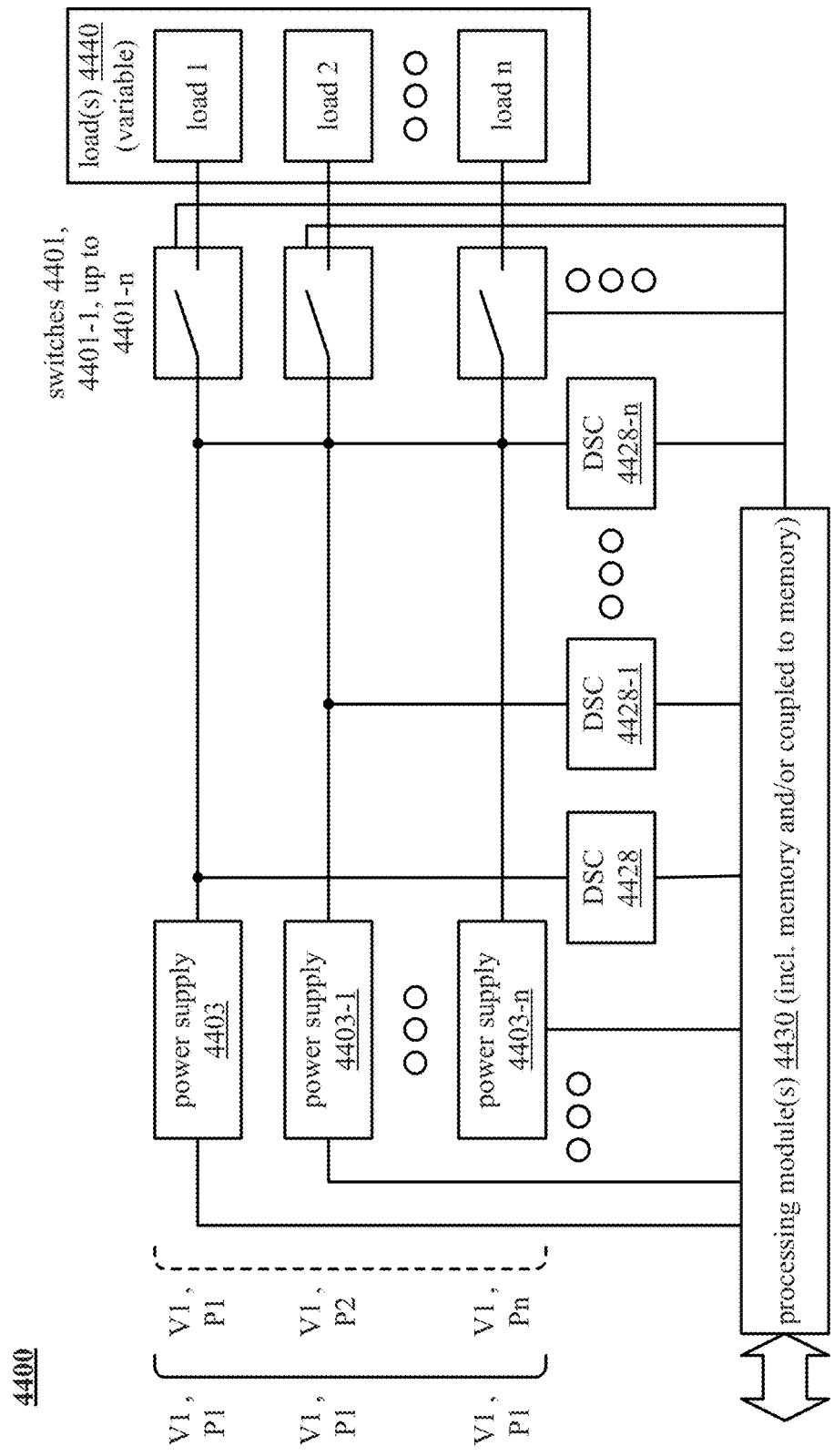
FIG. 44 is a schematic block diagram of another embodiment of a variable power supply and load system in accordance with the present invention.

FIG. 44 is a schematic block diagram of another embodiment 4400 of a variable power supply and load system in accordance with the present invention. In this diagram, a number of power supplies (e.g., two or more power supplies shown as power supply 4403, power supply 4403-1, and up to power supply 4403-*n*, where n is a positive integer greater than or equal to 2) is configured to provide power signals to one or more loads 4440, which are further subdivided into a load 1, load 2, and up to a load n.

Note that the number of loads within the one or more loads 4440 may be variable, the impedance of the one or more loads 4440 may be variable, and/or the individual impedance of any load of the one or more loads 4440 may be variable. Also, note that the amount of power that is provided from the different respective power supplies 4403 to 4403-*n* may be the same in some instances (e.g., each of the different respective power supplies 4403 to 4403-*n* providing power signals having the same voltage, V1, and also capable of delivering the same amount of power, P1). However, in other instances, note that the amount of power that is provided from the different respective power supplies 4403 to 4403-*n* may be different (e.g., each of the different respective power supplies 4403 to 4403-*n* providing power signals having the same voltage, V1, yet power supply 4403 capable of delivering a first amount of power P1, power supply 4403-1 capable of delivering a second amount of power P2, and power supply 4403-*n* capable of delivering an nth amount of power Pn).

Also, a number of DSCs (e.g., two or more DSCs shown as DSC 4428, 4428-1, and up to 4428-*n*, where n is a positive integer greater than or equal to 2) is also configured to perform one or both of monitoring or sensing of the power signals output from the respective power supplies 4403 to 4403-*n* and driving of signals into the signals output from the respective power supplies 4403 to 4403-*n*. In some examples, note that only monitoring or sensing of the power signals output from the respective power supplies 4403 to 4403-*n*. However, note that any of the various examples, embodiments, implementations, etc. described herein by which power signals output from power supplies may be processed and modified to reduce or eliminate any deleterious effects thereof may also be performed in combination with such a variable power supply and load system.

One or more processing modules 4430 also interfaces with and is in communication with the DSCs 4428 to 4428-*n*, the power supplies 4403 to 4403-*n*, and switches 4401, 4401-1, and up to 4401-*n* that allow selection of one or more of the load 1, load 2, up to load n within the one or more loads 4440. Based on information received from one or more of the DSCs 4428 to 4428-*n*, one or more of the power supplies 4403 to 4403-*n*, and/or one or more of the switches 4401, 4401-1, and up to 4401-*n*, the one or more processing modules 4430 is configured to determine whether any adaptation of the operation of the DSCs 4428 to 4428-*n* and/or the power supplies 4403 to 4403-*n* is to be performed.

In an example of operation and implementation, the one or more processing modules 4430 is configured to perform adaptation of any one or more of the power supplies 4403 to 4403-*n* and/or the DSCs 4428 to 4428-*n* similarly as described with respect to the power supplies and/or DSCs of the previous diagram, but also with respect to switching in or switching out any one or more of the load 1, load 2, up to load n within the one or more loads 4440. For example, based upon a determination of unfavorable operation of one of the particular loads (e.g., load 1 operating outside of acceptable range, consuming an unacceptable amount of current, being identified as approaching failure, etc.), then that particular load may be switched out of the variable power supply and load system by appropriate modification of the switch 4401 by the one or more processing modules 4430. Considering an example in which the power supplies 4403 to 4403-*n* are unable to provide adequate power to the one or more loads 4440, then appropriate switching out of one or more of the loads 4440 may be performed based on direction of the one or more processing modules 4430. Then, based upon a change of operational conditions, such as detection for determination of an improvement in the performance of the power supplies 4403 to 4403-$n$ and their ability to provide adequate power to the one or more loads 4440, then appropriate switching back in of one or more of the loads 4440 may be performed based on direction of the one or more processing modules 4430.

Figure 45:
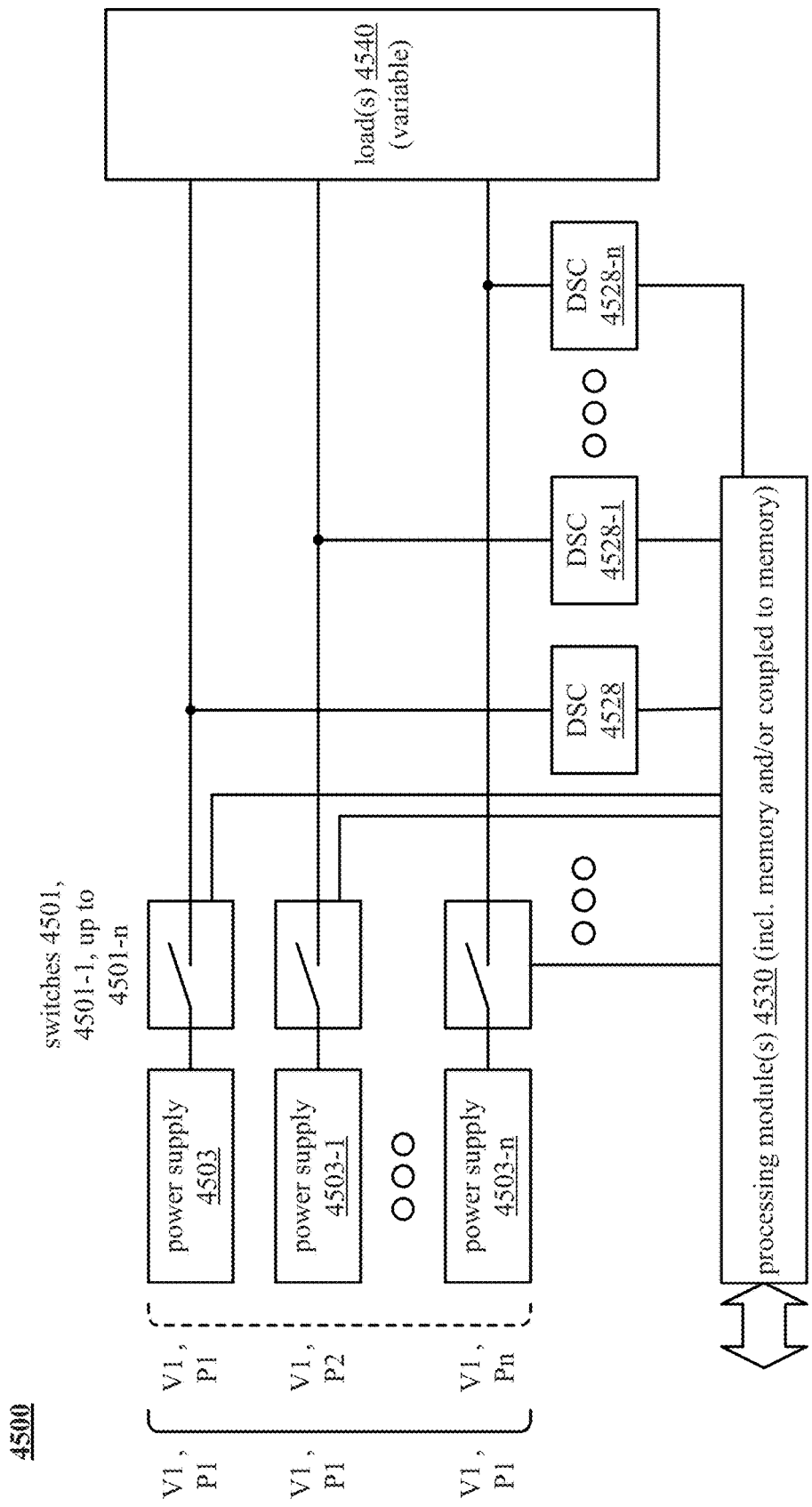
FIG. 45 is a schematic block diagram of another embodiment of a variable power supply and load system in accordance with the present invention.

FIG. 45 is a schematic block diagram of another embodiment 4500 of a variable power supply and load system in accordance with the present invention. In this diagram, a number of power supplies (e.g., two or more power supplies shown as power supply 4503, power supply 4503-1, and up to power supply 4503-$n$, where n is a positive integer greater than or equal to 2) is configured to provide power signals to one or more loads 4540.

Note that the number of loads within the one or more loads 4540 may be variable, the impedance of the one or more loads 4540 may be variable, and/or the individual impedance of any load of the one or more loads 4540 may be variable. Also, note that the amount of power that is provided from the different respective power supplies 4503 to 4503-$n$ may be the same in some instances (e.g., each of the different respective power supplies 4503 to 4503-$n$ providing power signals having the same voltage, V1, and also capable of delivering the same amount of power, P1). However, in other instances, note that the amount of power that is provided from the different respective power supplies 4503 to 4503-$n$ may be different (e.g., each of the different respective power supplies 4503 to 4503-$n$ providing power signals having the same voltage, V1, yet power supply 4503 capable of delivering a first amount of power P1, power supply 4503-1 capable of delivering a second amount of power P2, and power supply 4503-$n$ capable of delivering an nth amount of power Pn).

Also, a number of DSCs (e.g., two or more DSCs shown as DSC 4528, 4528-1, and up to 4528-$n$, where n is a positive integer greater than or equal to 2) is also configured to perform one or both of monitoring or sensing of the power signals output from the respective power supplies 4503 to 4503-$n$ and driving of signals into the signals output from the respective power supplies 4503 to 4503-$n$. In some examples, note that only monitoring or sensing of the power signals output from the respective power supplies 4503 to 4503-$n$. However, note that any of the various examples, embodiments, implementations, etc. described herein by which power signals output from power supplies may be processed and modified to reduce or eliminate any deleterious effects thereof may also be performed in combination with such a variable power supply and load system.

One or more processing modules 4530 also interfaces with and is in communication with the DSCs 4528 to 4528-$n$, the power supplies 4503 to 4503-$n$, and switches 4501, 4501-1, and up to 4501-$n$ that allow selection of one or more of power supplies 4503 to 4503-$n$ into or out of the variable power supply and load system. Based on information received from one or more of the DSCs 4528 to 4528-$n$, one or more of the power supplies 4503 to 4503-$n$, and/or one or more of the switches 4501, 4501-1, and up to 4501-$n$, the one or more processing modules 4530 is configured to determine whether any adaptation of the operation of the DSCs 4528 to 4528-$n$ and/or the power supplies 4503 to 4503-$n$ is to be performed.

In an example of operation and implementation, the one or more processing modules 4530 is configured to perform adaptation of any one or more of the power supplies 4503 to 4503-$n$ and/or the DSCs 4528 to 4528-$n$ similarly as described with respect to the power supplies and/or DSCs of the previous diagram, but also with respect to switching in or switching out any one or more of the power supplies 4503 to 4503-$n$. For example, based upon a determination of unfavorable operation of one of the particular power supplies (e.g., power supply 4503-1 operating outside of acceptable range, unable to deliver a required amount of current, being identified as approaching failure, etc.), then that power supply may be switched out of the variable power supply and load system by appropriate modification of the switch 4501-1 by the one or more processing modules 4530. Considering an example in which fewer than all of the power supplies 4503 to 4503-$n$ are needed to provide adequate power to the one or more loads 4540, then appropriate switching out of one or more of the power supplies 4503 to 4503-$n$ may be performed based on direction of the one or more processing modules 4530. Then, based upon a change of operational conditions, such as detection for determination of additional power from at least one additional power supply of the power supplies 4503 to 4503-$n$ is needed to provide adequate power to the one or more loads 4540, then appropriate switching back in of one or more of the power supplies 4503 to 4503-$n$ may be performed based on direction of the one or more processing modules 4530.

Figure 46:
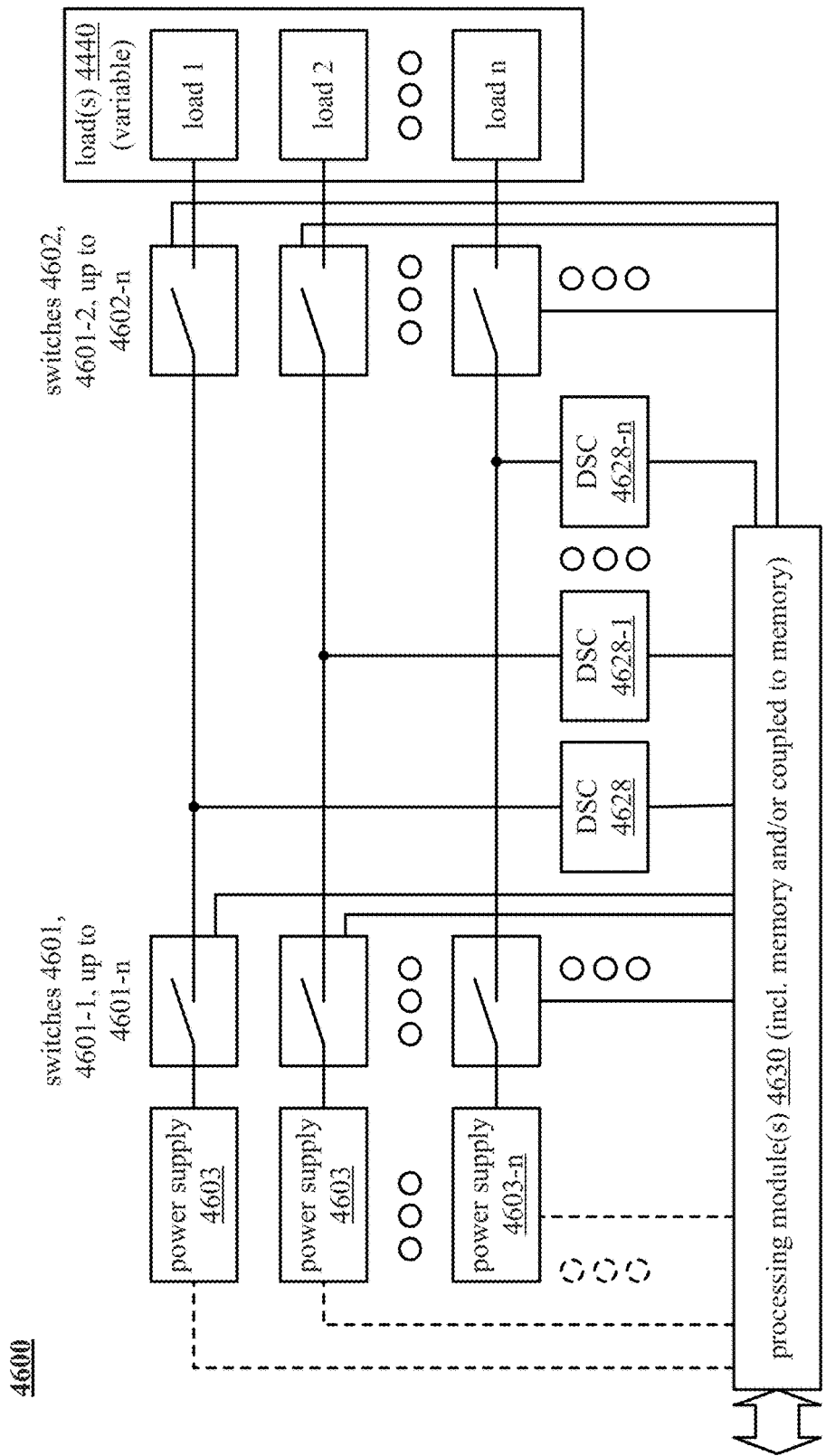
FIG. 46 is a schematic block diagram of another embodiment of a variable power supply and load system in accordance with the present invention.

FIG. 46 is a schematic block diagram of another embodiment 4600 of a variable power supply and load system in accordance with the present invention. In this diagram, a number of power supplies (e.g., two or more power supplies shown as power supply 4603, power supply 4603-1, and up to power supply 4603-$n$, where n is a positive integer greater than or equal to 2) is configured to provide power signals to one or more loads 4640, which are further subdivided into a load 1, load 2, and up to a load n.

Note that the number of loads within the one or more loads 4640 may be variable, the impedance of the one or more loads 4640 may be variable, and/or the individual impedance of any load of the one or more loads 4640 may be variable. Also, note that the amount of power that is provided from the different respective power supplies 4603 to 4603-$n$ may be the same in some instances (e.g., each of the different respective power supplies 4603 to 4603-$n$ providing power signals having the same voltage, V1, and also capable of delivering the same amount of power, P1). However, in other instances, note that the amount of power that is provided from the different respective power supplies 4603 to 4603-$n$ may be different (e.g., each of the different respective power supplies 4603 to 4603-$n$ providing power signals having the same voltage, V1, yet power supply 4603 capable of delivering a first amount of power P1, power supply 4603-1 capable of delivering a second amount of power P2, and power supply 4603-$n$ capable of delivering an nth amount of power Pn).

Also, a number of DSCs (e.g., two or more DSCs shown as DSC 4628, 4628-1, and up to 4628-$n$, where n is a positive integer greater than or equal to 2) is also configured to perform one or both of monitoring or sensing of the power signals output from the respective power supplies 4603 to 4603-$n$ and driving of signals into the signals output from the respective power supplies 4603 to 4603-$n$. In some examples, note that only monitoring or sensing of the power signals output from the respective power supplies 4603 to 4603-$n$. However, note that any of the various examples, embodiments, implementations, etc. described herein by which power signals output from power supplies may be processed and modified to reduce or eliminate any deleterious effects thereof may also be performed in combination with such a variable power supply and load system.

One or more processing modules 4630 also interfaces with and is in communication with the DSCs 4628 to 4628-n, the power supplies 4603 to 4603-n, switches 4601, 4601-1, and up to 4601-n that allow selection of one or more of the power supplies 4603 to 4603-n into or out of the variable power supply and load system, and switches 4602, 4602-1, and up to 4602-n that allow selection of one or more of the load 1, load 2, and up to a load n of the one or more loads 4640. Based on information received from one or more of the DSCs 4628 to 4628-n, one or more of the power supplies 4603 to 4603-n, one or more of the switches 4601, 4601-1, and up to 4601-n, and/or one or more of the switches 4602, 4602-1, and up to 4602-n, the one or more processing modules 4630 is configured to determine whether any adaptation of the operation of the DSCs 4628 to 4628-n and/or the power supplies 4603 to 4603-n is to be performed.

In an example of operation and implementation, the one or more processing modules 4630 is configured to perform adaptation of any one or more of the power supplies 4603 to 4603-n and/or the DSCs 4628 to 4628-n similarly as described with respect to the power supplies and/or DSCs of previous diagram(s), but also with respect to switching in or switching out any one or more of the load 1, load 2, up to load n within the one or more loads 4640 and also with respect to switching in or switching out any one or more of the power supplies 4603 to 4603-n. In some examples, any adaptation of the operation of any of the components and/or any switching in or switching out of components within this example of a variable power supply and load system may be performed based on any such considerations as described herein.

With respect to the various examples of variable power supply and load systems as described in the previous diagrams, note that any combination of one or more of these examples may alternatively be implemented. In addition, note that, with respect to any respective implementation, the one or more processing modules may be implemented to interface with and communicate with any desired subset of the components therein that include fewer than all of the components therein. For example, the one or more processing modules may be implemented to interface and to communicate with only certain components, being fewer than all, of one or more of the power supplies, the DSCs, the loads, etc. within any such limitation. For example, certain of the components may be fixed components that are not capable of adaptation or modification in their operation, they may alternatively be implemented without switch related capability such as to be switched in or out, etc., and yet certain other of the components may be capable of adaptation or modification in their operation, may be implemented with switch related capability, etc. In general, any desired topology of components, some of which may be adaptive, some of which may not, and any implementation of switch related capability to those components may be implemented and the operation thereof improved in accordance with the overall management of such a variable power supply and load system in accordance with various aspects, embodiments, and/or examples of the invention (and/or their equivalents).

Figure 47:
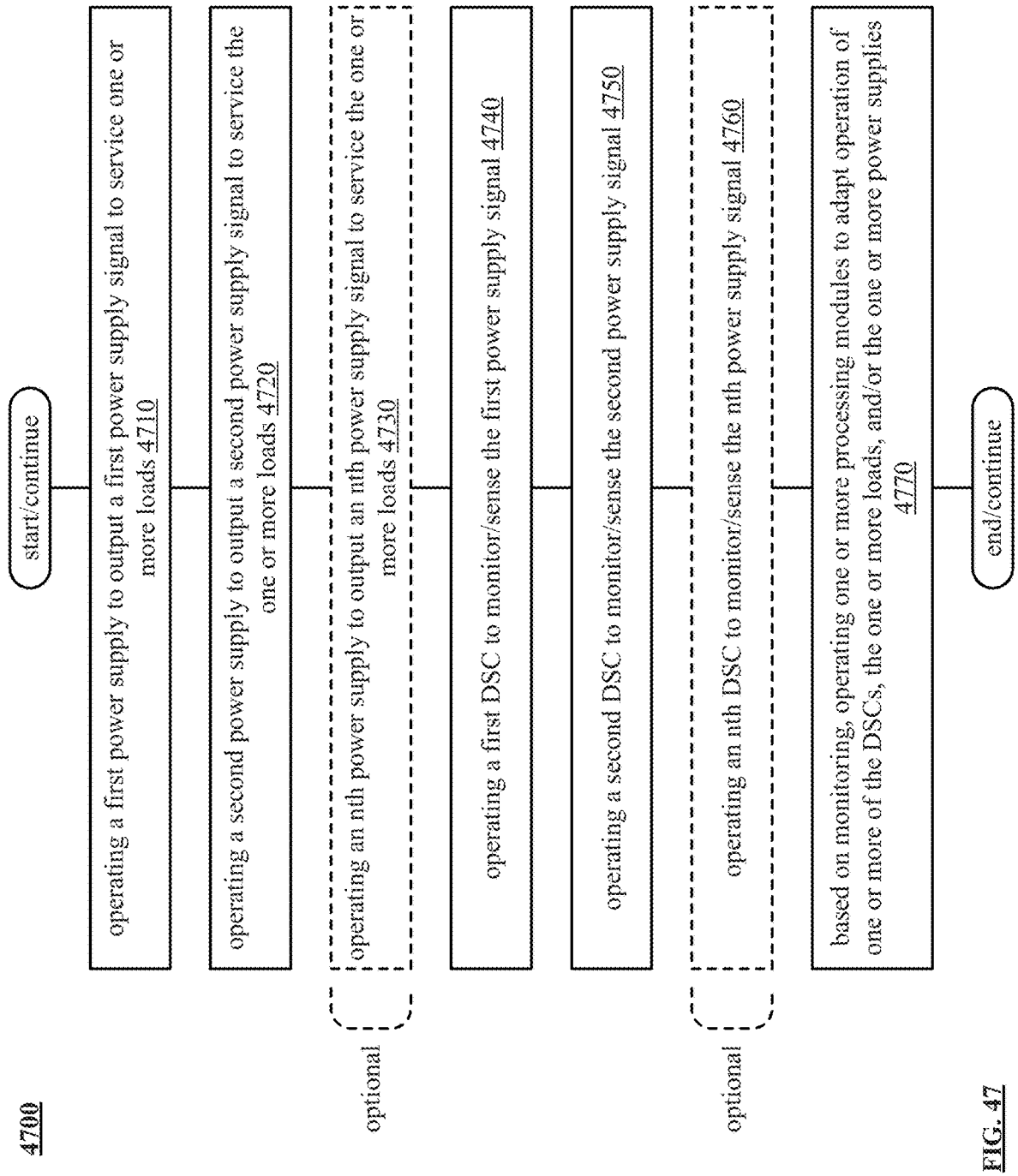
FIG. 47 is a schematic block diagram of another embodiment of a method for execution by one or more devices in accordance with the present invention.

FIG. 47 is a schematic block diagram of another embodiment of a method 4700 for execution by one or more devices in accordance with the present invention. The method 4700 also operates in step 4710 by operating a first power supply to output a first power supply signal to service one or more loads. The method 4700 operates in step 4720 by operating a second power supply to output a second power supply signal to service the one or more loads. In some alternative variants of the method 4700, the method 4700 also operates in step 4730 by operating an nth power supply to output an nth power supply signal to service the one or more loads, where n is a positive integer greater than or equal to 3.

The method 4700 operates in step 4740 by operating a first DSC to monitor/sense the first power supply signal. The method 4700 operates in step 4750 by operating a second DSC to monitor/sense the second power supply signal. In some alternative variants of the method 4700, the method 4700 also operates in step 4760 by operating an nth DSC to monitor/sense the nth power supply signal, again, where n is a positive integer greater than or equal to 3. Based on monitoring, the method 4700 operates in step 4770 by operating one or more processing modules to adapt operation of one or more of the DSCs, the one or more loads, and/or the one or more power supplies.

Figure 48:
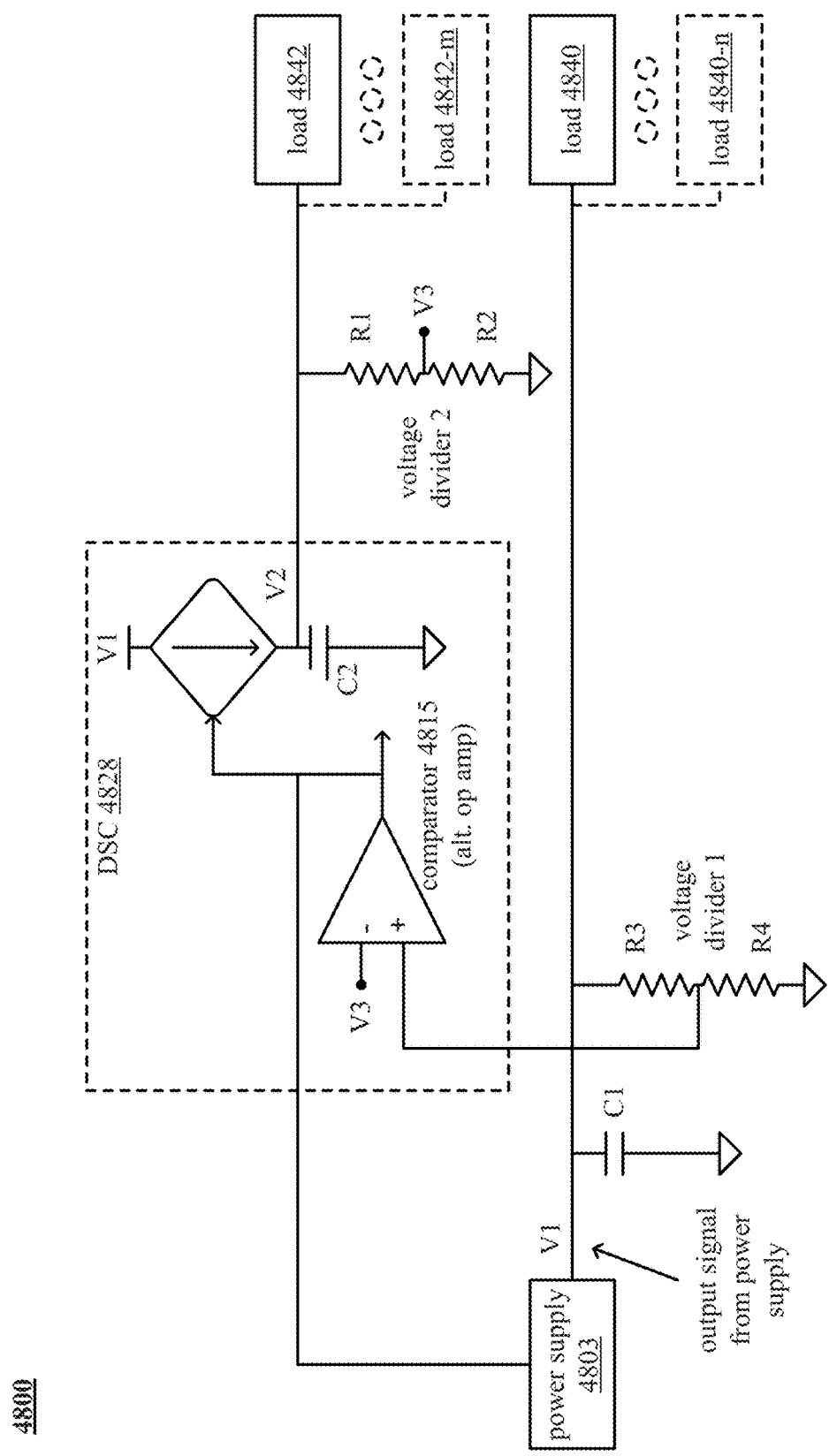
FIG. 48 is a schematic block diagram of an embodiment of a multi-voltage power supply with shared regulation loop in accordance with the present invention.

FIG. 48 is a schematic block diagram of an embodiment 4800 of a multi-voltage power supply with shared regulation loop in accordance with the present invention. In this diagram, a single control loop is implemented to ensure that two different output voltages may be provided from a singular power supplied to service different respective loads that might need or operate at different voltages. For example, many devices may be implemented such that a first one or more components operates using a first power supply signal having a first voltage and a second one or more components operates using a second power supply signal having a second voltage.

In this diagram, the power supply 4803 is implemented to output a first power signal having a first voltage, V1. A filtering capacitor, C1, may be implemented to filter the first power signal as it is servicing a first one or more loads 4840 to 4840-n, where n is a positive integer greater than or equal to 1. In addition, a first voltage divider (including two impedances shown as two resistances R3 and R4) is implemented to provide a voltage that is provided to a DSC 4828. The DSC 4828 includes a comparator 4815 and a dependent current supply that is powered by the first power signal having the first voltage, V1, from the power supply 4803 and controlled by an output signal from the comparator 4815. The output from the dependent current supply, as provided by a filtering capacitor, C2, is implemented to provide a second power signal having a second voltage, V2, as it is servicing a second one or more loads 4842 to 4842-m, where m is a positive integer greater than or equal to 1. In addition, a second voltage divider (including two impedances shown as two resistances R1 and R2) is implemented to provide a third voltage, V3, that is also provided to the DSC 4828.

Within the DSC 4028, the comparator 4815 receives as one of its inputs the voltage from the first voltage divider that includes the two resistances R3 and R4 and received as another of its inputs another voltage, V3, from the second voltage divider that includes the two resistances R1 and R2. The output signal from the comparator 4815 within the DSC 4828 is implemented to control the current supply that is implemented to generate the second power signal having the second voltage, V2, as it is servicing the second one or more loads 4842 to 4842-m and also to provide feedback to the power supply 4803 that is implemented to output the power signal having the first voltage, V1.

Note that appropriate selection of the impedances of the first voltage divider and the second voltage divider allows for appropriate generation of the desired second voltage, V2, based on the first voltage, V1, of the first power signal that is provided by the power supply 4803. In some alternative examples, note that the respective impedances of the first voltage divider and the second voltage divider may be implemented using variable impedance is such that, during operation, one or more processing modules may adjust the values of those impedances to generate different respective voltages that may be provided to different respective loads. However, in certain examples, note that the respective values of the impedances in the first voltage divider and the second voltage divider are selected and fixed so as to provide a fixed first voltage, V1, to service a first one or more loads 4840 to 4840-n and a fixed second voltage, V2, to service a second one or more loads 4842 to 4842-n.

In an example of operation and implementation, considering an implementation in which the same output voltage is provided at the center taps of both the first voltage divider (that includes resistances R3 and R4) and the second voltage divider (that includes resistances R1 and R2). In a specific example in which the power supply 4803 outputs a power signal having a voltage of 5 V, then V1=5 V. based on a desire to have the second voltage, V2, to be 3 V, then the impedances of the respective voltage dividers would be made so as to provide the third voltage, V3, to be 2 V. The impedances of the respective voltage dividers (e.g., selection of R1, R2, R3, and R4) are selected to ensure that the inputs to the comparator matches to provide the appropriately desired V2 based on the value of V1.

Figure 49:
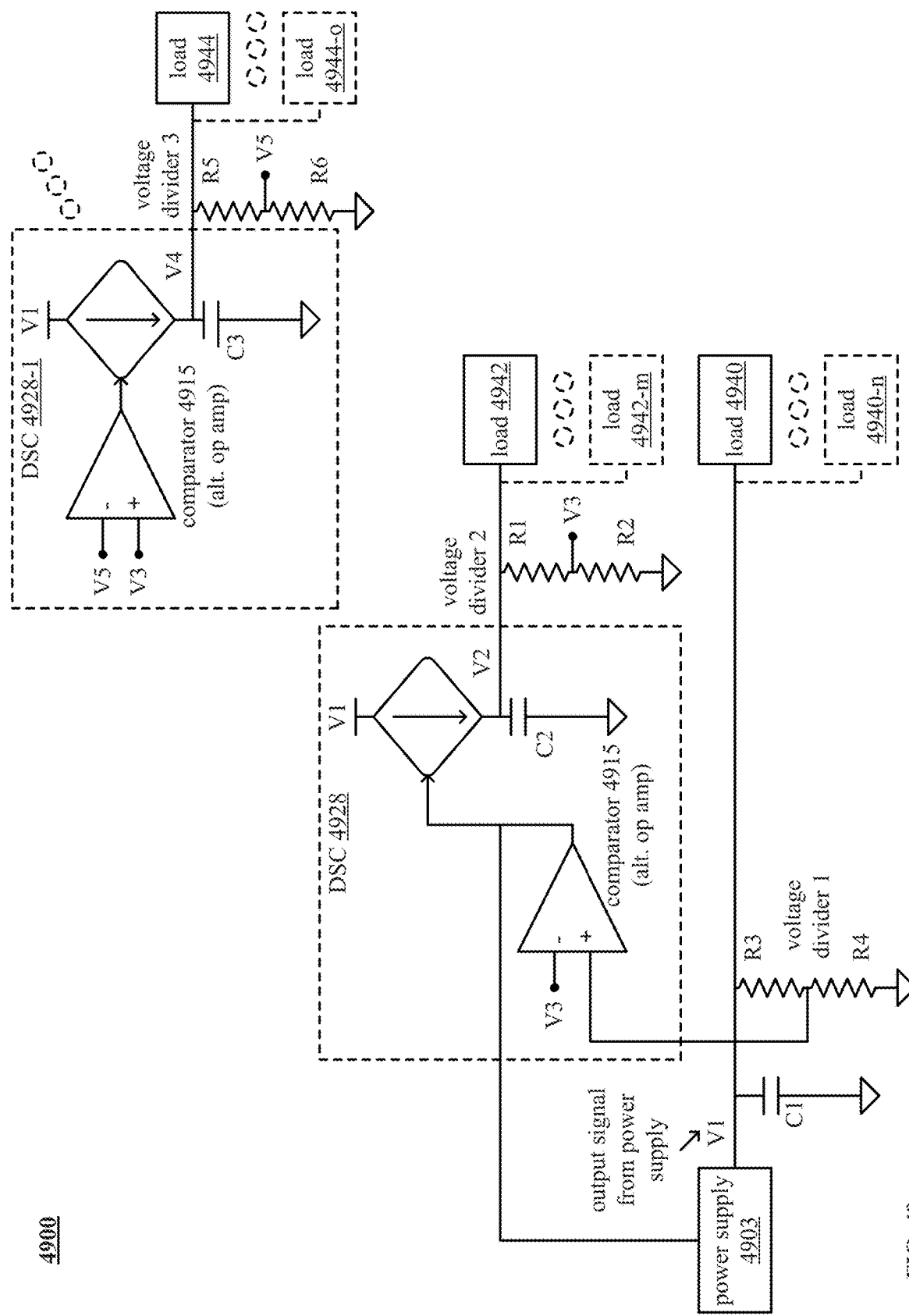
FIG. 49 is a schematic block diagram of another embodiment of a multi-voltage power supply with shared regulation loop in accordance with the present invention.

FIG. 49 is a schematic block diagram of another embodiment 4900 of a multi-voltage power supply with shared regulation loop in accordance with the present invention. In this diagram, a single control loop is implemented to ensure that two different output voltages may be provided from a singular power supplied to service different respective loads that might need or operate at different voltages. For example, many devices may be implemented such that a first one or more components operates using a first power supply signal having a first voltage and a second one or more components operates using a second power supply signal having a second voltage. In addition, some devices may be implemented such that a first one or more components operates using a first power supply signal having a first voltage, a second one or more components operates using a second power supply signal having a second voltage, and so on until an xth one or more components operates using an xth power supply signal having an xth voltage (e.g., where x is a positive integer greater than or equal to 3).

In this diagram, the power supply 4903 is implemented to output a first power signal having a first voltage, V1. A filtering capacitor, C1, may be implemented to filter the first power signal as it is servicing a first one or more loads 4940 to 4940-n, where n is a positive integer greater than or equal to 1. In addition, a first voltage divider (including two impedances shown as two resistances R3 and R4) is implemented to provide a voltage that is provided to a DSC 4928. The DSC 4928 includes a comparator 4915 and a dependent current supply that is powered by the first power signal having the first voltage, V1, from the power supply 4903 and controlled by an output signal from the comparator 4915. The output from the dependent current supply of the DSC 4928, as provided by a filtering capacitor, C2, is implemented to provide a second power signal having a second voltage, V2, as it is servicing a second one or more loads 4942 to 4942-m, where m is a positive integer greater than or equal to 1. In addition, a second voltage divider (including two impedances shown as two resistances R1 and R2) is implemented to provide a third voltage, V3, that is also provided to the DSC 4928.

Within the DSC 4028, the comparator 4915 receives as one of its inputs the voltage from the first voltage divider that includes the two resistances R3 and R4 and received as another of its inputs another voltage, V3, from the second voltage divider that includes the two resistances R1 and R2. The output signal from the comparator 4915 within the DSC 4928 is implemented to control the current supply that is implemented to generate the second power signal having the second voltage, V2, as it is servicing the second one or more loads 4942 to 4942-m and also to provide feedback to the power supply 4903 that is implemented to output the power signal having the first voltage, V1.

This diagram has some similarities to the previous diagram with at least one difference being that at least one additional DSC is appropriately implemented to provide at least one additional power signal having at least one additional voltage. This diagram shows one additional DSC 4928-1 that is implemented to provide another voltage, V4, to service third one or more loads 4944 to 4944-o, where o is a positive integer greater than or equal to 1. A comparator 4915 within the DSC 4928-1 receives as its inputs the third voltage, V5, as well as the output from a third voltage divider (including two impedances shown as two resistances R5 and R6) that is implemented to provide a voltage, V5, that is provided to a DSC 4928-1. The DSC 4928-1 also includes a dependent current supplied that is powered by the first power signal having the first molded, V1, from the power supply 4903 and is controlled by the output signal from the comparator 4915. The output from the dependent current supply of the DSC 4928-1, as provided by a filtering capacitor, C2, is implemented to provide another power signal having another voltage, V4, as it is servicing the third one or more loads 4944 to 4944-o.

Note that any additional desired numbers of DSCs may be implemented in this manner to generate different respective power signals having different respective voltages to service different respective loads. As with the previous diagram, note that appropriate selection of the impedances of the first voltage divider and the second voltage divider allows for appropriate generation of the desired second voltage, V2, based on the first voltage, V1, of the first power signal that is provided by the power supply 4903. In some alternative examples, note that the respective impedances of the first voltage divider and the second voltage divider may be implemented using variable impedance is such that, during operation, one or more processing modules may adjust the values of those impedances to generate different respective voltages that may be provided to different respective loads. However, in certain examples, note that the respective values of the impedances in the first voltage divider and the second voltage divider are selected and fixed so as to provide a fixed first voltage, V1, to service a first one or more loads 4940 to 4940-n and a fixed second voltage, V2, to service a second one or more loads 4942 to 4942-n.

In addition, with respect to this diagram, note that appropriate selection of the impedances of the third voltage divider also allow for appropriate generation of the desired voltage, V4, that is implemented to service the third one or more loads 4944 to 4944-o. In some examples, note that the impedances included within the third voltage divider may be variable while they may be fixed in other examples.

Generally speaking, a single control loop with one or more appropriately implemented DSCs may be used to generate any desired number of power signals having different respective voltages to service different respective loads in accordance with various aspects, embodiments, and/or examples of the invention (and/or their equivalents).

Figure 50:
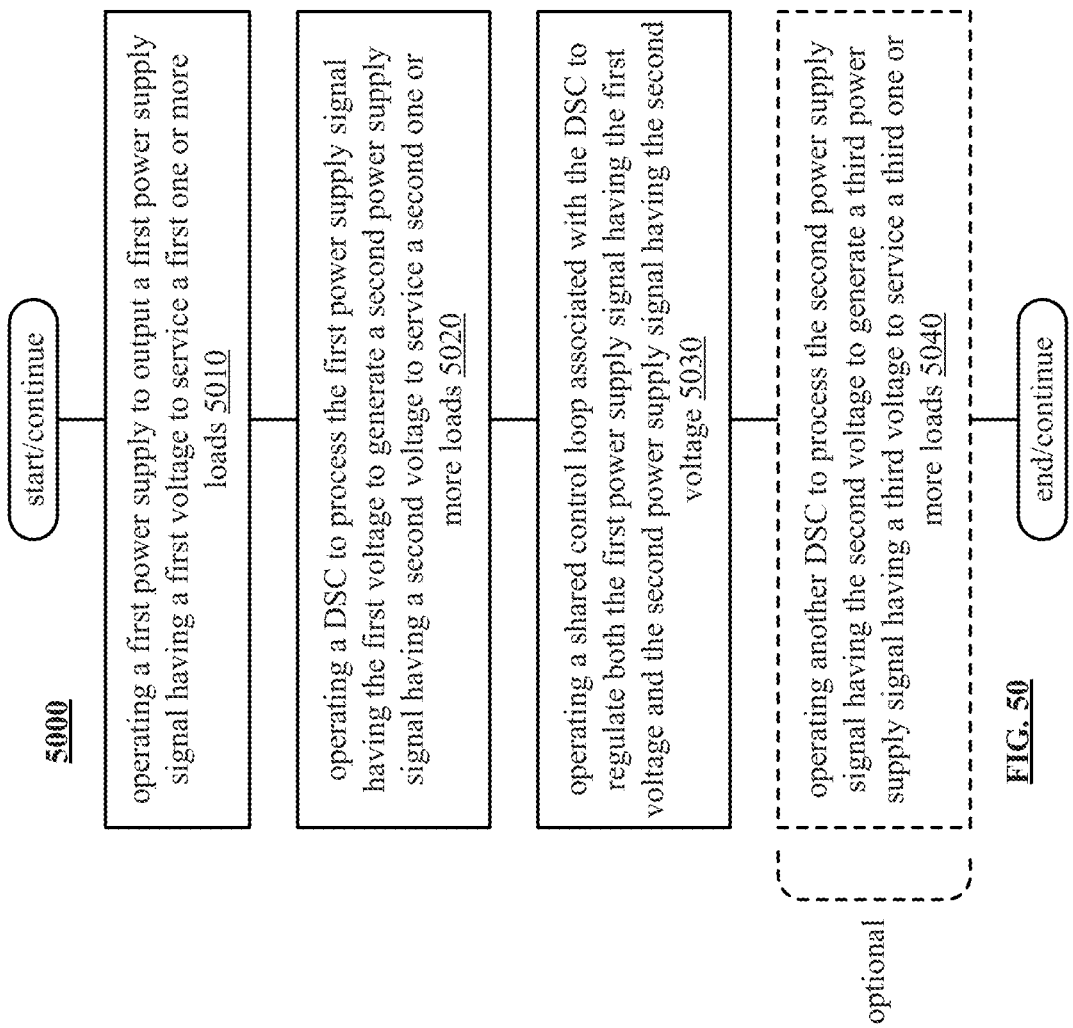
FIG. 50 is a schematic block diagram of another embodiment of a method for execution by one or more devices in accordance with the present invention.

FIG. 50 is a schematic block diagram of another embodiment of a method 5000 for execution by one or more devices in accordance with the present invention. The method 5000 operates in step 5010 by operating a first power supply to output a first power supply signal having a first voltage to service a first one or more loads. The method 5000 also operates in step 5020 by operating a DSC to process the first power supply signal having the first voltage to generate a second power supply signal having a second voltage to service a second one or more loads.

The method 5000 operates in step 5030 by operating a shared control loop associated with the DSC to regulate both the first power supply signal having the first voltage and the second power supply signal having the second voltage. In some alternative variants of the method 5000, the method 5000 also operates in step 5040 by operating another DSC to process the second power supply signal having the second voltage to generate a third power supply signal having a third voltage to service a third one or more loads.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A power supply signal conditioning system comprising:
a power supply operably coupled to one or more loads, wherein, when enabled, the power supply configured to output a power supply signal having a DC (direct current) voltage component and a ripple voltage component that is based on conversion of an AC (alternating current) signal in accordance with generating the power supply signal;
a drive-sense circuit (DSC) operably coupled to the power supply, wherein, when enabled, the DSC configured simultaneously to sense the power supply signal and, based on sensing of the power supply signal, adaptively to process the power supply signal in accordance with reducing or eliminating the ripple voltage component of the power supply signal to generate a conditioned power supply signal to service the one or more loads, wherein the DSC, when enabled, is further configured simultaneously to sense the power supply signal and adaptively to inject a current signal that is based on the sensing of the power supply signal into the power supply signal in accordance with reducing or eliminating the ripple voltage component of the power supply signal to generate the conditioned power supply signal to service the one or more loads, wherein the DSC includes:
a low pass filter (LPF) configured to process the power supply signal to generate an LPF signal;
a comparator configured to compare the LPF signal to the power supply signal to produce an analog comparator output signal; and
a current supply circuit configured adaptively, based on the analog comparator output signal, to inject the current signal that is based on the sensing of the power supply signal into the power supply signal.

2. The power supply signal conditioning system of claim 1 further comprising:

a filtering capacitor operatively coupled to the power supply and configured to filter the power supply signal that is output from the power supply.

3. The power supply signal conditioning system of claim 1 wherein the one or more loads includes at least one of an integrated circuit, circuitry, a computer, a tablet, a smartphone, an appliance, or a motor.

4. The power supply signal conditioning system of claim 1, wherein the DSC further comprises:
an analog to digital converter (ADC) configured to process the analog comparator output signal to generate a digital comparator output signal that is representative of the ripple voltage component of the power supply signal;
a digital to analog converter (DAC) configured to process the analog comparator output signal to generate another analog comparator output signal; and
the current supply circuit configured adaptively, based on the another analog comparator output signal, to inject the current signal that is based on the sensing of the power supply signal into the power supply signal.

5. The power supply signal conditioning system of claim 1, wherein:
the drive-sense circuit (DSC) operably coupled via a single line to a connection between the power supply and the one or more loads; and
the DSC, when enabled, is further configured simultaneously to sense the power supply signal and, based on the sensing of the power supply signal, adaptively to inject the current signal that is based on the sensing of the power supply signal into the power supply signal.

6. The power supply signal conditioning system of claim 1, wherein the power supply includes at least one of a half-wave bridge rectifier circuit, a full-wave bridge rectifier circuit, or a switched mode power supply.

7. The power supply signal conditioning system of claim 1, wherein the DSC further comprises:
a power source circuit operably coupled via a single line to a connection between the power supply and the one or more loads, wherein, when enabled, the power source circuit is configured adaptively to inject an analog signal into the power supply signal in accordance with reducing or eliminating the ripple voltage component of the power supply signal to generate the conditioned power supply signal to service the one or more loads, wherein the analog signal includes at least one of a DC (direct current) component or an oscillating component; and
a power signal change detection circuit operably coupled to the power source circuit, wherein, when enabled, the power signal change detection circuit is configured to:
detect an effect on the analog signal that is based on an electrical characteristic of at least one of the power supply and the one or more loads; and
generate a digital signal that is representative of the ripple voltage component of the power supply signal.

8. The power supply signal conditioning system of claim 7 further comprising:
the power source circuit including a power source to source at least one of a voltage or a current via the single line to the connection between the power supply and the one or more loads; and
the power signal change detection circuit including:
a power source reference circuit configured to provide at least one of a voltage reference or a current reference; and a comparator configured to compare the at least one of the voltage and the current provided via the single line to the connection between the power supply and the one or more loads to the at least one of the voltage reference and the current reference to produce the analog signal.

9. A power supply signal conditioning system comprising:
a power supply operably coupled to one or more loads, wherein, when enabled, the power supply configured to output a power supply signal having a DC (direct current) voltage component and a ripple voltage component that is based on conversion of an AC (alternating current) signal in accordance with generating the power supply signal;
a drive-sense circuit (DSC) operably coupled via a single line to a connection between the power supply and the one or more loads, wherein, when enabled, the DSC simultaneously configured to sense the power supply signal and adaptively to inject a current signal that is based on sensing of the power supply signal into the power supply signal in accordance with reducing or eliminating the ripple voltage component of the power supply signal to generate a conditioned power supply signal to service the one or more loads, wherein the DSC includes:
a low pass filter (LPF) configured to process the power supply signal to generate an LPF signal;
a comparator configured to compare the LPF signal to the power supply signal to produce an analog comparator output signal;
an analog to digital converter (ADC) configured to process the analog comparator output signal to generate a digital comparator output signal that is representative of the ripple voltage component of the power supply signal;
a digital to analog converter (DAC) configured to process the analog comparator output signal to generate another analog comparator output signal; and
a current supply circuit that is configured adaptively, based on the another analog comparator output signal, to inject the current signal that is based on the sensing of the power supply signal into the power supply signal.

10. The power supply signal conditioning system of claim 9 further comprising:
a filtering capacitor operatively coupled to the power supply and configured to filter the power supply signal that is output from the power supply.

11. The power supply signal conditioning system of claim 9, wherein the DSC, when enabled, is further configured simultaneously to sense the power supply signal and, based on the sensing of the power supply signal, adaptively to inject the current signal that is based on the sensing of the power supply signal into the power supply signal via the single line.

12. The power supply signal conditioning system of claim 9, wherein the power supply includes at least one of a half-wave bridge rectifier circuit, a full-wave bridge rectifier circuit, or a switched mode power supply.

13. The power supply signal conditioning system of claim 9, wherein the DSC further comprises:
a power source circuit operably coupled via the single line to the connection between the power supply and the one or more loads, wherein, when enabled, the power source circuit is configured adaptively to inject an analog signal into the power supply signal in accordance with reducing or eliminating the ripple voltage component of the power supply signal to generate the conditioned power supply signal to service the one or more loads, wherein the analog signal includes at least one of a DC (direct current) component or an oscillating component; and a power signal change detection circuit operably coupled to the power source circuit, wherein, when enabled, the power signal change detection circuit is configured to:
  detect an effect on the analog signal that is based on an electrical characteristic of at least one of the power supply and the one or more loads; and
  generate a digital signal that is representative of the ripple voltage component of the power supply signal;

the power source circuit including a power source to source at least one of a voltage or a current via the single line to the connection between the power supply and the one or more loads; and the power signal change detection circuit including:
  a power source reference circuit configured to provide at least one of a voltage reference or a current reference; and
  a comparator configured to compare the at least one of the voltage and the current provided via the single line to the connection between the power supply and the one or more loads to the at least one of the voltage reference and the current reference to produce the analog signal.

14. A method for execution by a power supply signal conditioning system, the method comprising:
  outputting, from a power supply operably coupled to one or more loads, a power supply signal having a DC (direct current) voltage component and a ripple voltage component that is based on conversion of an AC (alternating current) signal in accordance with generating the power supply signal;
  via a drive-sense circuit (DSC) operably coupled to the power supply, simultaneously sensing the power supply signal and, based on the sensing of the power supply signal, adaptively processing the power supply signal in accordance with reducing or eliminating the ripple voltage component of the power supply signal to generate a conditioned power supply signal to service the one or more loads;
  via the DSC, simultaneously sensing the power supply signal and adaptively injecting a current signal that is based on the sensing of the power supply signal into the power supply signal in accordance with reducing or eliminating the ripple voltage component of the power supply signal to generate the conditioned power supply signal to service the one or more loads, wherein the DSC includes:
  a low pass filter (LPF) configured to process the power supply signal to generate an LPF signal;
  a comparator configured to compare the LPF signal to the power supply signal to produce an analog comparator output signal; and
  a current supply circuit configured adaptively, based on the analog comparator output signal, to inject the current signal that is based on the sensing of the power supply signal into the power supply signal.

15. The method of claim 14 further comprising:
  operating a filtering capacitor that is operatively coupled to the power supply to filter the power supply signal that is output from the power supply.

16. The method of claim 14, herein the one or more loads includes at least one of an integrated circuit, circuitry, a computer, a tablet, a smartphone, an appliance, or a motor.

17. The method of claim 14, wherein the DSC further comprises:
  an analog to digital converter (ADC) configured to process the analog comparator output signal to generate a digital comparator output signal that is representative of the ripple voltage component of the power supply signal;
  a digital to analog converter (DAC) configured to process the analog comparator output signal to generate another analog comparator output signal; and
  the current supply circuit that is configured adaptively, based on the another analog comparator output signal, to inject the current signal that is based on the sensing of the power supply signal into the power supply signal.

18. The method of claim 14, wherein the drive-sense circuit (DSC) operably coupled via a single line to a connection between the power supply and the one or more loads; and further comprising:
  via the DSC, simultaneously sensing the power supply signal and, based on the sensing of the power supply signal, adaptively injecting the current signal that is based on the sensing of the power supply signal into the power supply signal via the single line.

19. The method of claim 14, wherein the power supply includes at least one of a half-wave bridge rectifier circuit, a full-wave bridge rectifier circuit, or a switched mode power supply.

20. The method of claim 14, wherein the DSC further comprises:
  a power source circuit operably coupled via a single line to a connection between the power supply and the one or more loads, wherein, when enabled, the power source circuit is configured adaptively to inject an analog signal into the power supply signal in accordance with reducing or eliminating the ripple voltage component of the power supply signal to generate the conditioned power supply signal to service the one or more loads, wherein the analog signal includes at least one of a DC (direct current) component or an oscillating component; and
  a power signal change detection circuit operably coupled to the power source circuit, wherein, when enabled, the power signal change detection circuit is configured to:
    detect an effect on the analog signal that is based on an electrical characteristic of at least one of the power supply and the one or more loads; and
    generate a digital signal that is representative of the ripple voltage component of the power supply signal;
  the power source circuit including a power source to source at least one of a voltage or a current via the single line to the connection between the power supply and the one or more loads; and
  the power signal change detection circuit including:
    a power source reference circuit configured to provide at least one of a voltage reference or a current reference; and
    a comparator configured to compare the at least one of the voltage and the current provided via the single line to the connection between the power supply and the one or more loads to the at least one of the voltage reference and the current reference to produce the analog signal.

* * * * *